(12) United States Patent
Baek et al.

(10) Patent No.: US 9,985,747 B2
(45) Date of Patent: May 29, 2018

(54) APPARATUS AND METHOD FOR RECEIVING BROADCAST SIGNALS

(71) Applicant: LG ELECTRONICS INC., Seoul (KR)

(72) Inventors: Jongseob Baek, Seoul (KR); Jongwoong Shin, Seoul (KR); Woosuk Ko, Seoul (KR); Sungryong Hong, Seoul (KR)

(73) Assignee: LG ELECTRONICS INC., Seoul (KR)

( * ) Notice: Subject to any disclaimer, the term of this patent is extended or adjusted under 35 U.S.C. 154(b) by 121 days.

(21) Appl. No.: 15/052,565

(22) Filed: Feb. 24, 2016

(65) Prior Publication Data

US 2016/0277038 A1 Sep. 22, 2016

Related U.S. Application Data

(60) Provisional application No. 62/135,722, filed on Mar. 20, 2015, provisional application No. 62/144,869, filed on Apr. 8, 2015.

(51) Int. Cl.
*H03M 13/00* (2006.01)
*H04L 1/00* (2006.01)
(Continued)

(52) U.S. Cl.
CPC ...... *H04L 1/0071* (2013.01); *H03M 13/2792* (2013.01); *H04B 1/10* (2013.01);
(Continued)

(58) Field of Classification Search
CPC ....... H04B 1/10; H04L 1/0041; H04L 1/0045; H04L 1/0071; H04L 12/18;
(Continued)

(56) References Cited

U.S. PATENT DOCUMENTS 9,621,395 B2 * 4/2017 Shin .................... H04L 27/2649
2015/0092882 A1 * 4/2015 Lee ..................... H04L 27/2602
375/295

(Continued)

FOREIGN PATENT DOCUMENTS

| KR | 10-2007-0035409 A | 3/2007 |
| KR | 10-2008-0052459 A | 6/2008 |
| WO | WO 2008/069600 A1 | 6/2008 |
| WO | WO 2010/082753 A2 | 7/2010 |
| WO | WO 2011/136574 A2 | 11/2011 |
| WO | WO 2015/130077 A1 | 9/2015 |

OTHER PUBLICATIONS

Jon Montalban Sanchez, Solutions for New Terrestrial Broadcasting Systems Offering Simultaneously Stationary and Mobile Services Dec. 2014 pp. 242.*

(Continued)

*Primary Examiner* — Guerrier Merant
(74) *Attorney, Agent, or Firm* — Birch, Stewart, Kolasch & Birch, LLP

(57) ABSTRACT

Disclosed is a broadcast signal receiver. The broadcast signal receiver includes a synchronization and demodulation unit configured to perform signal detection and OFDM demodulation on a reception signal comprising layer division multiplexing (LDM) data, a frame parsing/deinterleaving unit configured to parse the signal frame of the reception signal and to deinterleave the LDM data, a first demapping/decoding unit configured to obtain the data of a first layer by demapping and forward error correction (FEC)-encoding the LDM data, an interference removal unit configured to remove the data of the first layer from the LDM data and to output the data of a second layer, and a second demapping/decoding unit configured to demap and FEC-decode the data of the second layer.

10 Claims, 42 Drawing Sheets

(51) Int. Cl.
*H04L 1/06* (2006.01)
*H03M 13/27* (2006.01)
*H04L 27/26* (2006.01)
*H04B 1/10* (2006.01)
*H04H 60/11* (2008.01)
*H04L 5/00* (2006.01)

(52) U.S. Cl.
CPC ........... *H04H 60/11* (2013.01); *H04L 1/0045* (2013.01); *H04L 1/0625* (2013.01); *H04L 1/0668* (2013.01); *H04L 27/2655* (2013.01); *H04L 5/0023* (2013.01); *H04L 5/0048* (2013.01); *H04L 27/2626* (2013.01)

(58) Field of Classification Search
CPC ............. H04L 27/2613; H04L 27/2627; H04L 27/2649; H04L 1/0057; H03M 13/1102; H03M 13/2792; H03M 13/616; H03M 13/1157; H03M 13/253; H03M 13/255; H03M 13/27
See application file for complete search history.

(56) References Cited

U.S. PATENT DOCUMENTS

| | | |
|---|---|---|
| 2015/0312886 A1 | 10/2015 | Hong et al. |
| 2015/0341054 A1* | 11/2015 | Myung .............. H03M 13/1102 714/776 |
| 2016/0094895 A1* | 3/2016 | Stadelmeier ........... H04H 20/59 725/33 |
| 2016/0212458 A1 | 7/2016 | Kwon et al. |
| 2016/0294598 A1* | 10/2016 | Shin .................... H04L 27/2649 |
| 2017/0180080 A1* | 6/2017 | Shin .................... H04L 1/0071 |

OTHER PUBLICATIONS

U.S. Appl. No. 15/052,522, filed Feb. 24, 2016.
Lee et al., "Performance Evaluation of Multi-layer Transmission Based Cloud Broadcasting Systems", Jan. 2014, (http://www.dbpia.co.kr/Journal/ArticleDetail/NODE02386510), pp. 937-938.

* cited by examiner

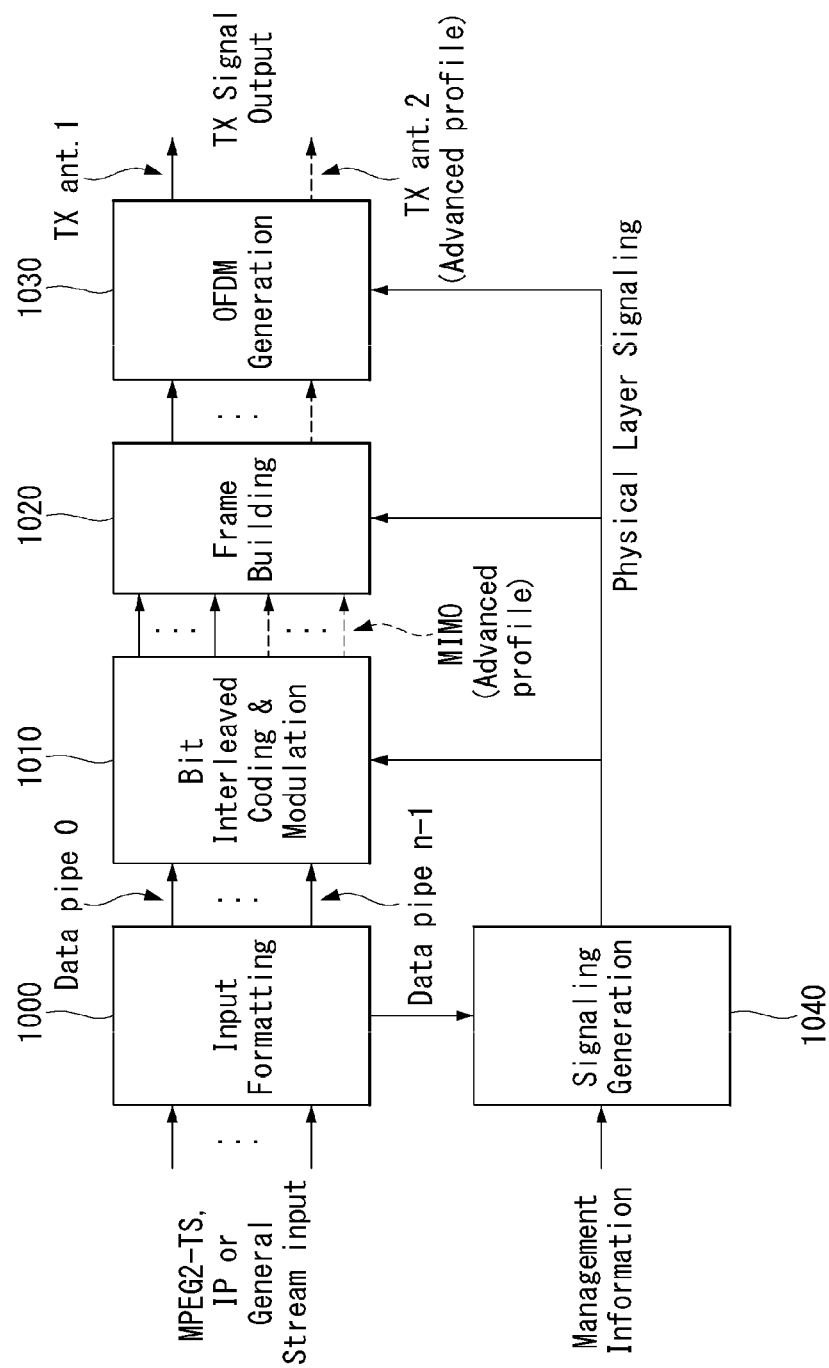
[Figure 1]

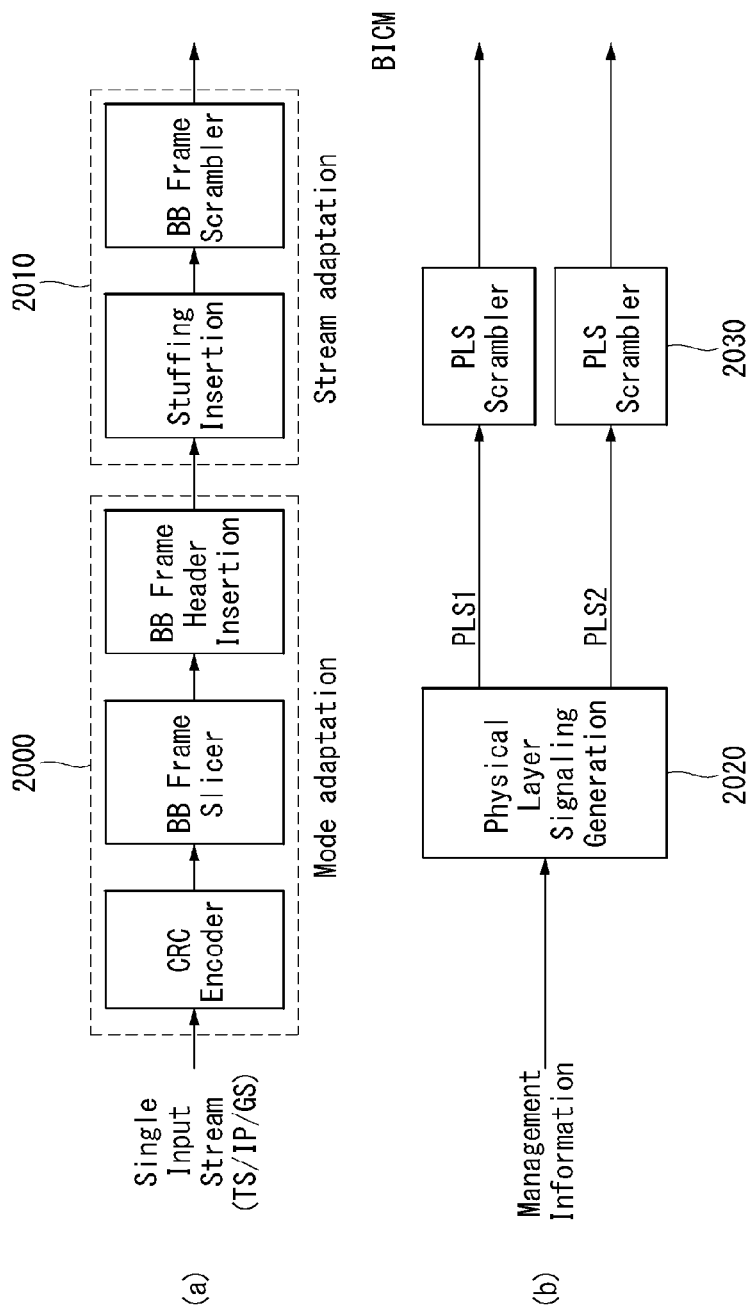
[Figure 2]

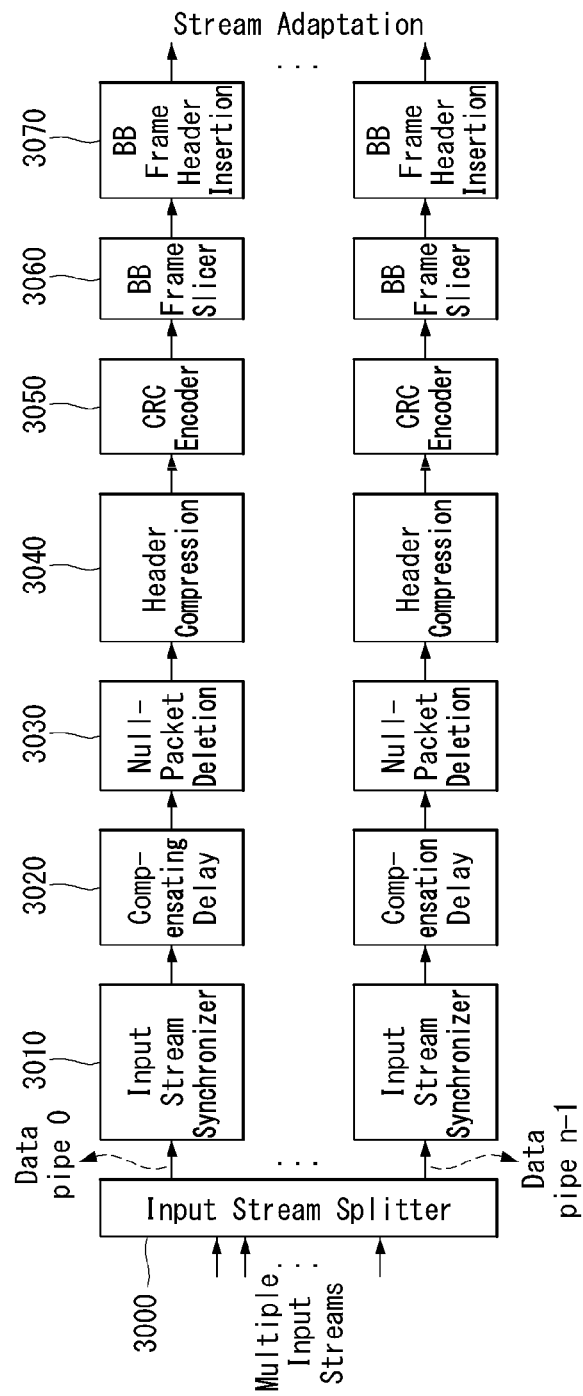
[Figure 3]

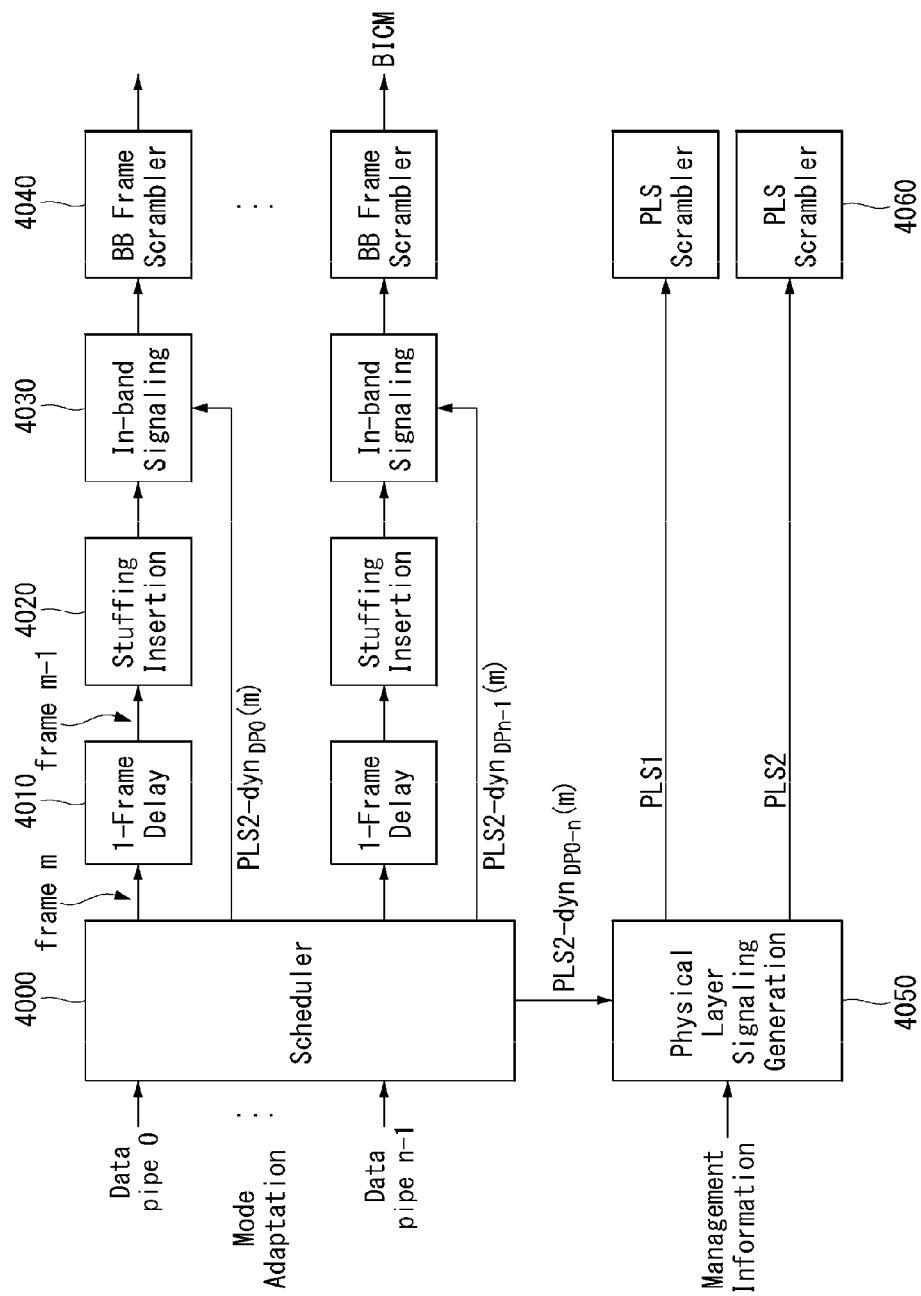
[Figure 4]

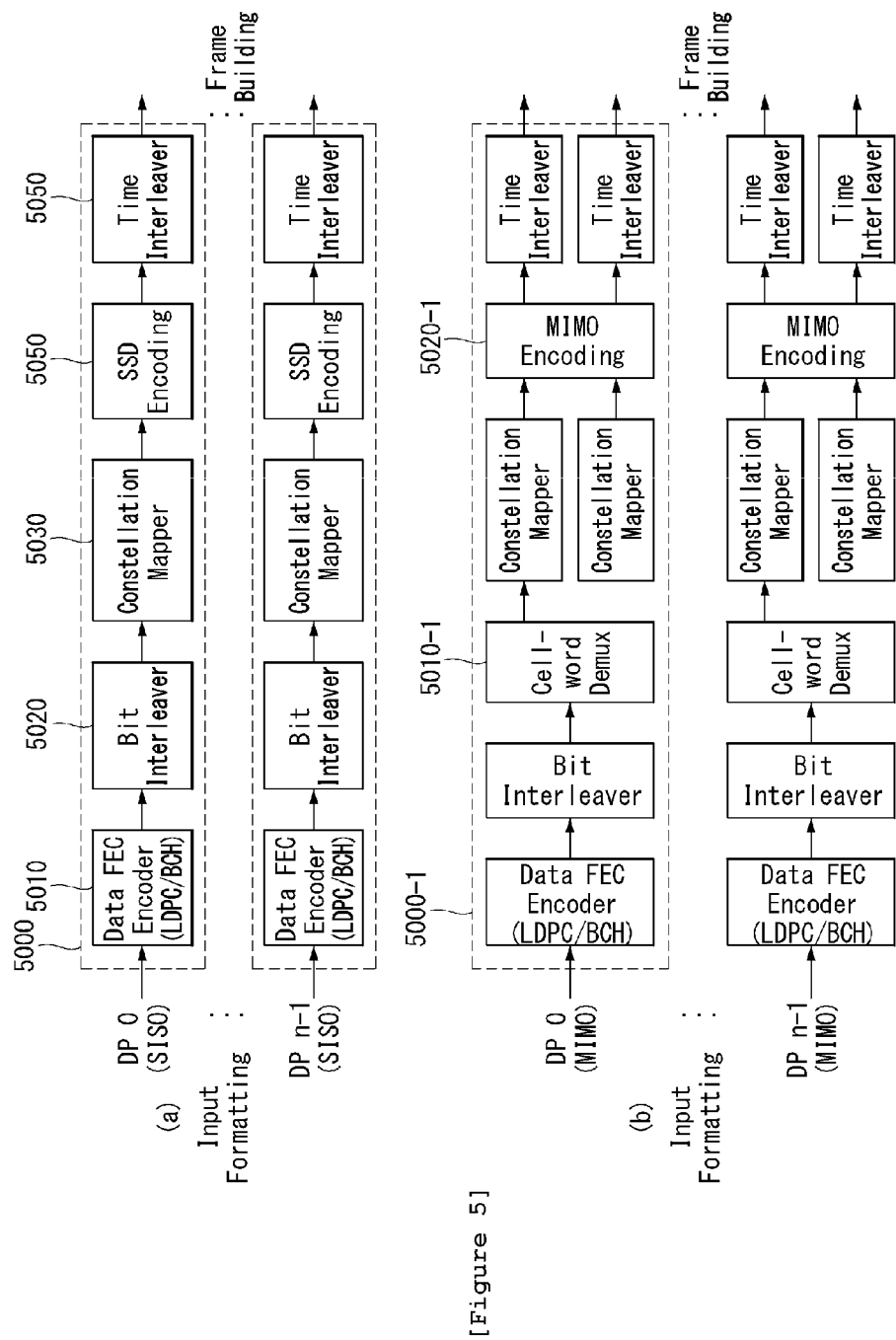
[Figure 5]

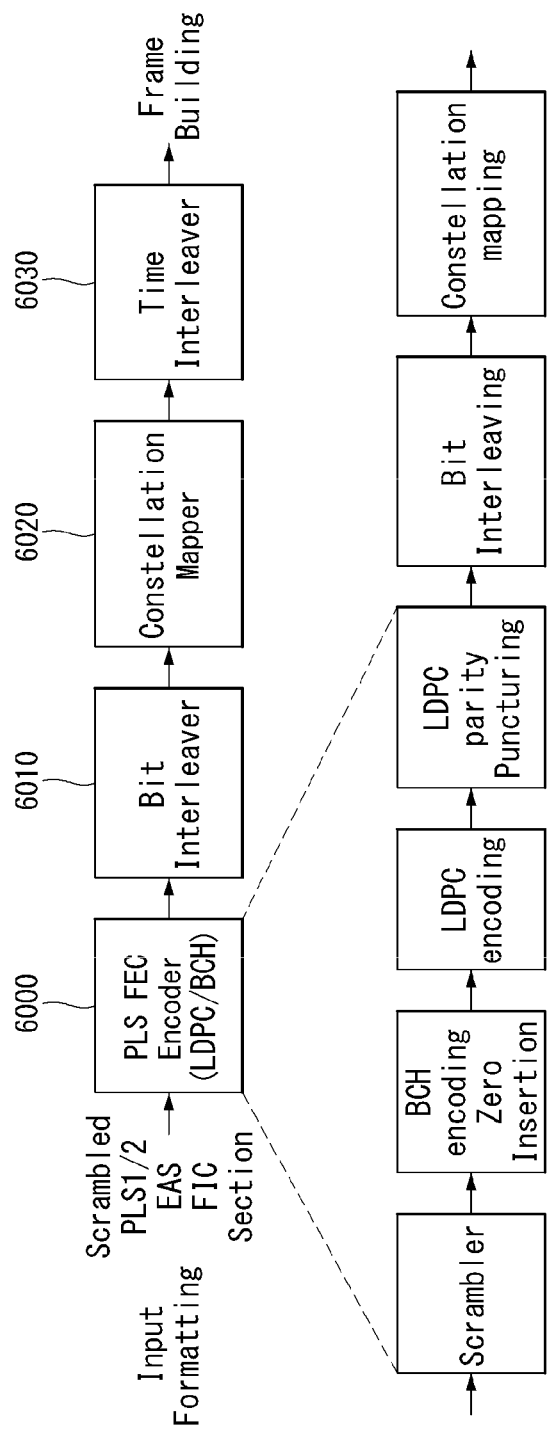
[Figure 6]

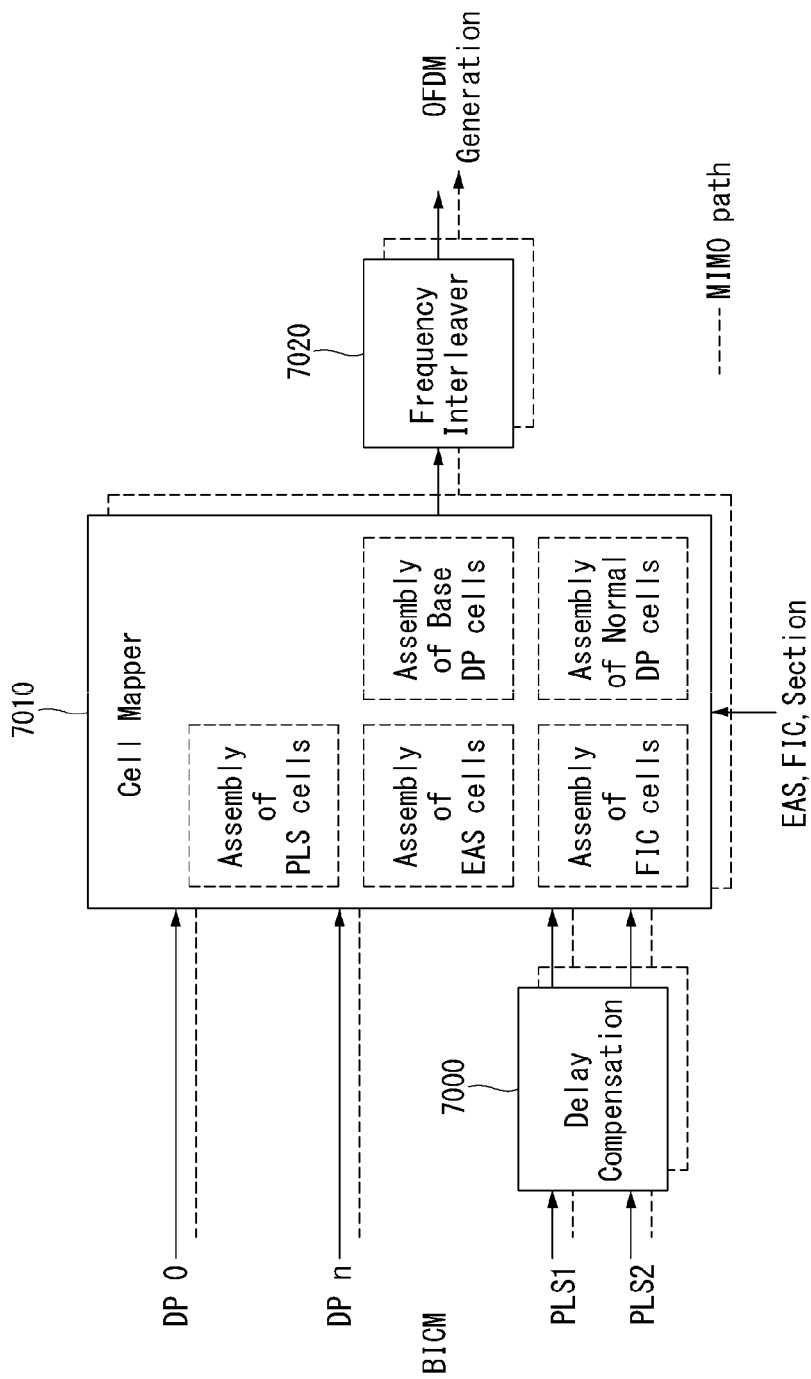
[Figure 7]

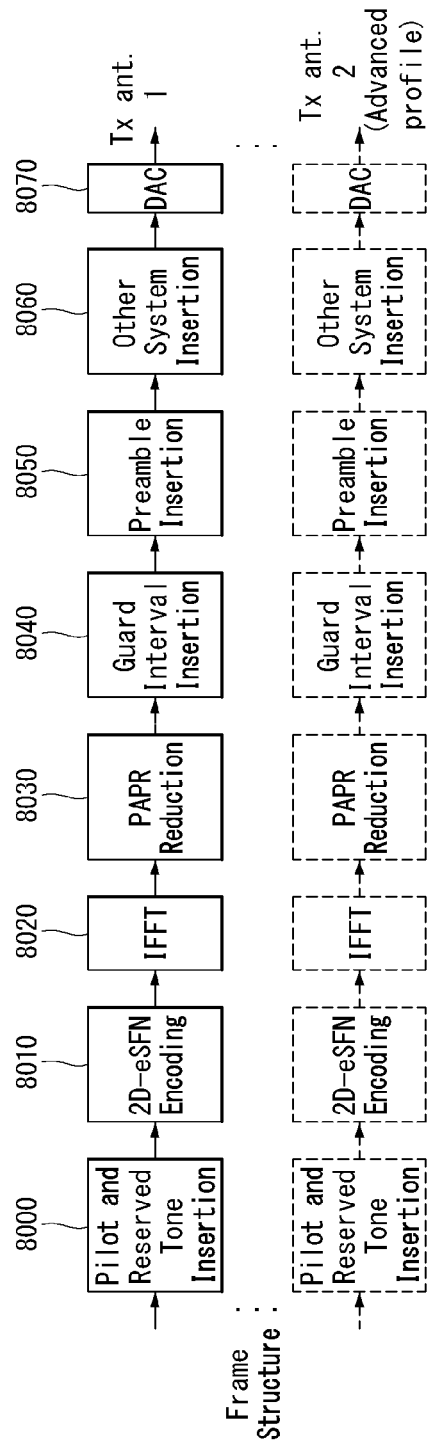
[Figure 8]

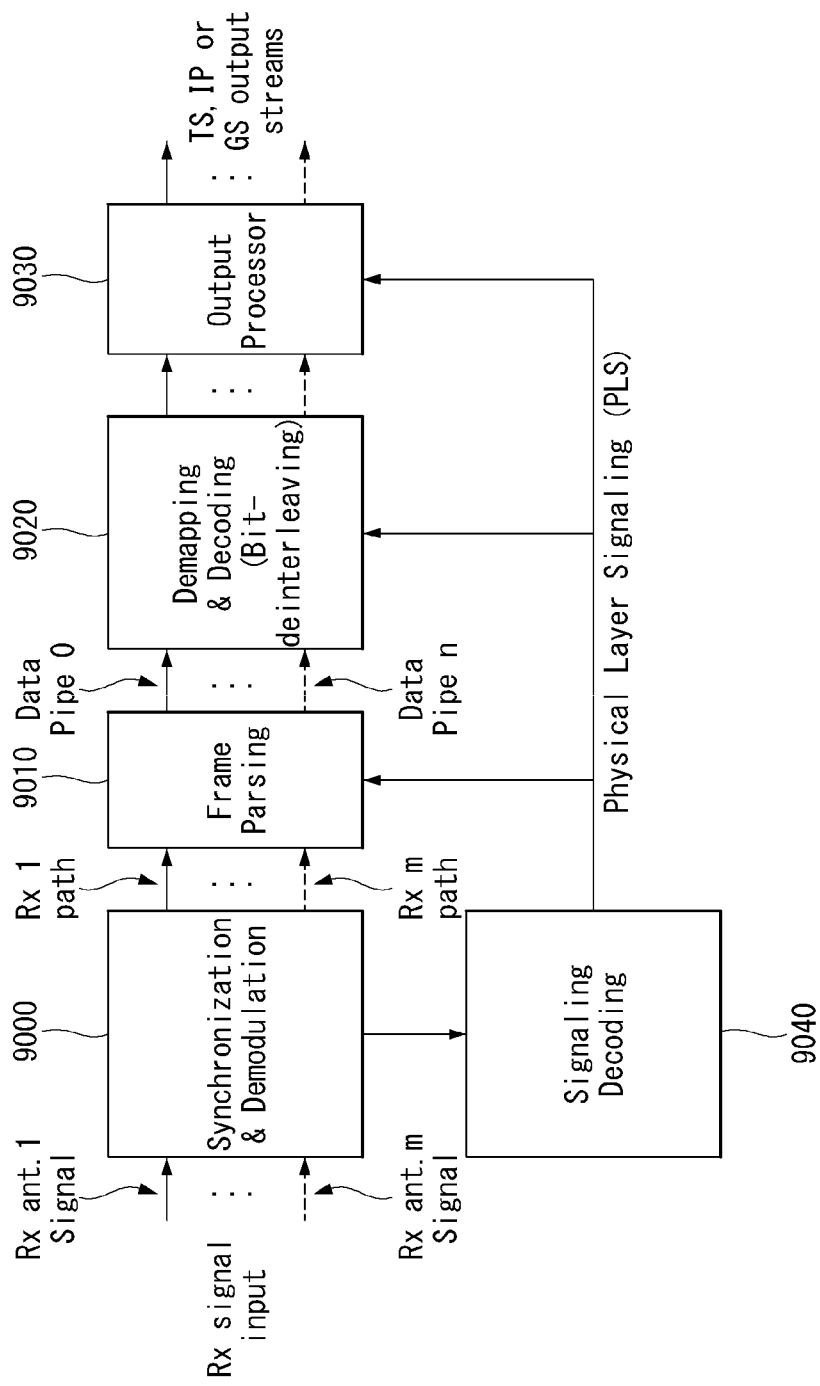
[Figure 9]

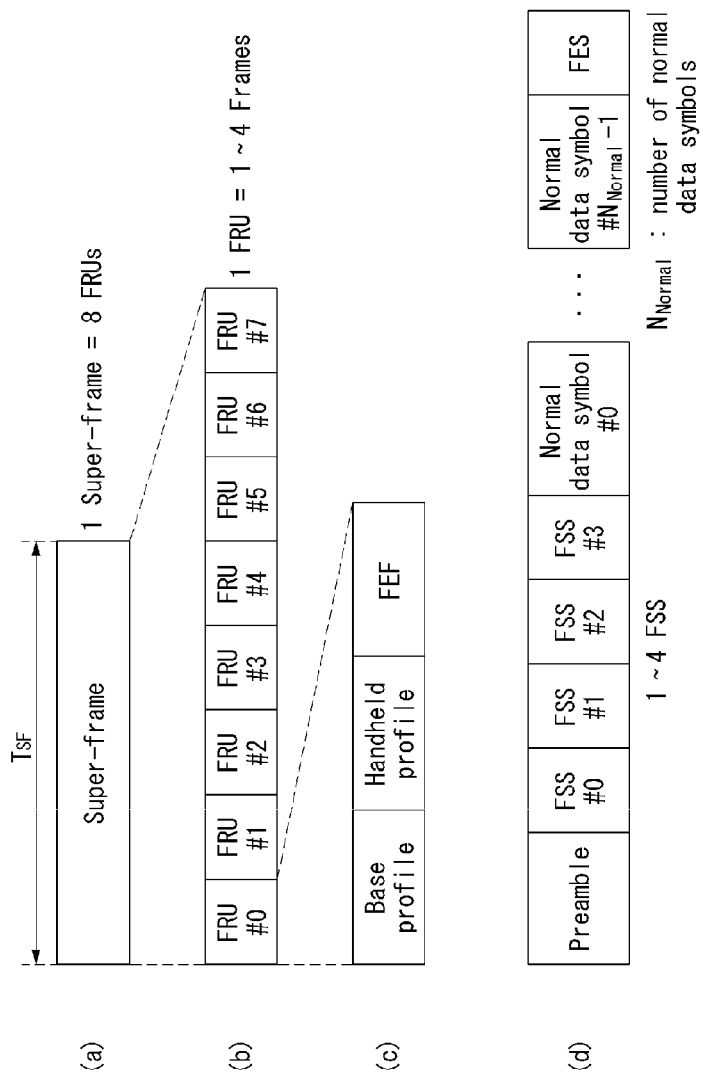
[Figure 10]

[Figure 11]
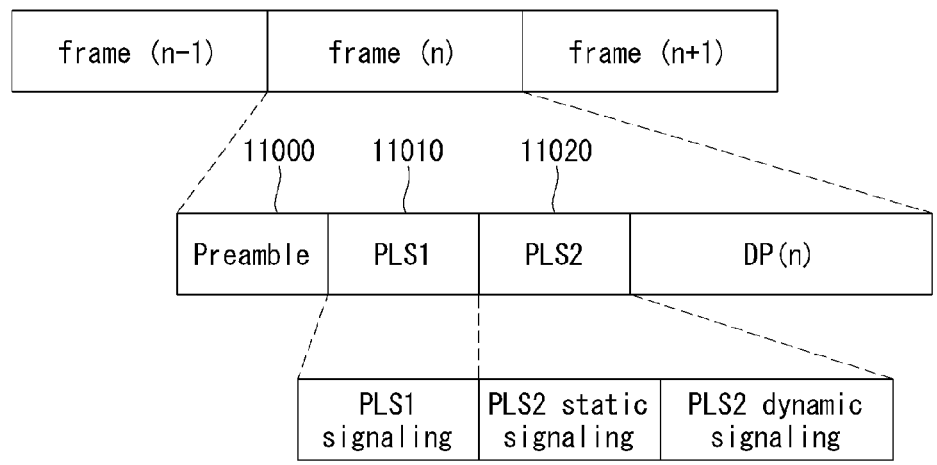
[Figure 12]
| Content | Bits |
|---|---|
| PHY_PROFILE | 3 |
| FFT_SIZE | 2 |
| GI_FRACTION | 3 |
| EAC_FLAG | 1 |
| POLOT_MODE | 1 |
| PAPR_FLAG | 1 |
| FRU_CONFIGURE | 3 |
| RESERVED | 7 |

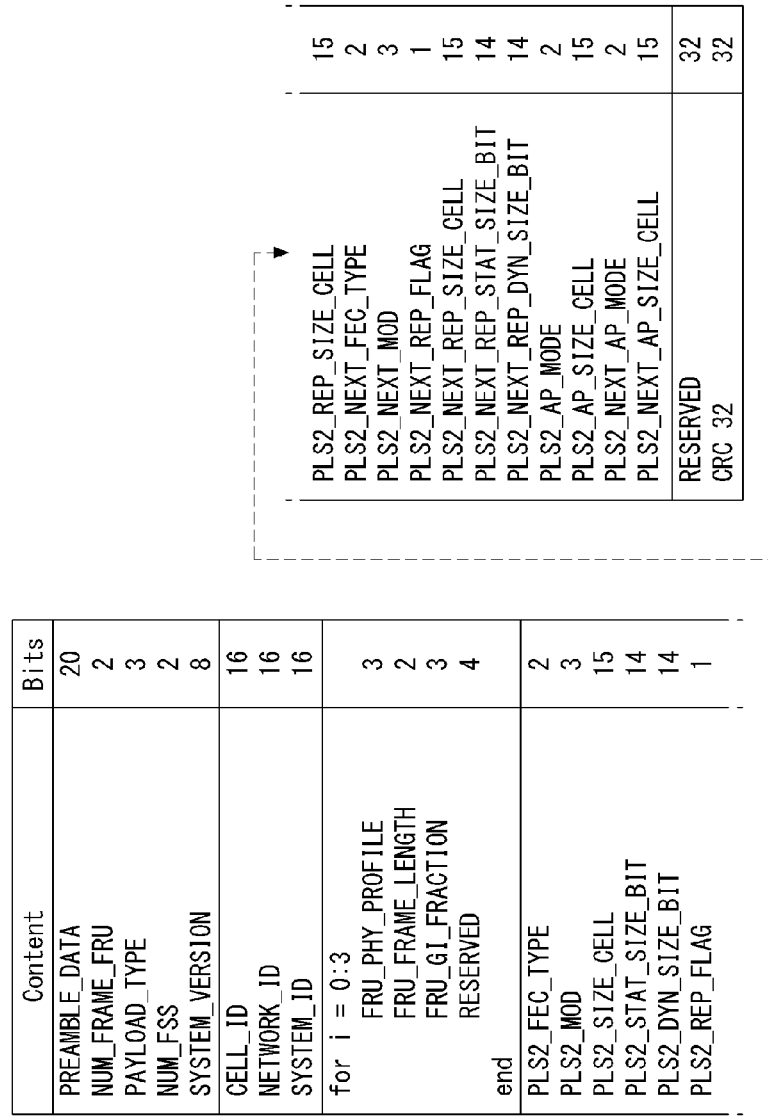
[Figure 13]

[Figure 14]

| Content | Bit |
|---|---|
| FIC_FLAG | 1 |
| AUX_FLAG | 1 |
| NUM_DP | 6 |
| for i = NUM_DP | |
| DP_ID | 6 |
| DP_TYPE | 3 |
| DP_GROUP_ID | 8 |
| BASE_DP_ID | 6 |
| DP_FEC_TYPE | 2 |
| DP_COD | 4 |
| DP_MOD | 4 |
| DP_SSD_FLAG | 1 |
| if PHY_PROFILE = '010' | |
| DP_MIMO | 3 |
| end | |
| DP_TI_TYPE | 1 |
| DP_TI_LENGTH | 2 |
| DP_TI_BYPASS | 1 |
| DP_FRAME_INTERVAL | 2 |
| DP_FIRST_FRAME_IDX | 5 |
| DP_NUM_BLOCK_MAX | 10 |
| DP_PAYLOAD_TYPE | 2 |
| DP_INBAND_MODE | 2 |
| DP_PROTOCAL_TYPE | 2 |
| DP_CRC_MODE | 2 |

| | |
|---|---|
| if DP_PAYLOAD_TYPE==TS('00') | |
| DNP_MODE | 2 |
| ISSY_MODE | 2 |
| HC_MODE_TS | 2 |
| if HC_MODE_TS=='01' or '10' | |
| PID | 13 |
| end | |
| if DP_PAYLOAD_TYPE==IP('01') | |
| HC_MODE_IP | 2 |
| end | |
| RESERVED | 8 |
| end | |
| if FIC_FLAG == 1 | |
| FIC_VERSION | 8 |
| FIC_LENGTH_BYTE | 13 |
| RESERVED | 8 |
| end | |
| if AUX_FLAG == 1 | |
| NUM_AUX | 4 |
| AUX_CONFIG_RFU | 8 |
| for i=1:NUM_AUX | |
| AUX_STREAM_TYPE | 4 |
| AUX_PRIVATE_CONF | 28 |
| end | |
| end | |

[Figure 15]

| Content | Bit |
|---|---|
| FRAME_INDEX<br>PLS_CHANGE_COUNTER<br>FIC_CHANGE_COUNTER<br>RESERVED<br>for i = 1:NUM_DP | 5<br>4<br>4<br>16 |
|     DP_ID<br>    DP_START<br>    DP_NUM_BLOCK<br>    RESERVED<br>end | 6<br>15(or 13)<br>10<br>8 |
| EAC_FLAG<br>EAS_WAKE_UP_VERSION_NUM<br>if EAC_FLAG == 1<br>    EAC_LENGTH_BYTE<br>else<br>    EAC_COUNTER<br>end<br>for i = 1:NUM_AUX<br>    AUX_PRIVATE_DYN<br>end<br>CRC 32 | 1<br>8<br><br>12<br><br>12<br><br><br>48<br><br>32 |

[Figure 16]
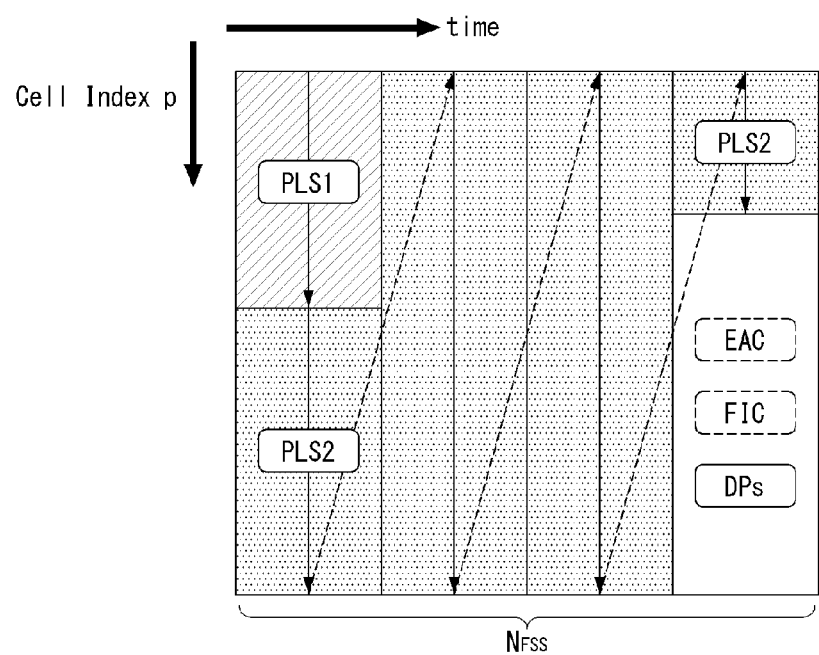
[Figure 17]

[Figure 18]
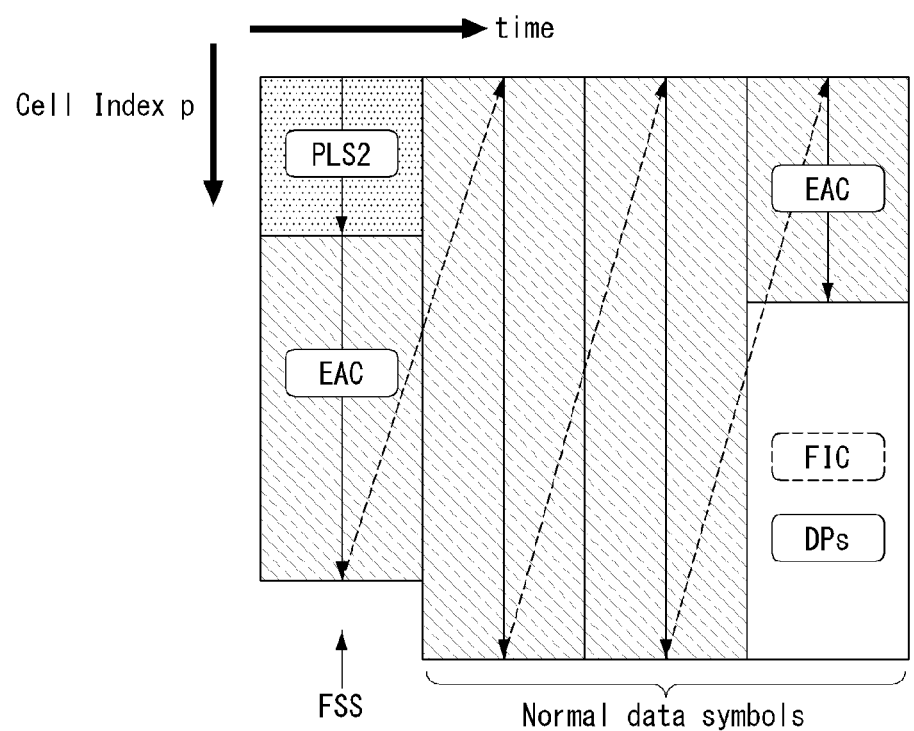

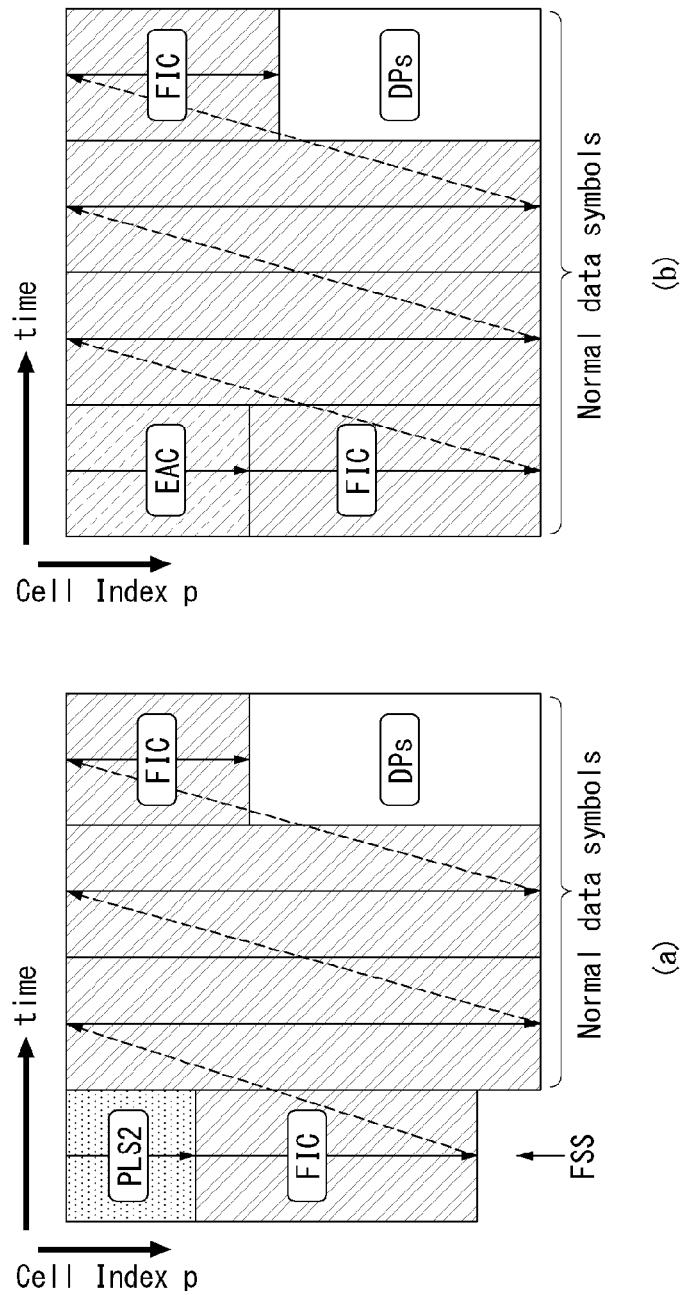
[Figure 19]

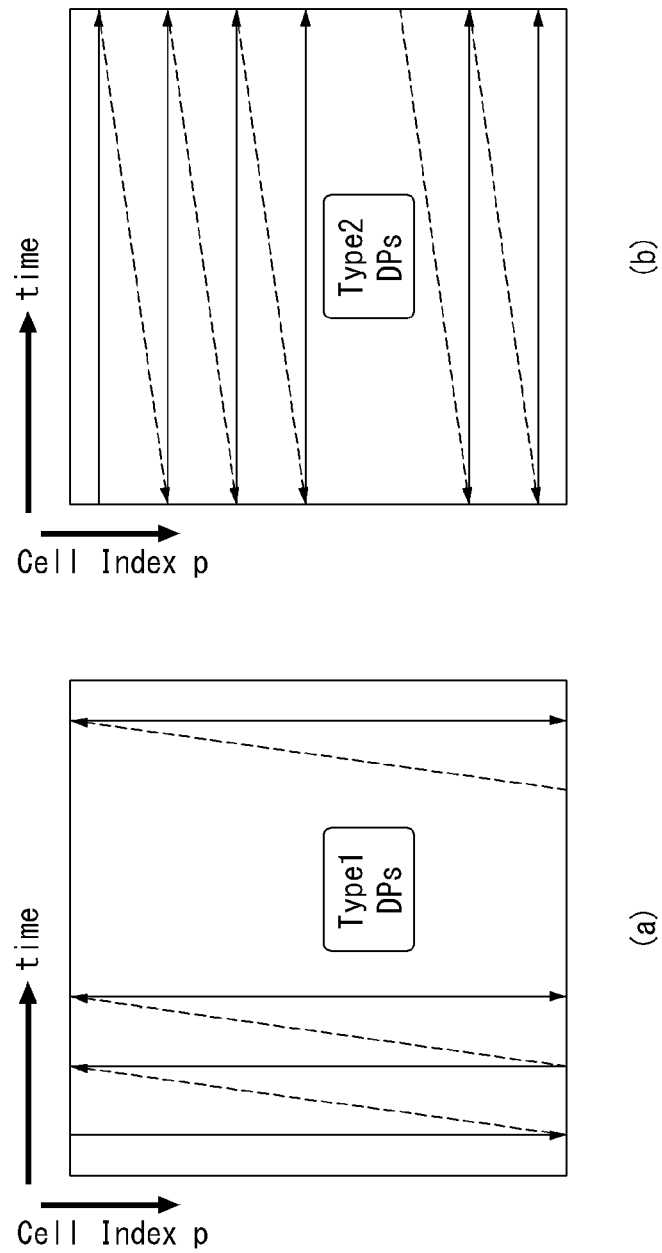
[Figure 20]

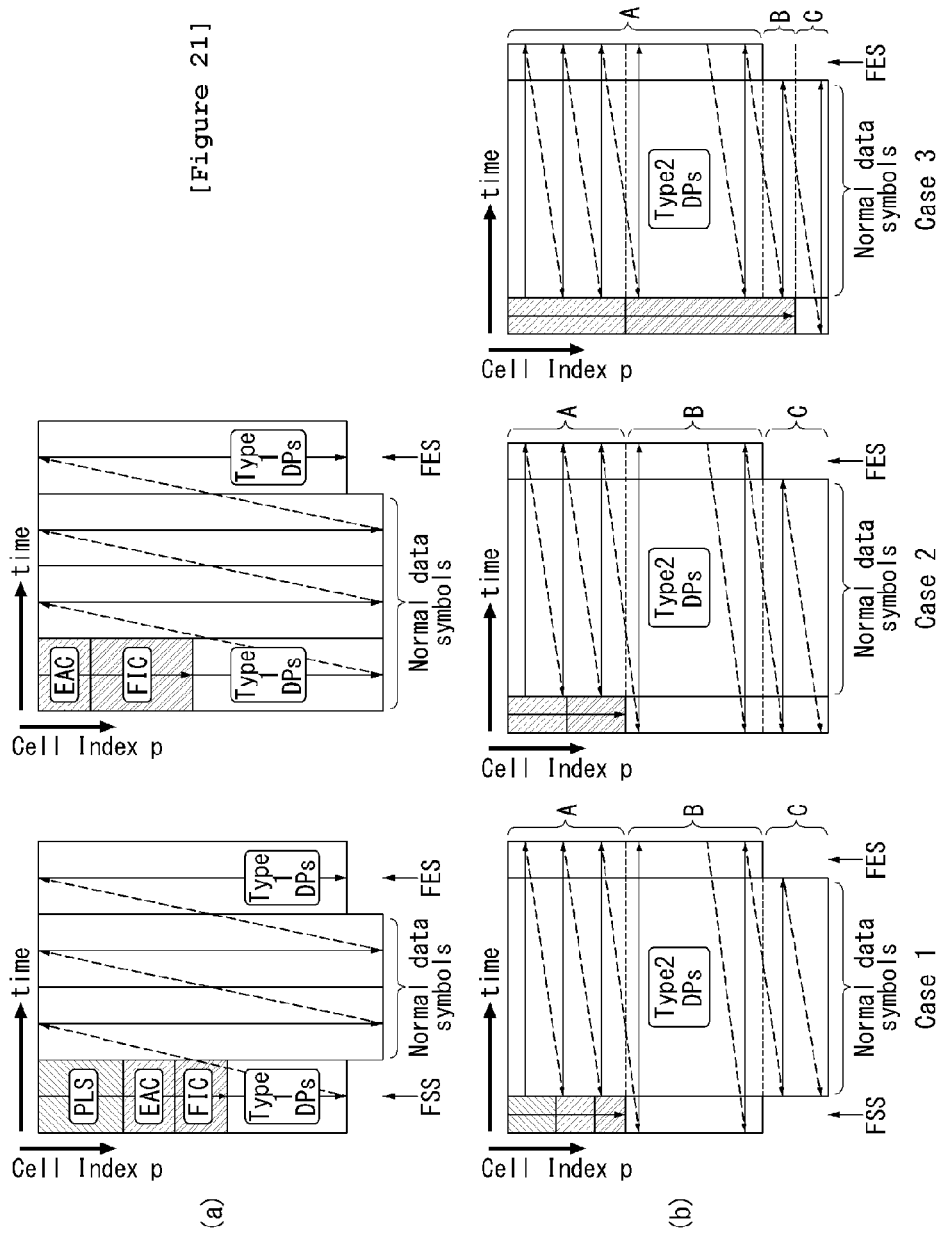

[Figure 22]
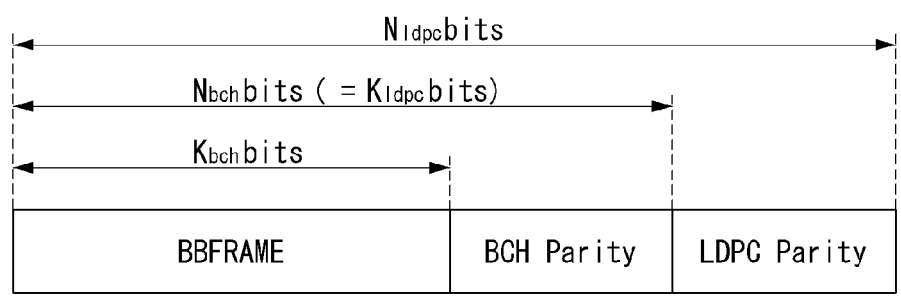

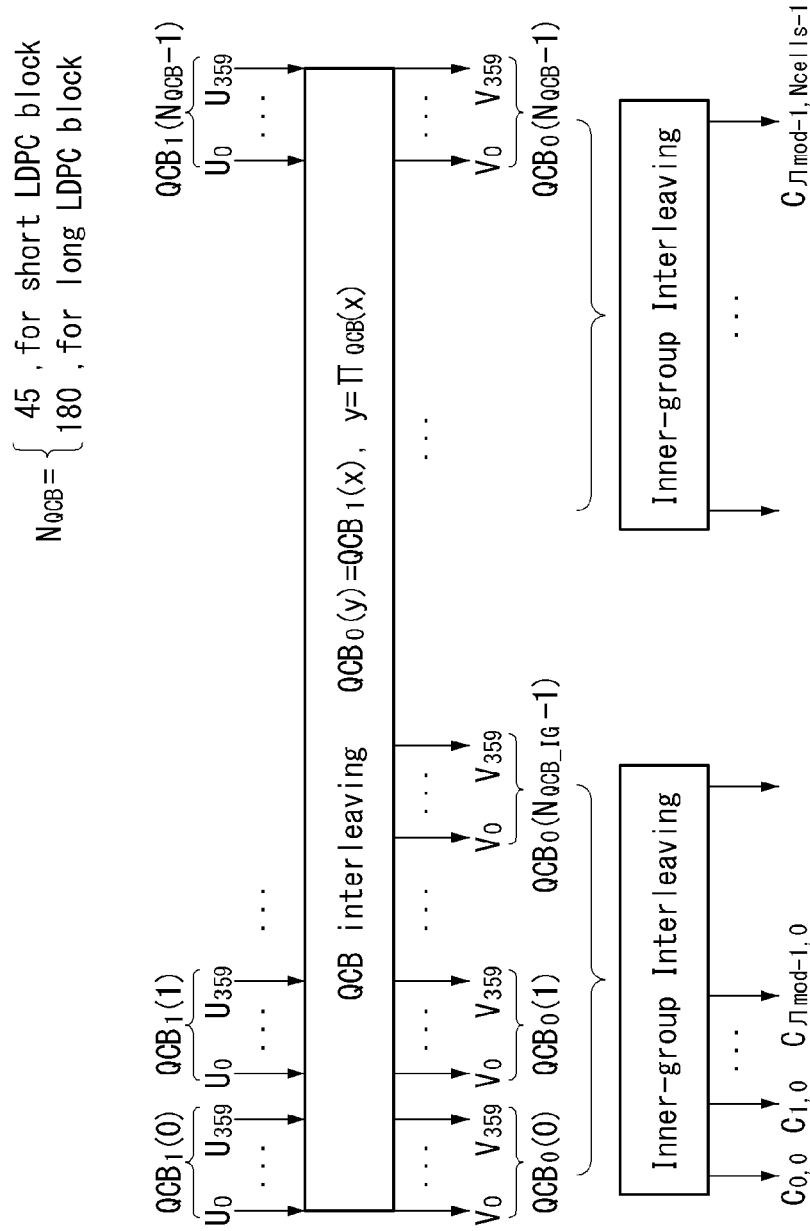
[Figure 23]

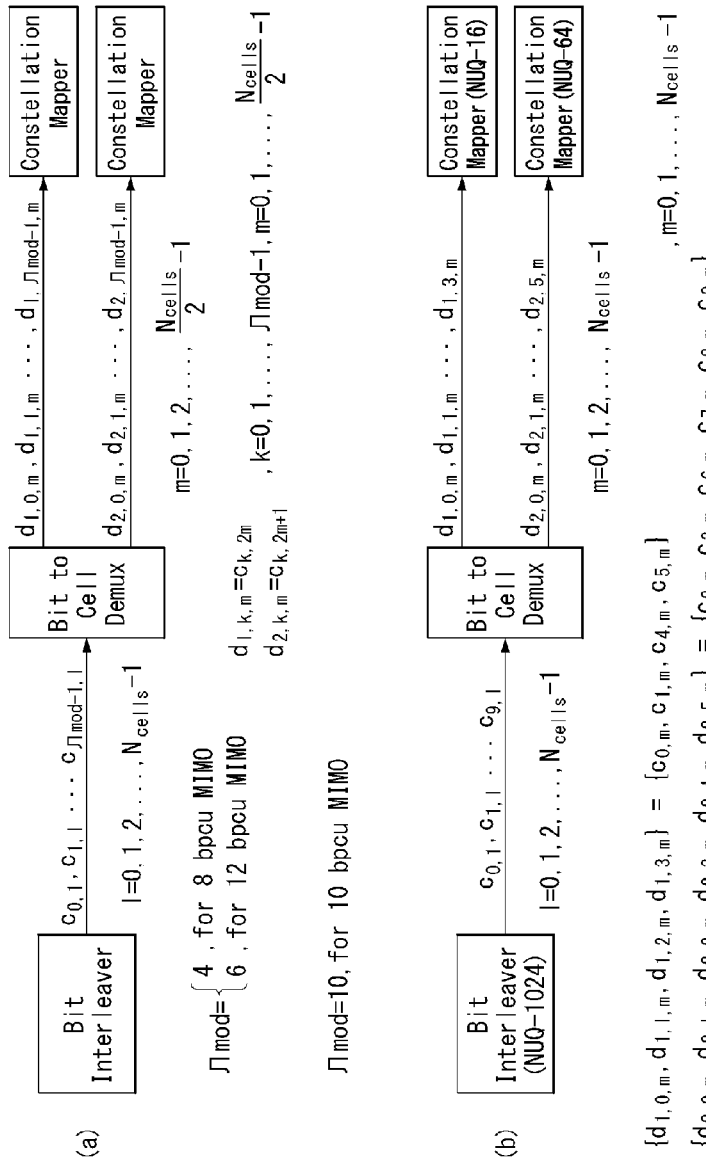
[Figure 24]

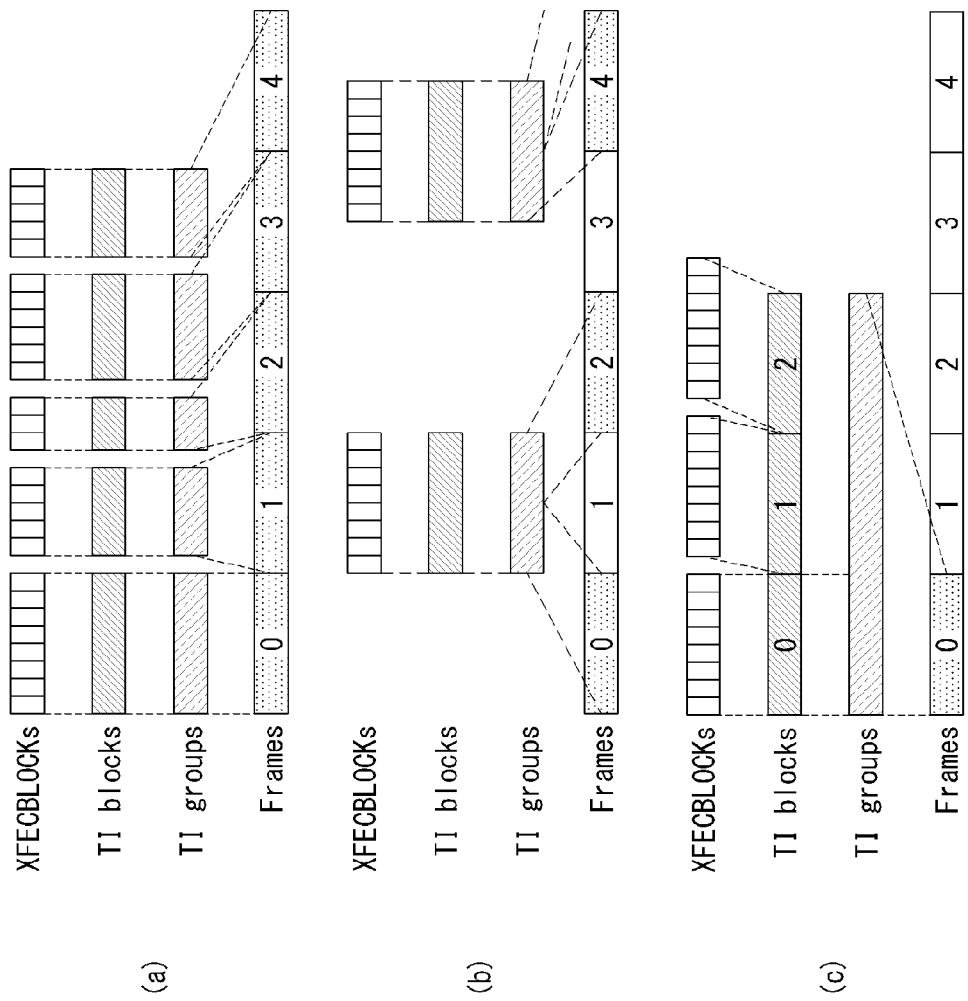
[Figure 25]

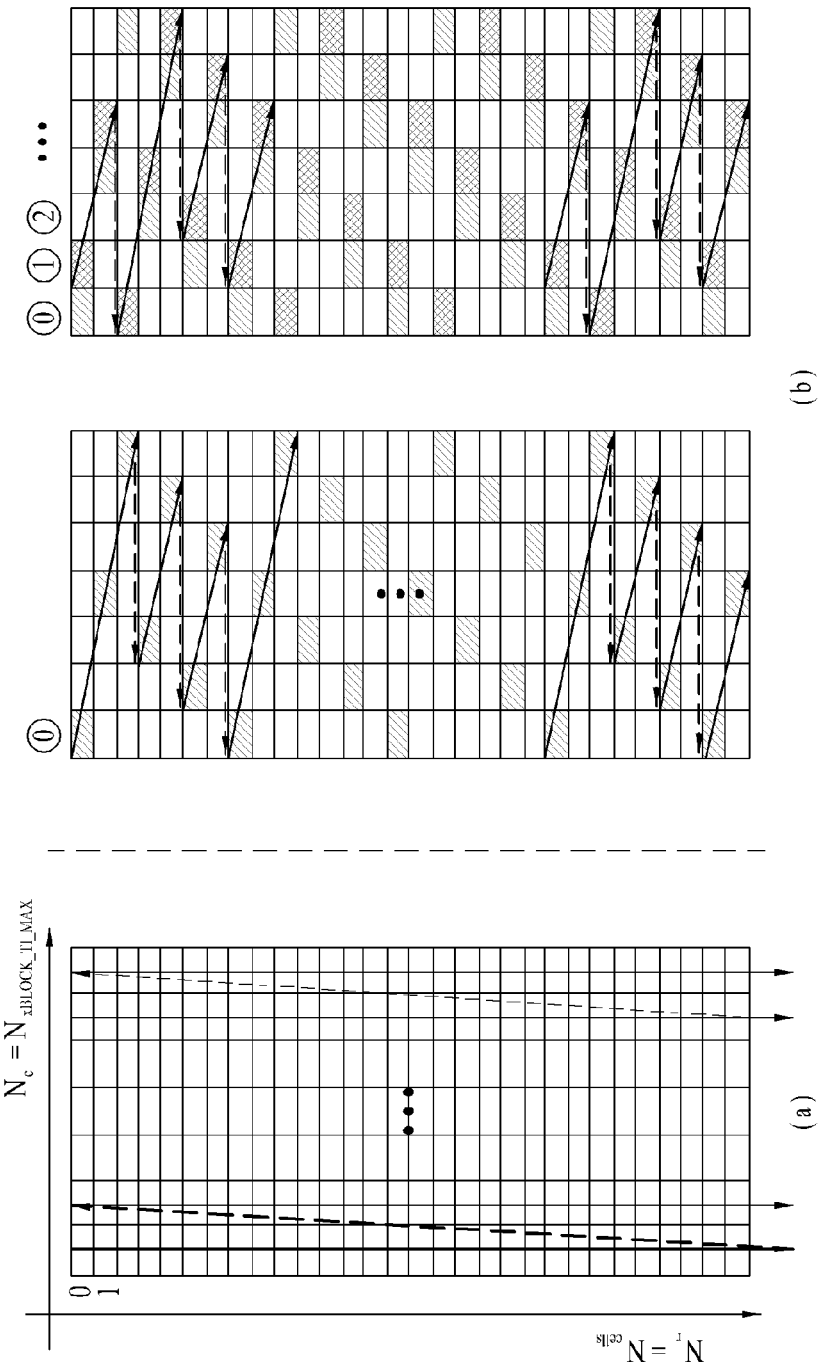
[Figure 26]

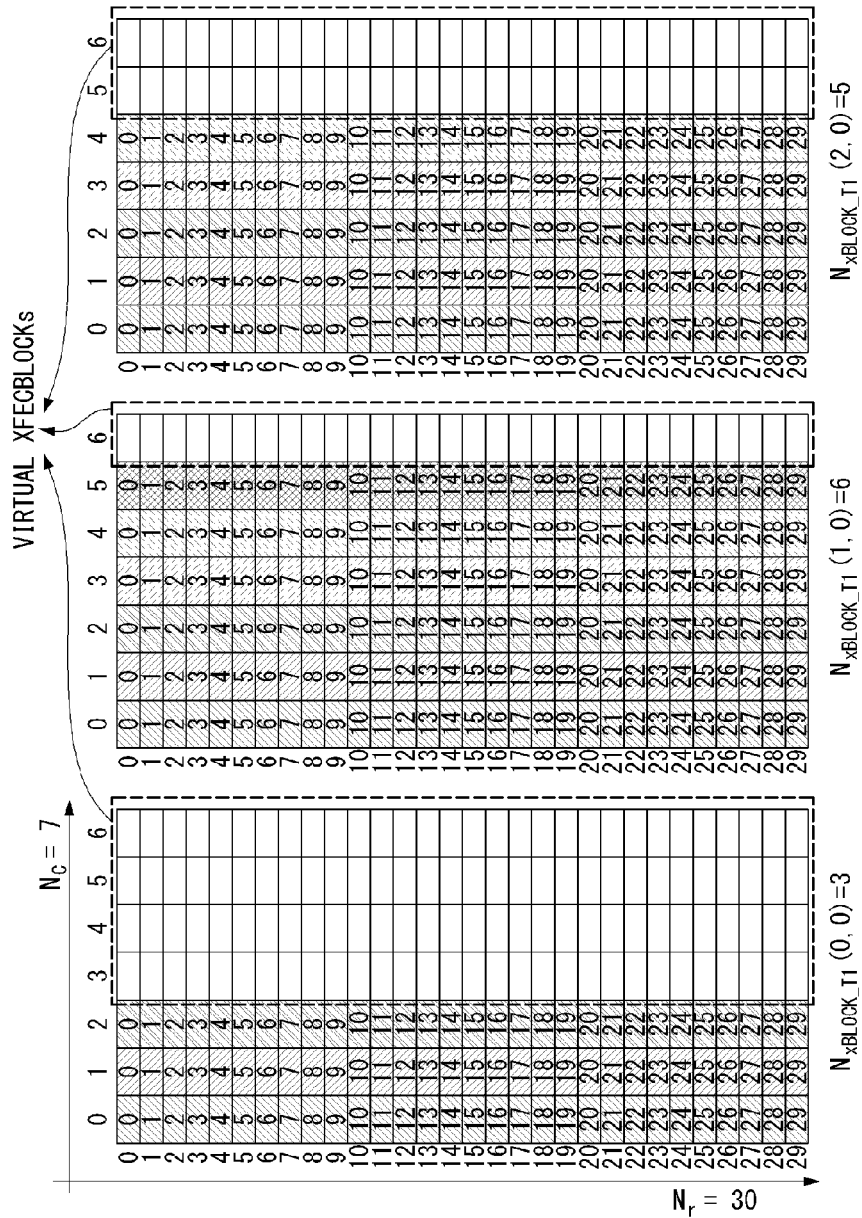
[Figure 27]

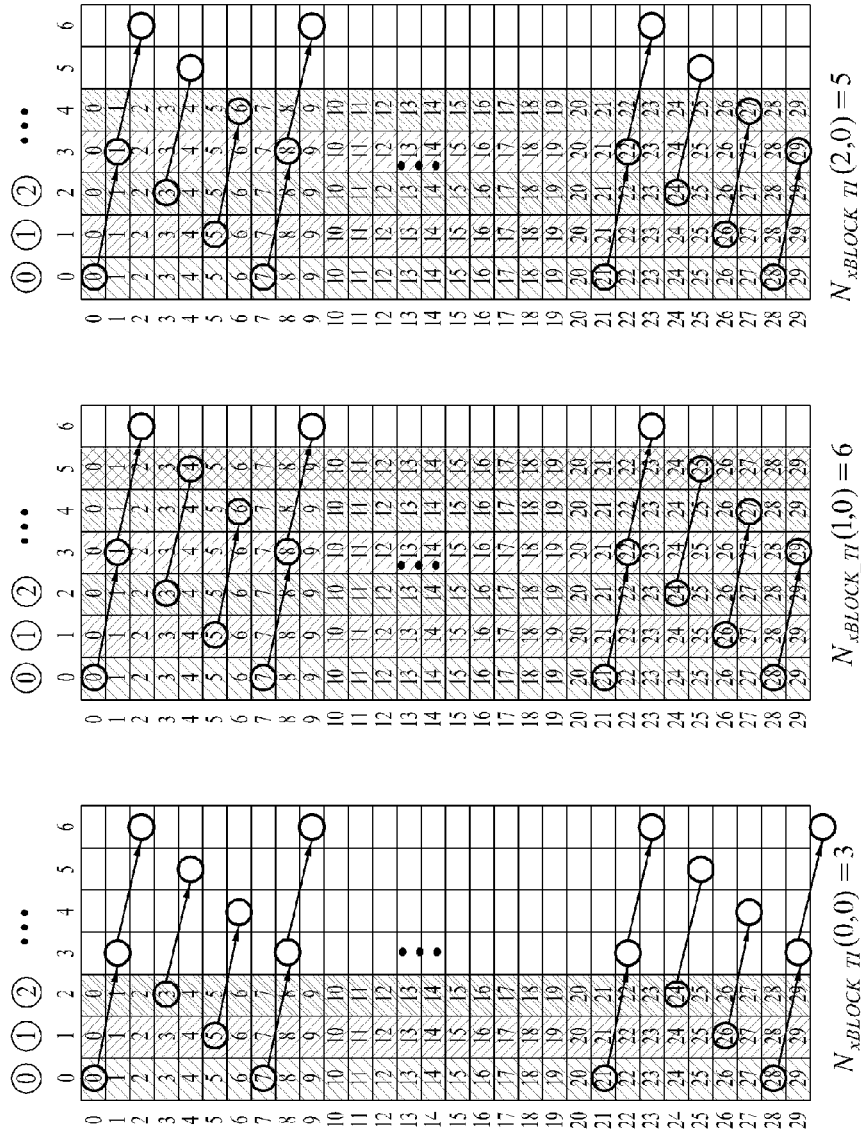
[Figure 28]

[Figure 29]

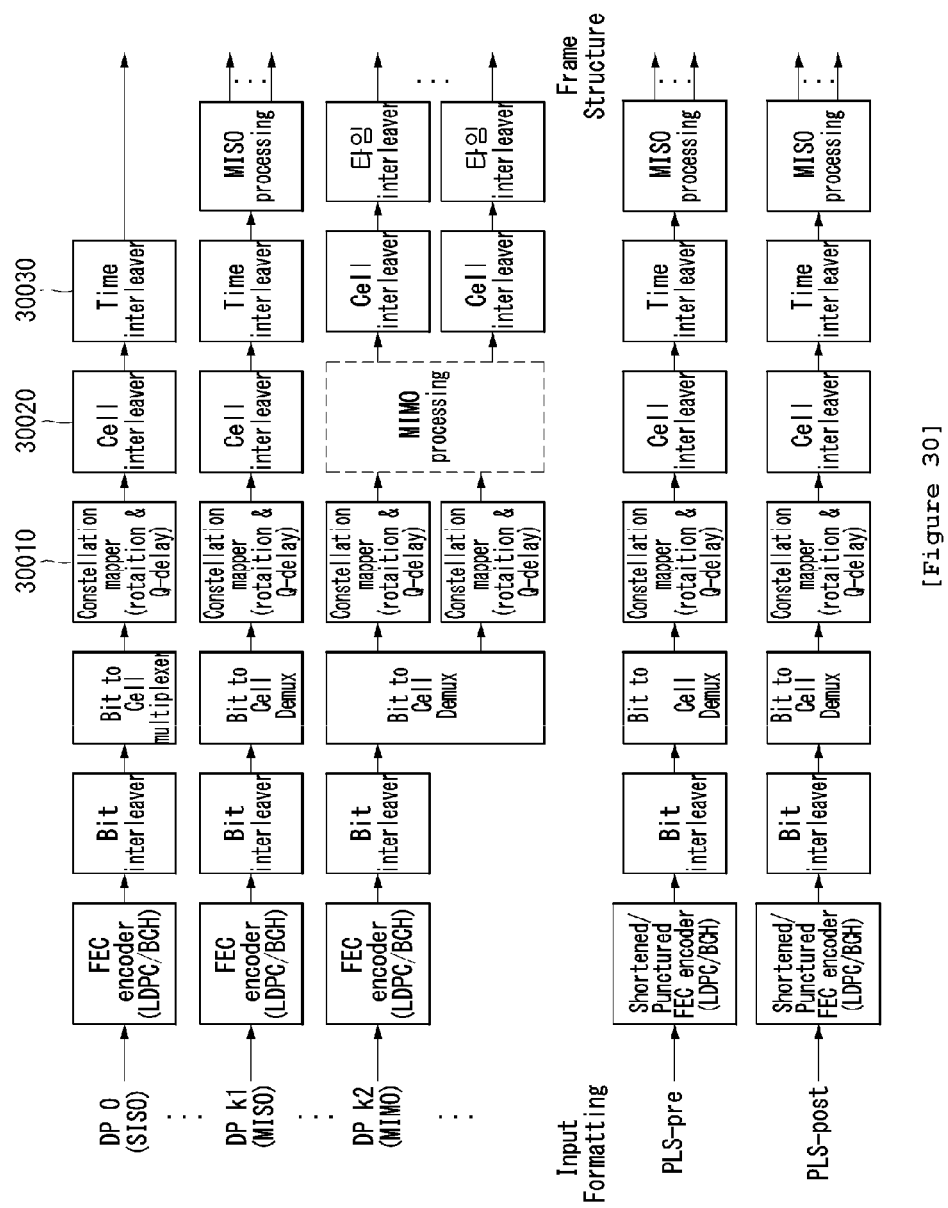
[Figure 30]

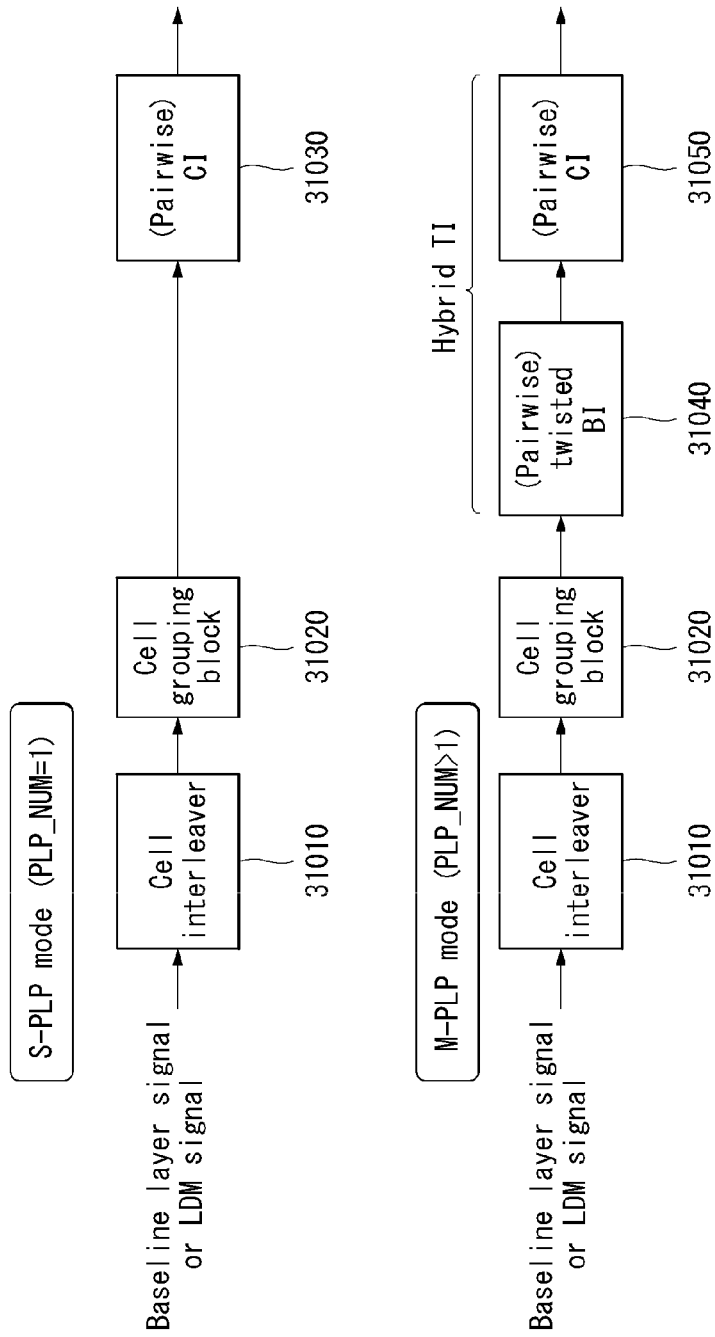
[Figure 31]

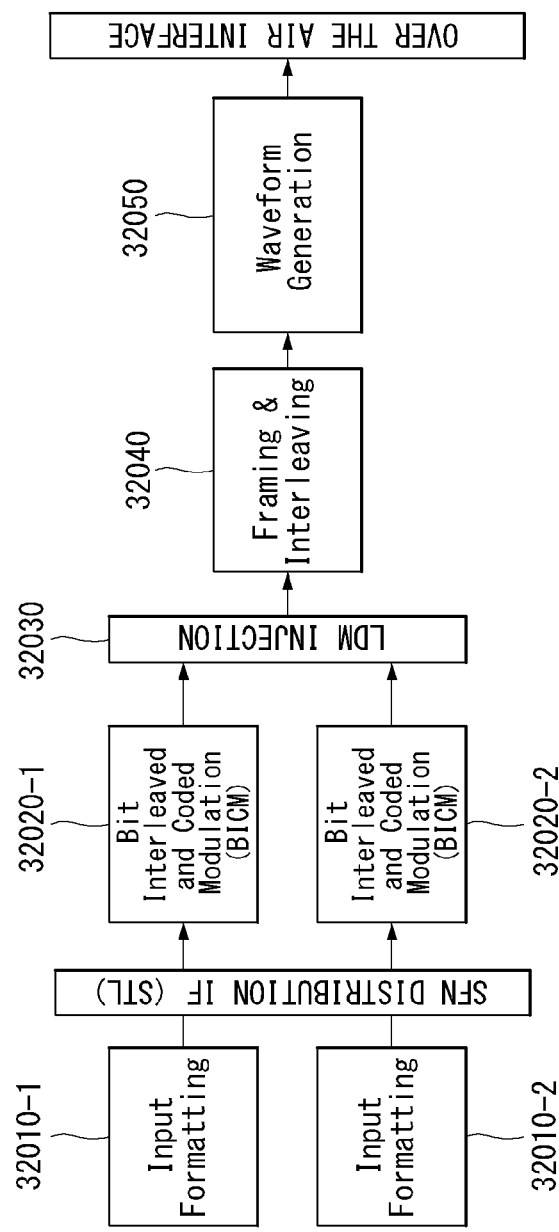
[Figure 32]

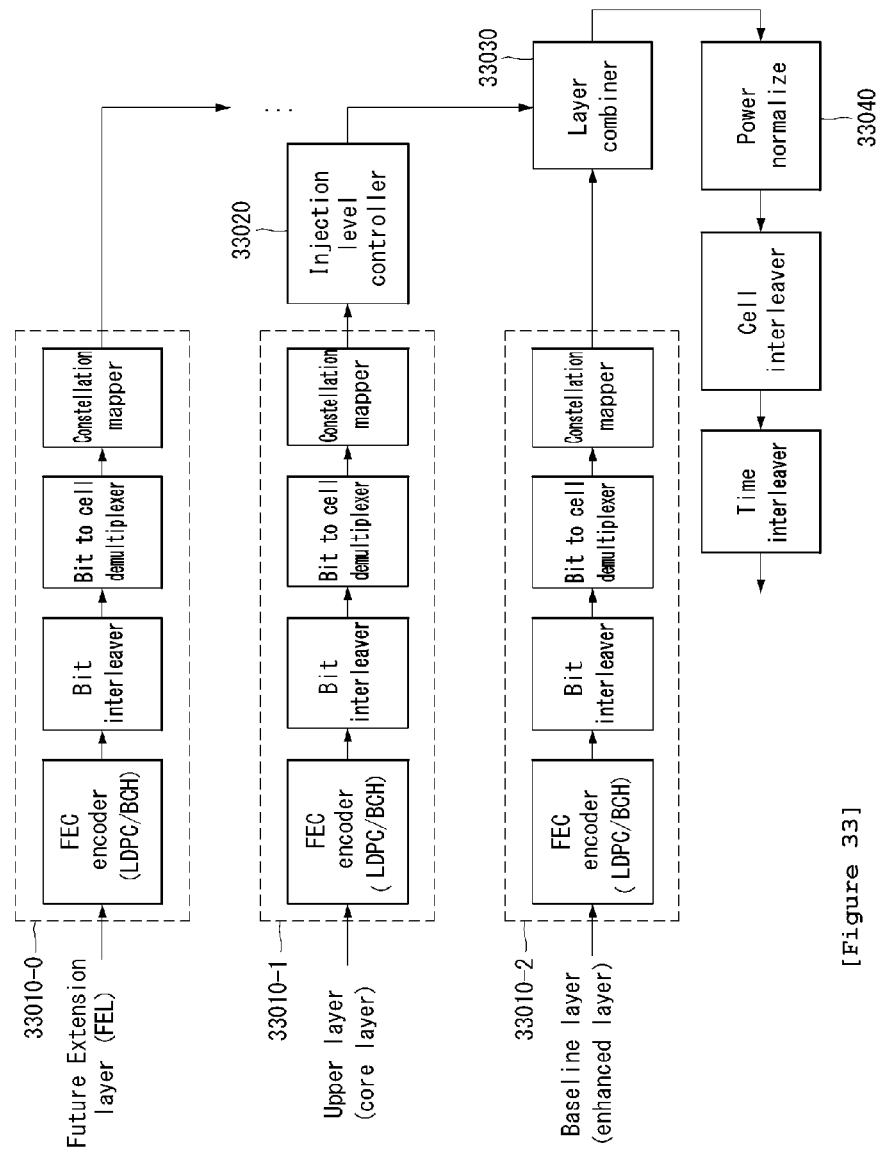
[Figure 33]

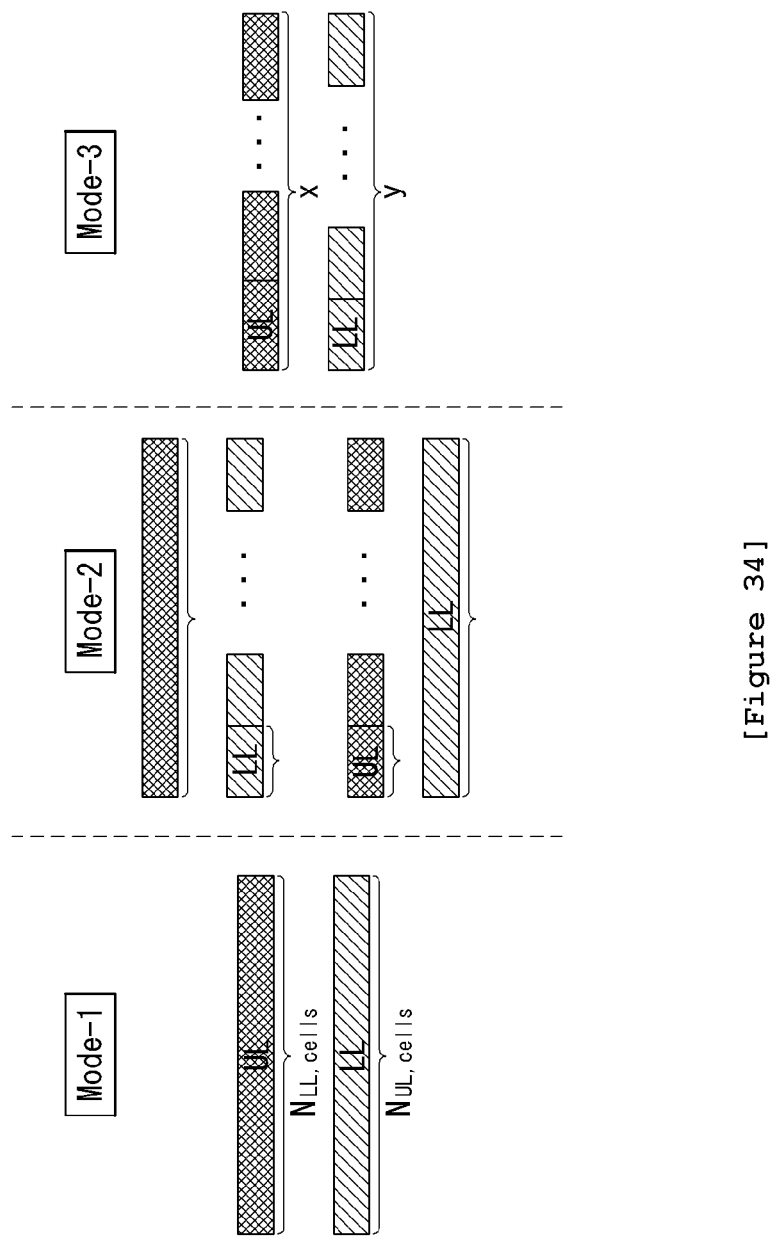
[Figure 34]

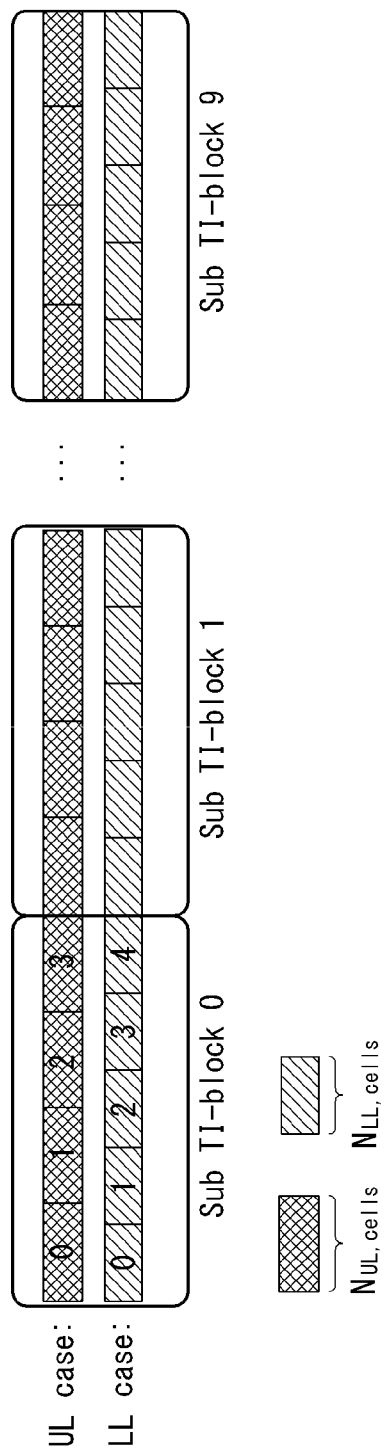
[Figure 35]

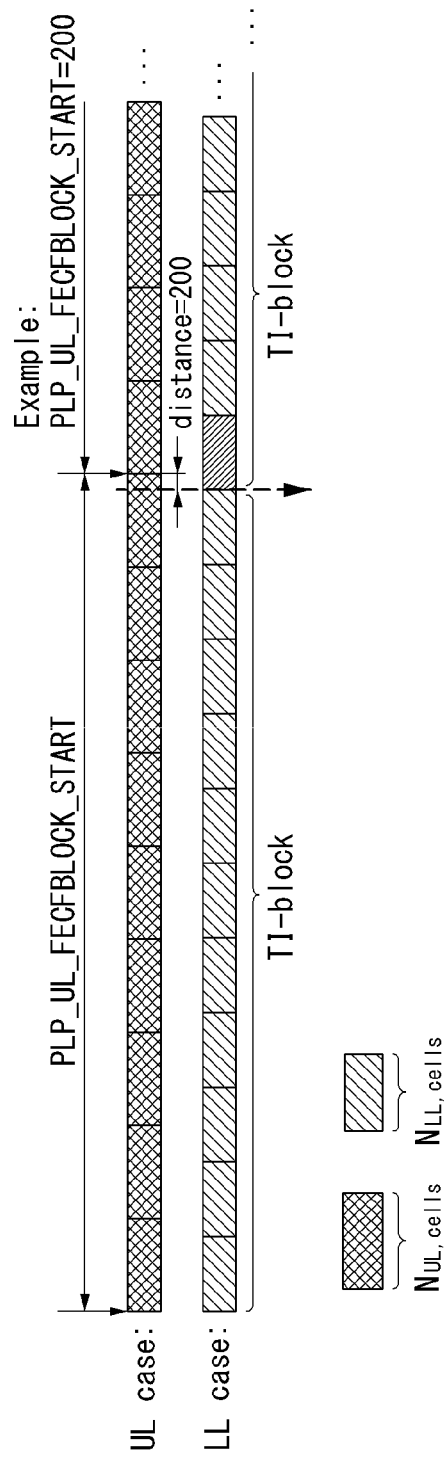
[Figure 36]

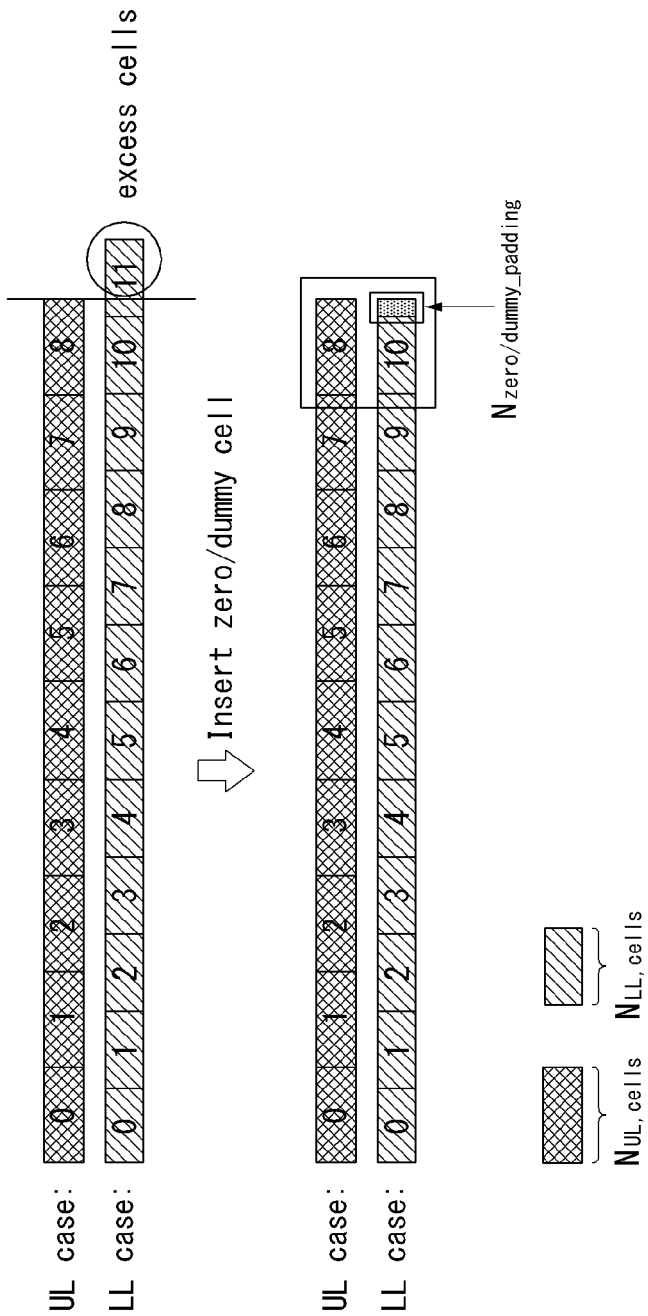
[Figure 37]

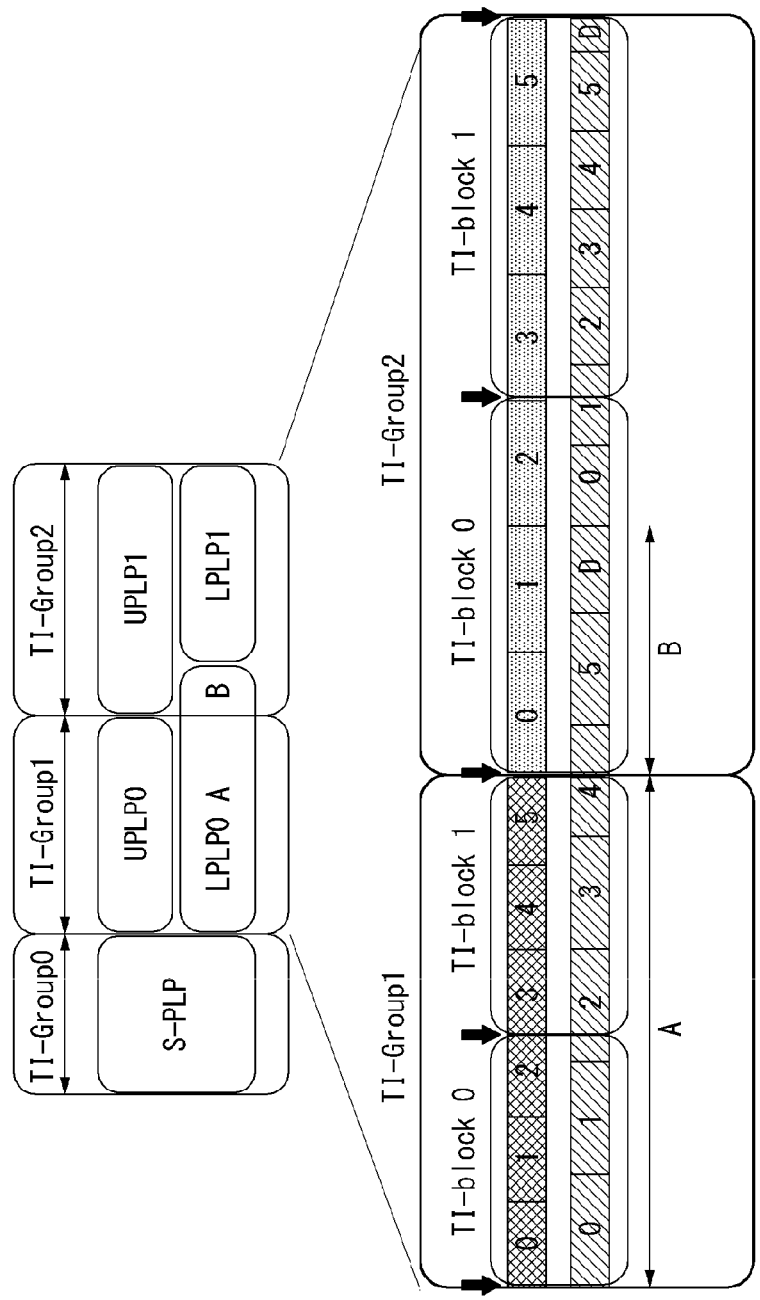
[Figure 38]

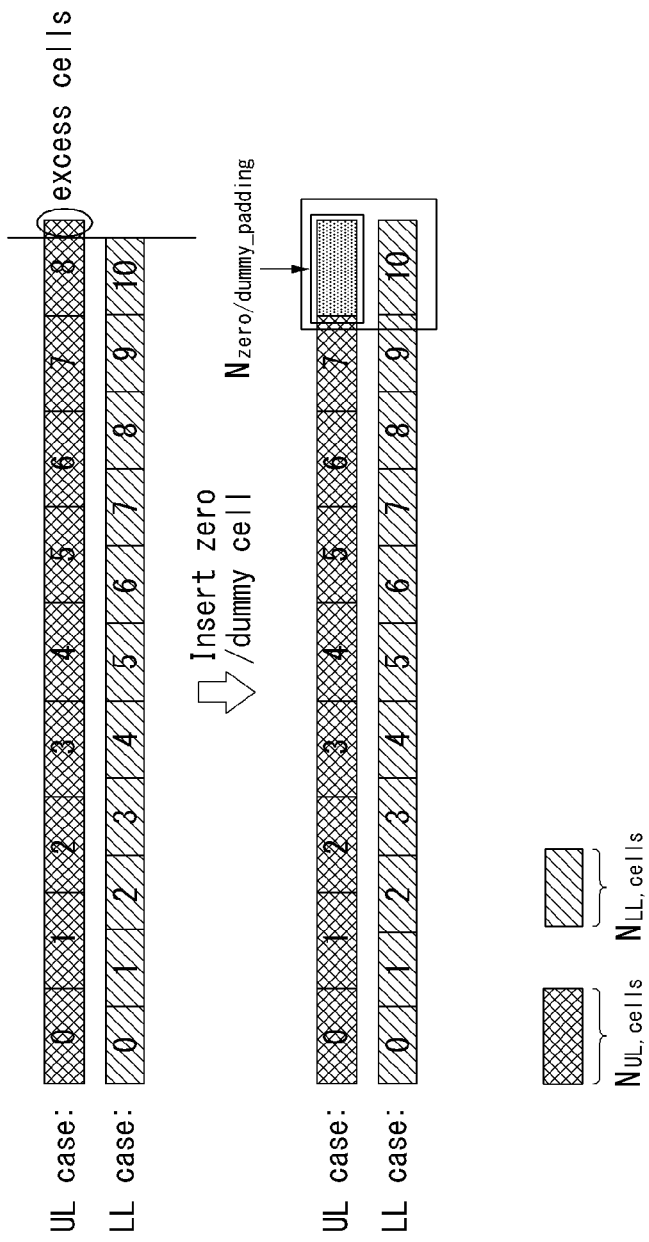
[Figure 39]

[Figure 40]
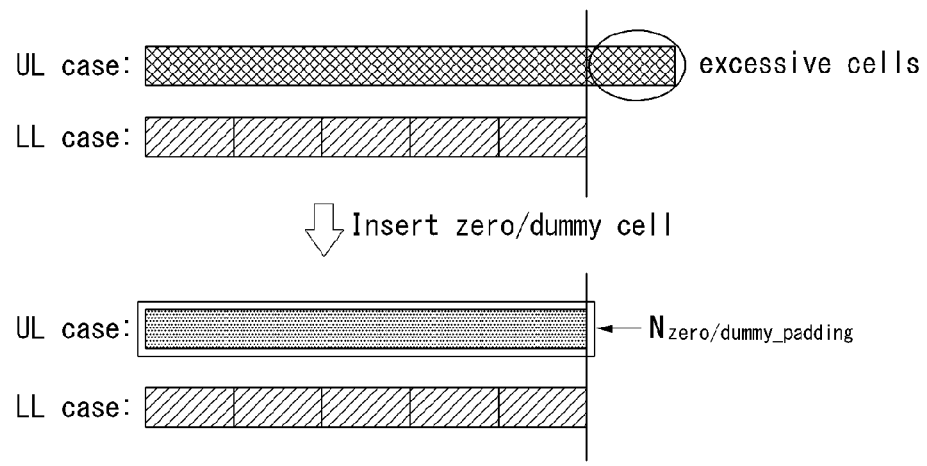

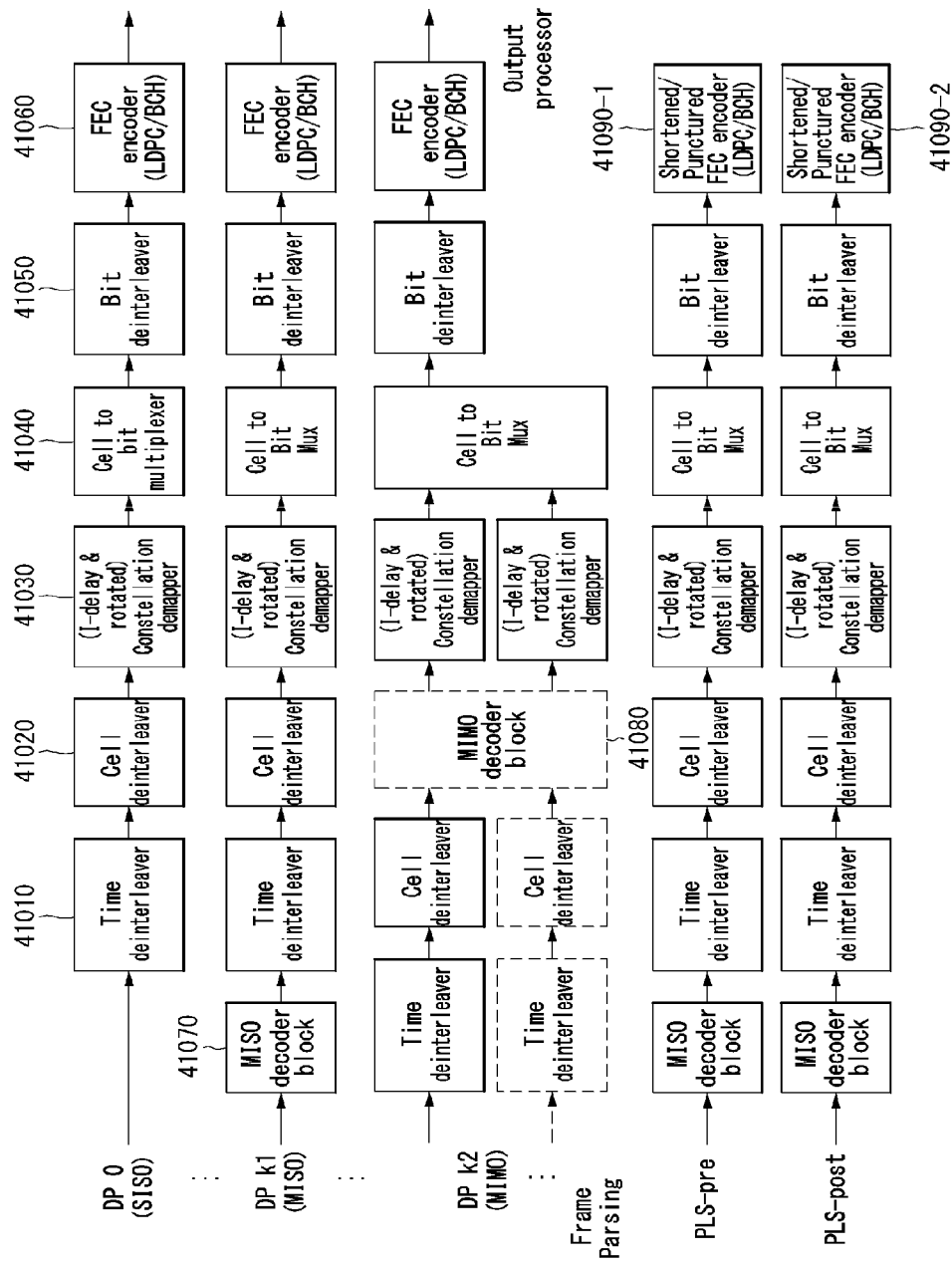
[Figure 41]

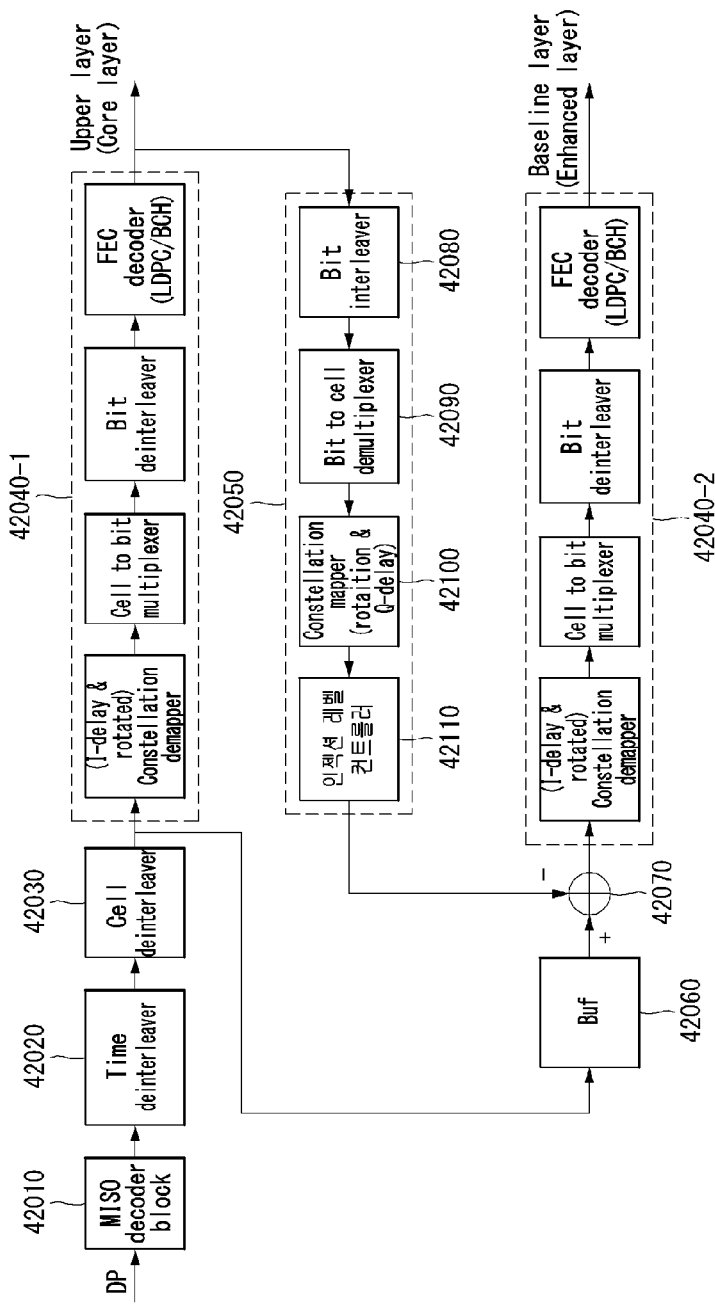
[Figure 42]

[Figure 43]
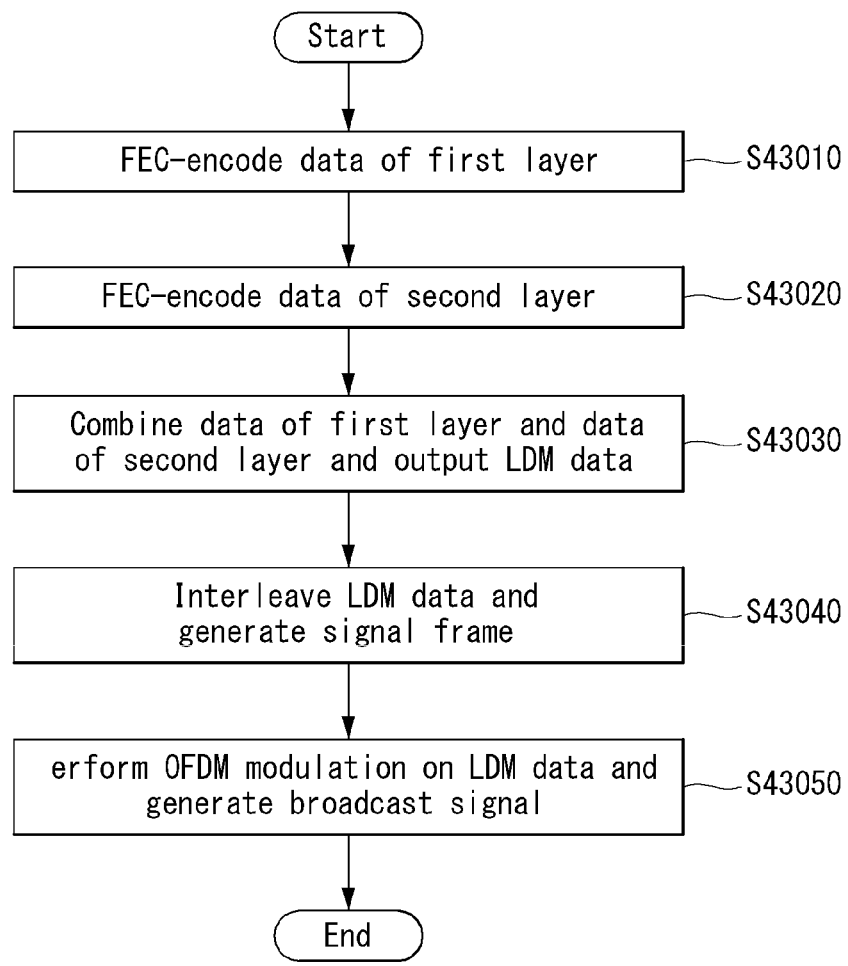

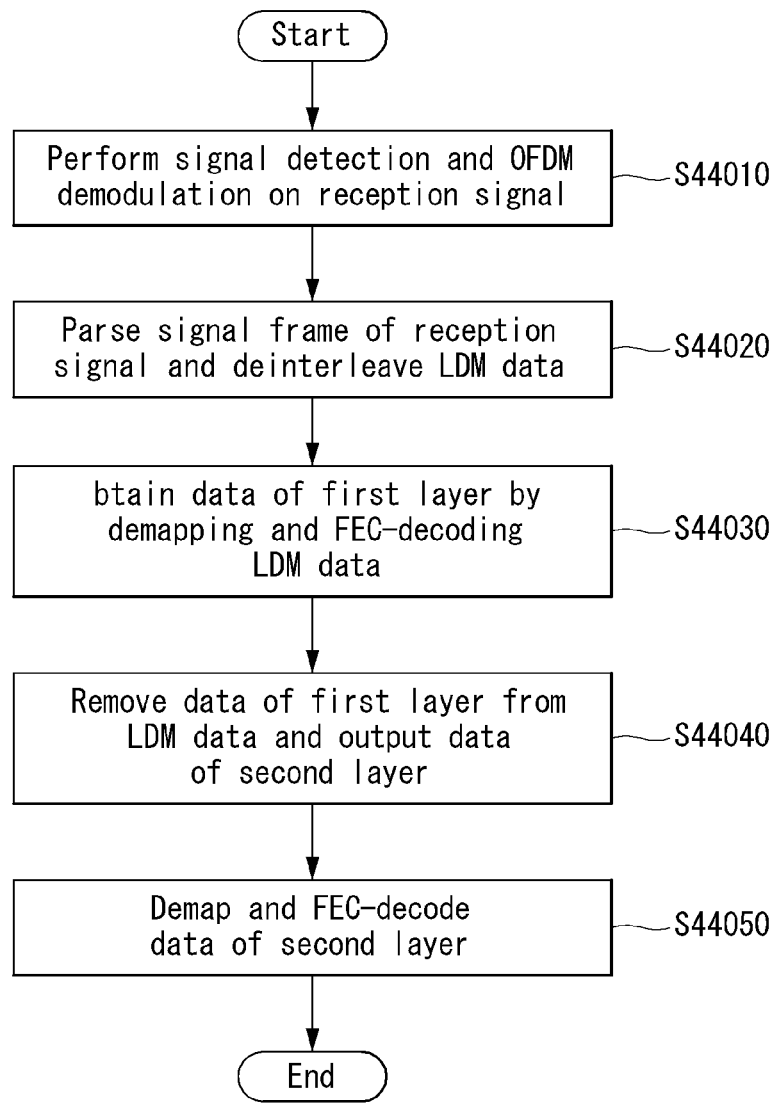
[Figure 44]

APPARATUS AND METHOD FOR RECEIVING BROADCAST SIGNALS

CROSS-REFERENCE TO RELATED APPLICATIONS

This application claims priority to Provisional Application No. 62/135,722 filed on 20 Mar. 2015 in US and Provisional Application No. 62/144,869 filed on 8 Apr. 2015 in US, the entire contents of which is hereby incorporated by reference in its entirety.

BACKGROUND OF THE INVENTION

Field of the Invention

The present invention relates to an apparatus for transmitting broadcast signals, an apparatus for receiving broadcast signals and methods for transmitting and receiving broadcast signals.

Discussion of the Related Art

As analog broadcast signal transmission comes to an end, various technologies for transmitting/receiving digital broadcast signals are being developed. A digital broadcast signal may include a larger amount of video/audio data than an analog broadcast signal and further include various types of additional data in addition to the video/audio data.

That is, a digital broadcast system can provide HD (high definition) images, multi-channel audio and various additional services. However, data transmission efficiency for transmission of large amounts of data, robustness of transmission/reception networks and network flexibility in consideration of mobile reception equipment need to be improved for digital broadcast.

SUMMARY OF THE INVENTION

In accordance with an embodiment of the present invention, there is provided a broadcast signal receiver, including a synchronization and demodulation unit configured to perform signal detection and OFDM demodulation on a reception signal including layer division multiplexing (LDM) data, a frame parsing/deinterleaving unit configured to parse the signal frame of the reception signal and to deinterleave the LDM data, a first demapping/decoding unit configured to obtain the data of a first layer by demapping and forward error correction (FEC)-decoding the LDM data, an interference removal unit configured to remove the data of the first layer from the LDM data and to output the data of a second layer, and a second demapping/decoding unit configured to demap and FEC-decode the data of the second layer. The frame parsing/deinterleaving unit may include a time deinterleaver.

Furthermore, in the broadcast signal receiver in accordance with an embodiment of the present invention, the interference removal unit may include a buffer configured to buffer the LDM data, an injection level controller configured to control a power ratio of the data of the first layer and the data of the second layer, and a signal divider configured to separate the data of the second layer from the buffered LDM data.

Furthermore, in the broadcast signal receiver in accordance with an embodiment of the present invention, the time deinterleaver may deinterleave the LDM data by a unit of a TI block.

Furthermore, in the broadcast signal receiver in accordance with an embodiment of the present invention, the size of the TI block may correspond to the size of an integer number of FEC blocks in the first layer and may correspond to the size of an integer number of FEC blocks in the second layer.

Furthermore, in the broadcast signal receiver in accordance with an embodiment of the present invention, the size of the TI block may correspond to the size of an integer number of FEC blocks in the first layer. When the size of the TI block does not correspond to the size of an integer number of FEC blocks in the second layer, the last FEC block of the second layer which exceeds the size of the TI block may be deleted and dummy cells may be inserted to fill the TI block.

Furthermore, in the broadcast signal receiver in accordance with an embodiment of the present invention, the at least one TI block may be included in a TI group, and the TI group may correspond to a PLP of the first layer.

In accordance with an embodiment of the present invention, there is provided a method of receiving a broadcast signal, including performing signal detection and OFDM demodulation on a reception signal including layer division multiplexing (LDM) data, parsing the signal frame of the reception signal and deinterleaving the LDM data, obtaining the data of a first layer by demapping and forward error correction (FEC)-decoding the LDM data, removing the data of the first layer from the LDM data and outputting the data of a second layer, and demapping and FEC-decoding the data of the second layer. Parsing the signal frame of the reception signal and deinterleaving the LDM data may include time-deinterleaving the LDM data.

Furthermore, in the method of receiving a broadcast signal in accordance with an embodiment of the present invention, removing the data of the first layer from the LDM data and outputting the data of the second layer may include buffering the LDM data, controlling a power ratio of the data of the first layer and the data of the second layer, and separating the data of the second layer from the buffered LDM data.

The present invention can process data according to service characteristics to control QoS (Quality of Services) for each service or service component, thereby providing various broadcast services.

The present invention can achieve transmission flexibility by transmitting various broadcast services through the same RF signal bandwidth.

The present invention can improve data transmission efficiency and increase robustness of transmission/reception of broadcast signals using a MIMO system.

According to the present invention, it is possible to provide broadcast signal transmission and reception methods and apparatus capable of receiving digital broadcast signals without error even with mobile reception equipment or in an indoor environment.

Further aspects and effects of the present invention will be described more detail with embodiments in below.

BRIEF DESCRIPTION OF THE DRAWINGS

FIG. 1 illustrates a structure of an apparatus for transmitting broadcast signals for future broadcast services according to an embodiment of the present invention.

FIG. 2 illustrates an input formatting block according to one embodiment of the present invention.

FIG. 3 illustrates an input formatting block according to another embodiment of the present invention.

FIG. 4 illustrates an input formatting block according to another embodiment of the present invention.

FIG. 5 illustrates a BICM block according to an embodiment of the present invention.

FIG. 6 illustrates a BICM block according to another embodiment of the present invention.

FIG. 7 illustrates a frame building block according to one embodiment of the present invention.

FIG. 8 illustrates an OFDM generation block according to an embodiment of the present invention.

FIG. 9 illustrates a structure of an apparatus for receiving broadcast signals for future broadcast services according to an embodiment of the present invention.

FIG. 10 illustrates a frame structure according to an embodiment of the present invention.

FIG. 11 illustrates a signaling hierarchy structure of the frame according to an embodiment of the present invention.

FIG. 12 illustrates preamble signaling data according to an embodiment of the present invention.

FIG. 13 illustrates PLS1 data according to an embodiment of the present invention.

FIG. 14 illustrates PLS2 data according to an embodiment of the present invention.

FIG. 15 illustrates PLS2 data according to another embodiment of the present invention.

FIG. 16 illustrates a logical structure of a frame according to an embodiment of the present invention.

FIG. 17 illustrates PLS mapping according to an embodiment of the present invention.

FIG. 18 illustrates EAC mapping according to an embodiment of the present invention.

FIG. 19 illustrates FIC mapping according to an embodiment of the present invention.

FIG. 20 illustrates a type of DP according to an embodiment of the present invention.

FIG. 21 illustrates DP mapping according to an embodiment of the present invention.

FIG. 22 illustrates an FEC structure according to an embodiment of the present invention.

FIG. 23 illustrates a bit interleaving according to an embodiment of the present invention.

FIG. 24 illustrates a cell-word demultiplexing according to an embodiment of the present invention.

FIG. 25 illustrates a time interleaving according to an embodiment of the present invention.

FIG. 26 illustrates a basic operation of a twisted row-column block interleaver according to an exemplary embodiment of the present invention.

FIG. 27 illustrates an operation of a twisted row-column block interleaver according to another exemplary embodiment of the present invention.

FIG. 28 illustrates a diagonal reading pattern of the twisted row-column block interleaver according to the exemplary embodiment of the present invention.

FIG. 29 illustrates XFECBLOCK interleaved from each interleaving array according to an exemplary embodiment of the present invention.

FIG. 30 is a detailed block diagram of a BICM block in accordance with another embodiment of the present invention.

FIG. 31 shows a time interleaver in accordance with an embodiment of the present invention.

FIG. 32 illustrates the configuration of a broadcast signal transmitter in accordance with an embodiment of the present invention.

FIG. 33 illustrates the configuration of a broadcast signal transmitter in accordance with an embodiment of the present invention.

FIG. 34 illustrates an LDM processing method in accordance with an embodiment of the present invention.

FIG. 35 illustrates the relationship between an FEC block and a time interleaving block according to LDM processing in accordance with an embodiment of the present invention.

FIG. 36 illustrates the relationship between an FEC block and a time interleaving block according to LDM processing in accordance with an embodiment of the present invention.

FIG. 37 illustrates the relationship between an FEC block and a time interleaving block according to LDM processing in accordance with an embodiment of the present invention.

FIG. 38 illustrates the relationship between an FEC block and a time interleaving block according to LDM processing in accordance with an embodiment of the present invention.

FIG. 39 illustrates the relationship between an FEC block and a time interleaving block according to LDM processing in accordance with an embodiment of the present invention.

FIG. 40 illustrates the relationship between an FEC block and a time interleaving block according to LDM processing in accordance with another embodiment of the present invention.

FIG. 41 is a detailed block diagram of a demapping/decoding block in accordance with an embodiment of the present invention.

FIG. 42 illustrates the configuration of part of a broadcast signal receiver in accordance with an embodiment of the present invention.

FIG. 43 illustrates a method of receiving a broadcast signal in accordance with an embodiment of the present invention.

FIG. 44 illustrates a method of receiving a broadcast signal in accordance with an embodiment of the present invention.

DETAILED DESCRIPTION OF THE EMBODIMENTS

Reference will now be made in detail to the preferred embodiments of the present invention, examples of which are illustrated in the accompanying drawings. The detailed description, which will be given below with reference to the accompanying drawings, is intended to explain exemplary embodiments of the present invention, rather than to show the only embodiments that can be implemented according to the present invention. The following detailed description includes specific details in order to provide a thorough understanding of the present invention. However, it will be apparent to those skilled in the art that the present invention may be practiced without such specific details.

Although most terms used in the present invention have been selected from general ones widely used in the art, some terms have been arbitrarily selected by the applicant and their meanings are explained in detail in the following description as needed. Thus, the present invention should be understood based upon the intended meanings of the terms rather than their simple names or meanings. Also, the term block and module are used similarly to indicate logical/functional unit of particular signal/data processing.

The present invention provides apparatuses and methods for transmitting and receiving broadcast signals for future broadcast services. Future broadcast services according to an embodiment of the present invention include a terrestrial broadcast service, a mobile broadcast service, a UHDTV service, etc. The present invention may process broadcast signals for the future broadcast services through non-MIMO (Multiple Input Multiple Output) or MIMO according to one embodiment. A non-MIMO scheme according to an embodiment of the present invention may include a MISO (Multiple Input Single Output) scheme, a SISO (Single Input Single Output) scheme, etc.

While MISO or MIMO uses two antennas in the following for convenience of description, the present invention is applicable to systems using two or more antennas.

The present invention may defines three physical layer (PL) profiles—base, handheld and advanced profiles—each optimized to minimize receiver complexity while attaining the performance required for a particular use case. The physical layer (PHY) profiles are subsets of all configurations that a corresponding receiver should implement.

The three PHY profiles share most of the functional blocks but differ slightly in specific blocks and/or parameters. Additional PHY profiles can be defined in the future. For the system evolution, future profiles can also be multiplexed with the existing profiles in a single RF channel through a future extension frame (FEF). The details of each PHY profile are described below.

1. Base Profile

The base profile represents a main use case for fixed receiving devices that are usually connected to a roof-top antenna. The base profile also includes portable devices that could be transported to a place but belong to a relatively stationary reception category. Use of the base profile could be extended to handheld devices or even vehicular by some improved implementations, but those use cases are not expected for the base profile receiver operation.

Target SNR range of reception is from approximately 10 to 20 dB, which includes the 15 dB SNR reception capability of the existing broadcast system (e.g. ATSC A/53). The receiver complexity and power consumption is not as critical as in the battery-operated handheld devices, which will use the handheld profile. Key system parameters for the base profile are listed in below table 1.

TABLE 1

| | |
|---|---|
| LDPC codeword length | 16K, 64K bits |
| Constellation size | 4~10 bpcu (bits per channel use) |
| Time de-interleaving memory size | $\leq 2^{19}$ data cells |
| Pilot patterns | Pilot pattern for fixed reception |
| FFT size | 16K, 32K points |

2. Handheld Profile

The handheld profile is designed for use in handheld and vehicular devices that operate with battery power. The devices can be moving with pedestrian or vehicle speed. The power consumption as well as the receiver complexity is very important for the implementation of the devices of the handheld profile. The target SNR range of the handheld profile is approximately 0 to 10 dB, but can be configured to reach below 0 dB when intended for deeper indoor reception.

In addition to low SNR capability, resilience to the Doppler Effect caused by receiver mobility is the most important performance attribute of the handheld profile. Key system parameters for the handheld profile are listed in the below table 2.

TABLE 2

| | |
|---|---|
| LDPC codeword length | 16 Kbits |
| Constellation size | 2~8 bpcu |

TABLE 2-continued

| | |
|---|---|
| Time de-interleaving memory size | $\leq 2^{18}$ data cells |
| Pilot patterns | Pilot patterns for mobile and indoor reception |
| FFT size | 8K, 16K points |

3. Advanced Profile

The advanced profile provides highest channel capacity at the cost of more implementation complexity. This profile requires using MIMO transmission and reception, and UHDTV service is a target use case for which this profile is specifically designed. The increased capacity can also be used to allow an increased number of services in a given bandwidth, e.g., multiple SDTV or HDTV services.

The target SNR range of the advanced profile is approximately 20 to 30 dB. MIMO transmission may initially use existing elliptically-polarized transmission equipment, with extension to full-power cross-polarized transmission in the future. Key system parameters for the advanced profile are listed in below table 3.

TABLE 3

| | |
|---|---|
| LDPC codeword length | 16K, 64 Kbits |
| Constellation size | 8~12 bpcu |
| Time de-interleaving memory size | $\leq 2^{19}$ data cells |
| Pilot patterns | Pilot pattern for fixed reception |
| FFT size | 16K, 32K points |

In this case, the base profile can be used as a profile for both the terrestrial broadcast service and the mobile broadcast service. That is, the base profile can be used to define a concept of a profile which includes the mobile profile. Also, the advanced profile can be divided advanced profile for a base profile with MIMO and advanced profile for a handheld profile with MIMO. Moreover, the three profiles can be changed according to intention of the designer.

The following terms and definitions may apply to the present invention. The following terms and definitions can be changed according to design.

auxiliary stream: sequence of cells carrying data of as yet undefined modulation and coding, which may be used for future extensions or as required by broadcasters or network operators base data pipe: data pipe that carries service signaling data baseband frame (or BBFRAME): set of Kbch bits which form the input to one FEC encoding process (BCH and LDPC encoding)

cell: modulation value that is carried by one carrier of the OFDM transmission coded block: LDPC-encoded block of PLS1 data or one of the LDPC-encoded blocks of PLS2 data data pipe: logical channel in the physical layer that carries service data or related metadata, which may carry one or multiple service(s) or service component(s).

data pipe unit: a basic unit for allocating data cells to a DP in a frame.

data symbol: OFDM symbol in a frame which is not a preamble symbol (the frame signaling symbol and frame edge symbol is included in the data symbol)

DP_ID: this 8-bit field identifies uniquely a DP within the system identified by the SYSTEM_ID dummy cell: cell carrying a pseudo-random value used to fill the remaining capacity not used for PLS signaling, DPs or auxiliary streams emergency alert channel: part of a frame that carries EAS information data frame: physical layer time slot that starts with a preamble and ends with a frame edge symbol frame repetition unit: a set of frames belonging to same or different physical layer profile including a FEF, which is repeated eight times in a super-frame fast information channel: a logical channel in a frame that carries the mapping information between a service and the corresponding base DP FECBLOCK: set of LDPC-encoded bits of a DP data FFT size: nominal FFT size used for a particular mode, equal to the active symbol period Ts expressed in cycles of the elementary period T frame signaling symbol: OFDM symbol with higher pilot density used at the start of a frame in certain combinations of FFT size, guard interval and scattered pilot(sp) pattern, which carries a part of the PLS data frame edge symbol: OFDM symbol with higher pilot density used at the end of a frame in certain combinations of FFT size, guard interval and scattered pilot pattern frame-group: the set of all the frames having the same PHY profile type in a super-frame.

future extension frame: physical layer time slot within the super-frame that could be used for future extension, which starts with a preamble Futurecast UTB system: proposed physical layer broadcasting system, of which the input is one or more MPEG2-TS or IP or general stream(s) and of which the output is an RF signal input stream: A stream of data for an ensemble of services delivered to the end users by the system.

normal data symbol: data symbol excluding the frame signaling symbol and the frame edge symbol PHY profile: subset of all configurations that a corresponding receiver should implement PLS: physical layer signaling data consisting of PLS1 and PLS2

PLS1: a first set of PLS data carried in the FSS symbols having a fixed size, coding and modulation, which carries basic information about the system as well as the parameters needed to decode the PLS2

NOTE: PLS1 data remains constant for the duration of a frame-group.

PLS2: a second set of PLS data transmitted in the FSS symbol, which carries more detailed PLS data about the system and the DPs PLS2 dynamic data: PLS2 data that may dynamically change frame-by-frame PLS2 static data: PLS2 data that remains static for the duration of a frame-group preamble signaling data: signaling data carried by the preamble symbol and used to identify the basic mode of the system preamble symbol: fixed-length pilot symbol that carries basic PLS data and is located in the beginning of a frame NOTE: The preamble symbol is mainly used for fast initial band scan to detect the system signal, its timing, frequency offset, and FFT-size.

reserved for future use: not defined by the present document but may be defined in future super-frame: set of eight frame repetition units time interleaving block (TI block): set of cells within which time interleaving is carried out, corresponding to one use of the time interleaver memory TI group: unit over which dynamic capacity allocation for a particular DP is carried out, made up of an integer, dynamically varying number of XFECBLOCKs NOTE: The TI group may be mapped directly to one frame or may be mapped to multiple frames. It may contain one or more TI blocks.

Type 1 DP: DP of a frame where all DPs are mapped into the frame in TDM fashion

Type 2 DP: DP of a frame where all DPs are mapped into the frame in FDM fashion

XFECBLOCK: set of Ncells cells carrying all the bits of one LDPC FECBLOCK

FIG. 1 illustrates a structure of an apparatus for transmitting broadcast signals for future broadcast services according to an embodiment of the present invention.

The apparatus for transmitting broadcast signals for future broadcast services according to an embodiment of the present invention can include an input formatting block 1000, a BICM (Bit interleaved coding & modulation) block 1010, a frame structure block 1020, an OFDM (Orthogonal Frequency Division Multiplexing) generation block 1030 and a signaling generation block 1040. A description will be given of the operation of each module of the apparatus for transmitting broadcast signals.

IP stream/packets and MPEG2-TS are the main input formats, other stream types are handled as General Streams. In addition to these data inputs, Management Information is input to control the scheduling and allocation of the corresponding bandwidth for each input stream. One or multiple TS stream(s), IP stream(s) and/or General Stream(s) inputs are simultaneously allowed.

The input formatting block 1000 can demultiplex each input stream into one or multiple data pipe(s), to each of which an independent coding and modulation is applied. The data pipe (DP) is the basic unit for robustness control, thereby affecting quality-of-service (QoS). One or multiple service(s) or service component(s) can be carried by a single DP. Details of operations of the input formatting block 1000 will be described later.

The data pipe is a logical channel in the physical layer that carries service data or related metadata, which may carry one or multiple service(s) or service component(s).

Also, the data pipe unit: a basic unit for allocating data cells to a DP in a frame.

In the BICM block 1010, parity data is added for error correction and the encoded bit streams are mapped to complex-value constellation symbols. The symbols are interleaved across a specific interleaving depth that is used for the corresponding DP. For the advanced profile, MIMO encoding is performed in the BICM block 1010 and the additional data path is added at the output for MIMO transmission. Details of operations of the BICM block 1010 will be described later.

The Frame Building block 1020 can map the data cells of the input DPs into the OFDM symbols within a frame. After mapping, the frequency interleaving is used for frequency-domain diversity, especially to combat frequency-selective fading channels. Details of operations of the Frame Building block 1020 will be described later.

After inserting a preamble at the beginning of each frame, the OFDM Generation block 1030 can apply conventional OFDM modulation having a cyclic prefix as guard interval. For antenna space diversity, a distributed MISO scheme is applied across the transmitters. In addition, a Peak-to-Average Power Reduction (PAPR) scheme is performed in the time domain. For flexible network planning, this proposal provides a set of various FFT sizes, guard interval lengths and corresponding pilot patterns. Details of operations of the OFDM Generation block 1030 will be described later.

The Signaling Generation block 1040 can create physical layer signaling information used for the operation of each functional block. This signaling information is also transmitted so that the services of interest are properly recovered at the receiver side. Details of operations of the Signaling Generation block 1040 will be described later.

FIGS. 2, 3 and 4 illustrate the input formatting block 1000 according to embodiments of the present invention. A description will be given of each figure.

FIG. 2 illustrates an input formatting block according to one embodiment of the present invention. FIG. 2 shows an input formatting module when the input signal is a single input stream.

The input formatting block illustrated in FIG. 2 corresponds to an embodiment of the input formatting block 1000 described with reference to FIG. 1.

The input to the physical layer may be composed of one or multiple data streams. Each data stream is carried by one DP. The mode adaptation modules slice the incoming data stream into data fields of the baseband frame (BBF). The system supports three types of input data streams: MPEG2-TS, Internet protocol (IP) and Generic stream (GS). MPEG2-TS is characterized by fixed length (188 byte) packets with the first byte being a sync-byte (0x47). An IP stream is composed of variable length IP datagram packets, as signaled within IP packet headers. The system supports both IPv4 and IPv6 for the IP stream. GS may be composed of variable length packets or constant length packets, signaled within encapsulation packet headers.

(a) shows a mode adaptation block 2000 and a stream adaptation 2010 for signal DP and (b) shows a PLS generation block 2020 and a PLS scrambler 2030 for generating and processing PLS data. A description will be given of the operation of each block.

The Input Stream Splitter splits the input TS, IP, GS streams into multiple service or service component (audio, video, etc.) streams. The mode adaptation module 2010 is comprised of a CRC Encoder, BB (baseband) Frame Slicer, and BB Frame Header Insertion block.

The CRC Encoder provides three kinds of CRC encoding for error detection at the user packet (UP) level, i.e., CRC-8, CRC-16, and CRC-32. The computed CRC bytes are appended after the UP. CRC-8 is used for TS stream and CRC-32 for IP stream. If the GS stream doesn't provide the CRC encoding, the proposed CRC encoding should be applied.

BB Frame Slicer maps the input into an internal logical-bit format. The first received bit is defined to be the MSB. The BB Frame Slicer allocates a number of input bits equal to the available data field capacity. To allocate a number of input bits equal to the BBF payload, the UP packet stream is sliced to fit the data field of BBF.

BB Frame Header Insertion block can insert fixed length BBF header of 2 bytes is inserted in front of the BB Frame. The BBF header is composed of STUFFI (1 bit), SYNCD (13 bits), and RFU (2 bits). In addition to the fixed 2-Byte BBF header, BBF can have an extension field (1 or 3 bytes) at the end of the 2-byte BBF header.

The stream adaptation 2010 is comprised of stuffing insertion block and BB scrambler.

The stuffing insertion block can insert stuffing field into a payload of a BB frame. If the input data to the stream adaptation is sufficient to fill a BB-Frame, STUFFI is set to '0' and the BBF has no stuffing field. Otherwise STUFFI is set to '1' and the stuffing field is inserted immediately after the BBF header. The stuffing field comprises two bytes of the stuffing field header and a variable size of stuffing data.

The BB scrambler scrambles complete BBF for energy dispersal. The scrambling sequence is synchronous with the BBF. The scrambling sequence is generated by the feedback shift register.

The PLS generation block 2020 can generate physical layer signaling (PLS) data. The PLS provides the receiver with a means to access physical layer DPs. The PLS data consists of PLS1 data and PLS2 data.

The PLS1 data is a first set of PLS data carried in the FSS symbols in the frame having a fixed size, coding and modulation, which carries basic information about the system as well as the parameters needed to decode the PLS2 data. The PLS1 data provides basic transmission parameters including parameters required to enable the reception and decoding of the PLS2 data. Also, the PLS1 data remains constant for the duration of a frame-group.

The PLS2 data is a second set of PLS data transmitted in the FSS symbol, which carries more detailed PLS data about the system and the DPs. The PLS2 contains parameters that provide sufficient information for the receiver to decode the desired DP. The PLS2 signaling further consists of two types of parameters, PLS2 Static data (PLS2-STAT data) and PLS2 dynamic data (PLS2-DYN data). The PLS2 Static data is PLS2 data that remains static for the duration of a frame-group and the PLS2 dynamic data is PLS2 data that may dynamically change frame-by-frame.

Details of the PLS data will be described later.

The PLS scrambler 2030 can scramble the generated PLS data for energy dispersal.

The above-described blocks may be omitted or replaced by blocks having similar or identical functions.

FIG. 3 illustrates an input formatting block according to another embodiment of the present invention.

The input formatting block illustrated in FIG. 3 corresponds to an embodiment of the input formatting block 1000 described with reference to FIG. 1.

FIG. 3 shows a mode adaptation block of the input formatting block when the input signal corresponds to multiple input streams.

The mode adaptation block of the input formatting block for processing the multiple input streams can independently process the multiple input streams.

Referring to FIG. 3, the mode adaptation block for respectively processing the multiple input streams can include an input stream splitter 3000, an input stream synchronizer 3010, a compensating delay block 3020, a null packet deletion block 3030, a head compression block 3040, a CRC encoder 3050, a BB frame slicer 3060 and a BB header insertion block 3070. Description will be given of each block of the mode adaptation block.

Operations of the CRC encoder 3050, BB frame slicer 3060 and BB header insertion block 3070 correspond to those of the CRC encoder, BB frame slicer and BB header insertion block described with reference to FIG. 2 and thus description thereof is omitted.

The input stream splitter 3000 can split the input TS, IP, GS streams into multiple service or service component (audio, video, etc.) streams.

The input stream synchronizer 3010 may be referred as ISSY. The ISSY can provide suitable means to guarantee Constant Bit Rate (CBR) and constant end-to-end transmission delay for any input data format. The ISSY is always used for the case of multiple DPs carrying TS, and optionally used for multiple DPs carrying GS streams.

The compensating delay block 3020 can delay the split TS packet stream following the insertion of ISSY information to allow a TS packet recombining mechanism without requiring additional memory in the receiver.

The null packet deletion block 3030, is used only for the TS input stream case. Some TS input streams or split TS streams may have a large number of null-packets present in order to accommodate VBR (variable bit-rate) services in a CBR TS stream. In this case, in order to avoid unnecessary transmission overhead, null-packets can be identified and not transmitted. In the receiver, removed null-packets can be re-inserted in the exact place where they were originally by reference to a deleted null-packet (DNP) counter that is inserted in the transmission, thus guaranteeing constant bit-rate and avoiding the need for time-stamp (PCR) updating.

The head compression block 3040 can provide packet header compression to increase transmission efficiency for TS or IP input streams. Because the receiver can have a priori information on certain parts of the header, this known information can be deleted in the transmitter.

For Transport Stream, the receiver has a-priori information about the sync-byte configuration (0x47) and the packet length (188 Byte). If the input TS stream carries content that has only one PID, i.e., for only one service component (video, audio, etc.) or service sub-component (SVC base layer, SVC enhancement layer, MVC base view or MVC dependent views), TS packet header compression can be applied (optionally) to the Transport Stream. IP packet header compression is used optionally if the input steam is an IP stream.

The above-described blocks may be omitted or replaced by blocks having similar or identical functions.

FIG. 4 illustrates an input formatting block according to another embodiment of the present invention.

The input formatting block illustrated in FIG. 4 corresponds to an embodiment of the input formatting block 1000 described with reference to FIG. 1.

FIG. 4 illustrates a stream adaptation block of the input formatting module when the input signal corresponds to multiple input streams.

Referring to FIG. 4, the mode adaptation block for respectively processing the multiple input streams can include a scheduler 4000, an 1-Frame delay block 4010, a stuffing insertion block 4020, an in-band signaling 4030, a BB Frame scrambler 4040, a PLS generation block 4050 and a PLS scrambler 4060. Description will be given of each block of the stream adaptation block.

Operations of the stuffing insertion block 4020, the BB Frame scrambler 4040, the PLS generation block 4050 and the PLS scrambler 4060 correspond to those of the stuffing insertion block, BB scrambler, PLS generation block and the PLS scrambler described with reference to FIG. 2 and thus description thereof is omitted.

The scheduler 4000 can determine the overall cell allocation across the entire frame from the amount of FECBLOCKs of each DP. Including the allocation for PLS, EAC and FIC, the scheduler generate the values of PLS2-DYN data, which is transmitted as in-band signaling or PLS cell in FSS of the frame. Details of FECBLOCK, EAC and FIC will be described later.

The 1-Frame delay block 4010 can delay the input data by one transmission frame such that scheduling information about the next frame can be transmitted through the current frame for in-band signaling information to be inserted into the DPs.

The in-band signaling 4030 can insert un-delayed part of the PLS2 data into a DP of a frame.

The above-described blocks may be omitted or replaced by blocks having similar or identical functions.

FIG. 5 illustrates a BICM block according to an embodiment of the present invention.

The BICM block illustrated in FIG. 5 corresponds to an embodiment of the BICM block 1010 described with reference to FIG. 1.

As described above, the apparatus for transmitting broadcast signals for future broadcast services according to an embodiment of the present invention can provide a terrestrial broadcast service, mobile broadcast service, UHDTV service, etc.

Since QoS (quality of service) depends on characteristics of a service provided by the apparatus for transmitting broadcast signals for future broadcast services according to an embodiment of the present invention, data corresponding to respective services needs to be processed through different schemes. Accordingly, the a BICM block according to an embodiment of the present invention can independently process DPs input thereto by independently applying SISO, MISO and MIMO schemes to the data pipes respectively corresponding to data paths. Consequently, the apparatus for transmitting broadcast signals for future broadcast services according to an embodiment of the present invention can control QoS for each service or service component transmitted through each DP.

(a) shows the BICM block shared by the base profile and the handheld profile and (b) shows the BICM block of the advanced profile.

The BICM block shared by the base profile and the handheld profile and the BICM block of the advanced profile can include plural processing blocks for processing each DP.

A description will be given of each processing block of the BICM block for the base profile and the handheld profile and the BICM block for the advanced profile.

A processing block 5000 of the BICM block for the base profile and the handheld profile can include a Data FEC encoder 5010, a bit interleaver 5020, a constellation mapper 5030, an SSD (Signal Space Diversity) encoding block 5040 and a time interleaver 5050.

The Data FEC encoder 5010 can perform the FEC encoding on the input BBF to generate FECBLOCK procedure using outer coding (BCH), and inner coding (LDPC). The outer coding (BCH) is optional coding method. Details of operations of the Data FEC encoder 5010 will be described later.

The bit interleaver 5020 can interleave outputs of the Data FEC encoder 5010 to achieve optimized performance with combination of the LDPC codes and modulation scheme while providing an efficiently implementable structure. Details of operations of the bit interleaver 5020 will be described later.

The constellation mapper 5030 can modulate each cell word from the bit interleaver 5020 in the base and the handheld profiles, or cell word from the Cell-word demultiplexer 5010-1 in the advanced profile using either QPSK, QAM-16, non-uniform QAM (NUQ-64, NUQ-256, NUQ-1024) or non-uniform constellation (NUC-16, NUC-64, NUC-256, NUC-1024) to give a power-normalized constellation point, el. This constellation mapping is applied only for DPs. Observe that QAM-16 and NUQs are square shaped, while NUCs have arbitrary shape. When each constellation is rotated by any multiple of 90 degrees, the rotated constellation exactly overlaps with its original one. This "rotation-sense" symmetric property makes the capacities and the average powers of the real and imaginary components equal to each other. Both NUQs and NUCs are defined specifically for each code rate and the particular one used is signaled by the parameter DP_MOD filed in PLS2 data.

The SSD encoding block 5040 can precode cells in two (2D), three (3D), and four (4D) dimensions to increase the reception robustness under difficult fading conditions.

The time interleaver 5050 can operates at the DP level. The parameters of time interleaving (TI) may be set differently for each DP. Details of operations of the time interleaver 5050 will be described later.

A processing block 5000-1 of the BICM block for the advanced profile can include the Data FEC encoder, bit interleaver, constellation mapper, and time interleaver. However, the processing block 5000-1 is distinguished from the processing block 5000 further includes a cell-word demultiplexer 5010-1 and a MIMO encoding block 5020-1.

Also, the operations of the Data FEC encoder, bit interleaver, constellation mapper, and time interleaver in the processing block 5000-1 correspond to those of the Data FEC encoder 5010, bit interleaver 5020, constellation mapper 5030, and time interleaver 5050 described and thus description thereof is omitted.

The cell-word demultiplexer 5010-1 is used for the DP of the advanced profile to divide the single cell-word stream into dual cell-word streams for MIMO processing. Details of operations of the cell-word demultiplexer 5010-1 will be described later.

The MIMO encoding block 5020-1 can processing the output of the cell-word demultiplexer 5010-1 using MIMO encoding scheme. The MIMO encoding scheme was optimized for broadcasting signal transmission. The MIMO technology is a promising way to get a capacity increase but it depends on channel characteristics. Especially for broadcasting, the strong LOS component of the channel or a difference in the received signal power between two antennas caused by different signal propagation characteristics makes it difficult to get capacity gain from MIMO. The proposed MIMO encoding scheme overcomes this problem using a rotation-based pre-coding and phase randomization of one of the MIMO output signals.

MIMO encoding is intended for a 2×2 MIMO system requiring at least two antennas at both the transmitter and the receiver. Two MIMO encoding modes are defined in this proposal; full-rate spatial multiplexing (FR-SM) and full-rate full-diversity spatial multiplexing (FRFD-SM). The FR-SM encoding provides capacity increase with relatively small complexity increase at the receiver side while the FRFD-SM encoding provides capacity increase and additional diversity gain with a great complexity increase at the receiver side. The proposed MIMO encoding scheme has no restriction on the antenna polarity configuration.

MIMO processing is required for the advanced profile frame, which means all DPs in the advanced profile frame are processed by the MIMO encoder. MIMO processing is applied at DP level. Pairs of the Constellation Mapper outputs NUQ (e1,i and e2,i) are fed to the input of the MIMO Encoder. Paired MIMO Encoder output (g1,i and g2,i) is transmitted by the same carrier k and OFDM symbol 1 of their respective TX antennas.

The above-described blocks may be omitted or replaced by blocks having similar or identical functions.

FIG. 6 illustrates a BICM block according to another embodiment of the present invention.

The BICM block illustrated in FIG. 6 corresponds to an embodiment of the BICM block 1010 described with reference to FIG. 1.

FIG. 6 illustrates a BICM block for protection of physical layer signaling (PLS), emergency alert channel (EAC) and fast information channel (FIC). EAC is a part of a frame that carries EAS information data and FIC is a logical channel in a frame that carries the mapping information between a service and the corresponding base DP. Details of the EAC and FIC will be described later.

Referring to FIG. 6, the BICM block for protection of PLS, EAC and FIC can include a PLS FEC encoder 6000, a bit interleaver 6010, a constellation mapper 6020 and time interleaver 6030.

Also, the PLS FEC encoder 6000 can include a scrambler, BCH encoding/zero insertion block, LDPC encoding block and LDPC parity puncturing block. Description will be given of each block of the BICM block.

The PLS FEC encoder 6000 can encode the scrambled PLS 1/2 data, EAC and FIC section.

The scrambler can scramble PLS1 data and PLS2 data before BCH encoding and shortened and punctured LDPC encoding.

The BCH encoding/zero insertion block can perform outer encoding on the scrambled PLS 1/2 data using the shortened BCH code for PLS protection and insert zero bits after the BCH encoding. For PLS1 data only, the output bits of the zero insertion may be permutted before LDPC encoding.

The LDPC encoding block can encode the output of the BCH encoding/zero insertion block using LDPC code. To generate a complete coded block, Cldpc, parity bits, Pldpc are encoded systematically from each zero-inserted PLS information block, Ildpc and appended after it.

$$C_{ldpc} = [I_{ldpc} P_{ldpc}] = [i_0, i_1, \ldots, i_{K_{ldpc}-1}, p_0, p_1, \ldots, p_{N_{ldpc}-K_{ldpc}-1}] \quad \text{[Equation 1]}$$

The LDPC code parameters for PLS1 and PLS2 are as following table 4.

TABLE 4

| Signaling Type | Ksig | Kbch | Nbch_parity | Kldpc (=Nbch) | Nldpc | Nldpc_parity | code rate | Qldpc |
|---|---|---|---|---|---|---|---|---|
| PLS1 | 342 | 1020 | 60 | 1080 | 4320 | 3240 | 1/4 | 36 |
| PLS2 | <1021 | | | | | | | |
| | >1020 | 2100 | | 2160 | 7200 | 5040 | 3/10 | 56 |

The LDPC parity puncturing block can perform puncturing on the PLS1 data and PLS 2 data.

When shortening is applied to the PLS1 data protection, some LDPC parity bits are punctured after LDPC encoding. Also, for the PLS2 data protection, the LDPC parity bits of PLS2 are punctured after LDPC encoding. These punctured bits are not transmitted.

The bit interleaver 6010 can interleave the each shortened and punctured PLS1 data and PLS2 data.

The constellation mapper 6020 can map the bit interleaved PLS1 data and PLS2 data onto constellations.

The time interleaver 6030 can interleave the mapped PLS1 data and PLS2 data.

The above-described blocks may be omitted or replaced by blocks having similar or identical functions.

FIG. 7 illustrates a frame building block according to one embodiment of the present invention.

The frame building block illustrated in FIG. 7 corresponds to an embodiment of the frame building block 1020 described with reference to FIG. 1.

Referring to FIG. 7, the frame building block can include a delay compensation block 7000, a cell mapper 7010 and a frequency interleaver 7020. Description will be given of each block of the frame building block.

The delay compensation block 7000 can adjust the timing between the data pipes and the corresponding PLS data to ensure that they are co-timed at the transmitter end. The PLS data is delayed by the same amount as data pipes are by addressing the delays of data pipes caused by the Input Formatting block and BICM block. The delay of the BICM block is mainly due to the time interleaver 5050. In-band signaling data carries information of the next TI group so that they are carried one frame ahead of the DPs to be signaled. The Delay Compensating block delays in-band signaling data accordingly.

The cell mapper 7010 can map PLS, EAC, FIC, DPs, auxiliary streams and dummy cells into the active carriers of the OFDM symbols in the frame. The basic function of the cell mapper 7010 is to map data cells produced by the TIs for each of the DPs, PLS cells, and EAC/FIC cells, if any, into arrays of active OFDM cells corresponding to each of the OFDM symbols within a frame. Service signaling data (such as PSI (program specific information)/SI) can be separately gathered and sent by a data pipe. The Cell Mapper operates according to the dynamic information produced by the scheduler and the configuration of the frame structure. Details of the frame will be described later.

The frequency interleaver 7020 can randomly interleave data cells received from the cell mapper 7010 to provide frequency diversity. Also, the frequency interleaver 7020 can operate on very OFDM symbol pair comprised of two sequential OFDM symbols using a different interleaving-seed order to get maximum interleaving gain in a single frame. Details of operations of the frequency interleaver 7020 will be described later.

The above-described blocks may be omitted or replaced by blocks having similar or identical functions.

FIG. 8 illustrates an OFMD generation block according to an embodiment of the present invention.

The OFMD generation block illustrated in FIG. 8 corresponds to an embodiment of the OFMD generation block 1030 described with reference to FIG. 1.

The OFDM generation block modulates the OFDM carriers by the cells produced by the Frame Building block, inserts the pilots, and produces the time domain signal for transmission. Also, this block subsequently inserts guard intervals, and applies PAPR (Peak-to-Average Power Radio) reduction processing to produce the final RF signal.

Referring to FIG. 8, the frame building block can include a pilot and reserved tone insertion block 8000, a 2D-eSFN encoding block 8010, an IFFT (Inverse Fast Fourier Transform) block 8020, a PAPR reduction block 8030, a guard interval insertion block 8040, a preamble insertion block 8050, other system insertion block 8060 and a DAC block 8070. Description will be given of each block of the frame building block.

The pilot and reserved tone insertion block 8000 can insert pilots and the reserved tone.

Various cells within the OFDM symbol are modulated with reference information, known as pilots, which have transmitted values known a priori in the receiver. The information of pilot cells is made up of scattered pilots (SP), continual pilots (CP), edge pilots (EP), FSS (frame signaling symbol) pilots and FES (frame edge symbol) pilots. Each pilot is transmitted at a particular boosted power level according to pilot type and pilot pattern. The value of the pilot information is derived from a reference sequence, which is a series of values, one for each transmitted carrier on any given symbol. The pilots can be used for frame synchronization, frequency synchronization, time synchronization, channel estimation, and transmission mode identification, and also can be used to follow the phase noise.

Reference information, taken from the reference sequence, is transmitted in scattered pilot cells in every symbol except the preamble, FSS and FES of the frame. Continual pilots are inserted in every symbol of the frame. The number and location of continual pilots depends on both the FFT size and the scattered pilot pattern. The edge carriers are edge pilots in every symbol except for the preamble symbol. They are inserted in order to allow frequency interpolation up to the edge of the spectrum. FSS pilots are inserted in FSS(s) and FES pilots are inserted in FES. They are inserted in order to allow time interpolation up to the edge of the frame.

The system according to an embodiment of the present invention supports the SFN network, where distributed MISO scheme is optionally used to support very robust transmission mode. The 2D-eSFN is a distributed MISO scheme that uses multiple TX antennas, each of which is located in the different transmitter site in the SFN network.

The 2D-eSFN encoding block 8010 can process a 2D-eSFN processing to distorts the phase of the signals transmitted from multiple transmitters, in order to create both time and frequency diversity in the SFN configuration. Hence, burst errors due to low flat fading or deep-fading for a long time can be mitigated.

The IFFT block 8020 can modulate the output from the 2D-eSFN encoding block 8010 using OFDM modulation scheme. Any cell in the data symbols which has not been designated as a pilot (or as a reserved tone) carries one of the data cells from the frequency interleaver. The cells are mapped to OFDM carriers.

The PAPR reduction block 8030 can perform a PAPR reduction on input signal using various PAPR reduction algorithm in the time domain.

The guard interval insertion block 8040 can insert guard intervals and the preamble insertion block 8050 can insert preamble in front of the signal. Details of a structure of the preamble will be described later. The other system insertion block 8060 can multiplex signals of a plurality of broadcast transmission/reception systems in the time domain such that data of two or more different broadcast transmission/reception systems providing broadcast services can be simultaneously transmitted in the same RF signal bandwidth. In this case, the two or more different broadcast transmission/reception systems refer to systems providing different broadcast services. The different broadcast services may refer to a terrestrial broadcast service, mobile broadcast service, etc. Data related to respective broadcast services can be transmitted through different frames.

The DAC block 8070 can convert an input digital signal into an analog signal and output the analog signal. The signal output from the DAC block 7800 can be transmitted through multiple output antennas according to the physical layer profiles. A Tx antenna according to an embodiment of the present invention can have vertical or horizontal polarity.

The above-described blocks may be omitted or replaced by blocks having similar or identical functions according to design.

FIG. 9 illustrates a structure of an apparatus for receiving broadcast signals for future broadcast services according to an embodiment of the present invention.

The apparatus for receiving broadcast signals for future broadcast services according to an embodiment of the present invention can correspond to the apparatus for transmitting broadcast signals for future broadcast services, described with reference to FIG. 1.

The apparatus for receiving broadcast signals for future broadcast services according to an embodiment of the present invention can include a synchronization & demodulation module 9000, a frame parsing module 9010, a demapping & decoding module 9020, an output processor 9030 and a signaling decoding module 9040. A description will be given of operation of each module of the apparatus for receiving broadcast signals.

The synchronization & demodulation module 9000 can receive input signals through m Rx antennas, perform signal detection and synchronization with respect to a system corresponding to the apparatus for receiving broadcast signals and carry out demodulation corresponding to a reverse procedure of the procedure performed by the apparatus for transmitting broadcast signals.

The frame parsing module 9010 can parse input signal frames and extract data through which a service selected by a user is transmitted. If the apparatus for transmitting broadcast signals performs interleaving, the frame parsing module 9010 can carry out deinterleaving corresponding to a reverse procedure of interleaving. In this case, the positions of a signal and data that need to be extracted can be obtained by decoding data output from the signaling decoding module 9400 to restore scheduling information generated by the apparatus for transmitting broadcast signals.

The demapping & decoding module 9020 can convert the input signals into bit domain data and then deinterleave the same as necessary. The demapping & decoding module 9200 can perform demapping for mapping applied for transmission efficiency and correct an error generated on a transmission channel through decoding. In this case, the demapping & decoding module 9020 can obtain transmission parameters necessary for demapping and decoding by decoding the data output from the signaling decoding module 9040.

The output processor 9030 can perform reverse procedures of various compression/signal processing procedures which are applied by the apparatus for transmitting broadcast signals to improve transmission efficiency. In this case, the output processor 9030 can acquire necessary control information from data output from the signaling decoding module 9040. The output of the output processor 9030 corresponds to a signal input to the apparatus for transmitting broadcast signals and may be MPEG-TSs, IP streams (v4 or v6) and generic streams.

The signaling decoding module 9040 can obtain PLS information from the signal demodulated by the synchronization & demodulation module 9000. As described above, the frame parsing module 9010, demapping & decoding module 9020 and output processor 9030 can execute functions thereof using the data output from the signaling decoding module 9040.

FIG. 10 illustrates a frame structure according to an embodiment of the present invention.

FIG. 10 shows an example configuration of the frame types and FRUs in a super-frame. (a) shows a super frame according to an embodiment of the present invention, (b) shows FRU (Frame Repetition Unit) according to an embodiment of the present invention, (c) shows frames of variable PHY profiles in the FRU and (d) shows a structure of a frame.

A super-frame may be composed of eight FRUs. The FRU is a basic multiplexing unit for TDM of the frames, and is repeated eight times in a super-frame.

Each frame in the FRU belongs to one of the PHY profiles, (base, handheld, advanced) or FEF. The maximum allowed number of the frames in the FRU is four and a given PHY profile can appear any number of times from zero times to four times in the FRU (e.g., base, base, handheld, advanced). PHY profile definitions can be extended using reserved values of the PHY_PROFILE in the preamble, if required.

The FEF part is inserted at the end of the FRU, if included. When the FEF is included in the FRU, the minimum number of FEFs is 8 in a super-frame. It is not recommended that FEF parts be adjacent to each other.

One frame is further divided into a number of OFDM symbols and a preamble. As shown in (d), the frame comprises a preamble, one or more frame signaling symbols (FSS), normal data symbols and a frame edge symbol (FES).

The preamble is a special symbol that enables fast Futurecast UTB system signal detection and provides a set of basic transmission parameters for efficient transmission and reception of the signal. The detailed description of the preamble will be will be described later.

The main purpose of the FSS(s) is to carry the PLS data. For fast synchronization and channel estimation, and hence fast decoding of PLS data, the FSS has more dense pilot pattern than the normal data symbol. The FES has exactly the same pilots as the FSS, which enables frequency-only interpolation within the FES and temporal interpolation, without extrapolation, for symbols immediately preceding the FES.

FIG. 11 illustrates a signaling hierarchy structure of the frame according to an embodiment of the present invention.

FIG. 11 illustrates the signaling hierarchy structure, which is split into three main parts: the preamble signaling data 11000, the PLS1 data 11010 and the PLS2 data 11020. The purpose of the preamble, which is carried by the preamble symbol in every frame, is to indicate the transmission type and basic transmission parameters of that frame. The PLS1 enables the receiver to access and decode the PLS2 data, which contains the parameters to access the DP of interest. The PLS2 is carried in every frame and split into two main parts: PLS2-STAT data and PLS2-DYN data. The static and dynamic portion of PLS2 data is followed by padding, if necessary.

FIG. 12 illustrates preamble signaling data according to an embodiment of the present invention.

Preamble signaling data carries 21 bits of information that are needed to enable the receiver to access PLS data and trace DPs within the frame structure. Details of the preamble signaling data are as follows:

PHY_PROFILE: This 3-bit field indicates the PHY profile type of the current frame. The mapping of different PHY profile types is given in below table 5.

TABLE 5

| Value | PHY profile |
|---|---|
| 000 | Base profile |
| 001 | Handheld profile |
| 010 | Advanced profiled |
| 011~110 | Reserved |
| 111 | FEF |

FFT_SIZE: This 2 bit field indicates the FFT size of the current frame within a frame-group, as described in below table 6.

TABLE 6

| Value | FFT size |
|---|---|
| 00 | 8K FFT |
| 01 | 16K FFT |
| 10 | 32K FFT |
| 11 | Reserved |

GI_FRACTION: This 3 bit field indicates the guard interval fraction value in the current super-frame, as described in below table 7.

TABLE 7

| Value | GI_FRACTION |
|---|---|
| 000 | 1/5 |
| 001 | 1/10 |
| 010 | 1/20 |
| 011 | 1/40 |
| 100 | 1/80 |
| 101 | 1/160 |
| 110~111 | Reserved |

EAC_FLAG: This 1 bit field indicates whether the EAC is provided in the current frame. If this field is set to '1', emergency alert service (EAS) is provided in the current frame. If this field set to '0', EAS is not carried in the current frame. This field can be switched dynamically within a super-frame.

PILOT_MODE: This 1-bit field indicates whether the pilot mode is mobile mode or fixed mode for the current frame in the current frame-group. If this field is set to '0', mobile pilot mode is used. If the field is set to '1', the fixed pilot mode is used.

PAPR_FLAG: This 1-bit field indicates whether PAPR reduction is used for the current frame in the current frame-group. If this field is set to value '1', tone reservation is used for PAPR reduction. If this field is set to '0', PAPR reduction is not used.

FRU_CONFIGURE: This 3-bit field indicates the PHY profile type configurations of the frame repetition units (FRU) that are present in the current super-frame. All profile types conveyed in the current super-frame are identified in this field in all preambles in the current super-frame. The 3-bit field has a different definition for each profile, as show in below table 8.

TABLE 8

| | Current PHY_PROFILE = '000' (base) | Current PHY_PROFILE = '001' (handheld) | Current PHY_PROFILE = '010' (advanced) | Current PHY_PROFILE = '111' (FEF) |
|---|---|---|---|---|
| FRU_CONFIGURE = 000 | Only base profile present | Only handheld profile present | Only advanced profile present | Only FEF present |
| FRU_CONFIGURE = 1XX | Handheld profile present | Base profile present | Base profile present | Base profile present |
| FRU_CONFIGURE = X1X | Advanced profile present | Advanced profile present | Handheld profile present | Handheld profile present |
| FRU_CONFIGURE = XX1 | FEF present | FEF present | FEF present | Advanced profile present |

RESERVED: This 7-bit field is reserved for future use.

FIG. 13 illustrates PLS1 data according to an embodiment of the present invention.

PLS1 data provides basic transmission parameters including parameters required to enable the reception and decoding of the PLS2. As above mentioned, the PLS1 data remain unchanged for the entire duration of one frame-group. The detailed definition of the signaling fields of the PLS1 data are as follows:

PREAMBLE_DATA: This 20-bit field is a copy of the preamble signaling data excluding the EAC_FLAG.

NUM_FRAME_FRU: This 2-bit field indicates the number of the frames per FRU.

PAYLOAD_TYPE: This 3-bit field indicates the format of the payload data carried in the frame-group. PAYLOAD_TYPE is signaled as shown in table 9.

TABLE 9

| Value | Payload type |
|---|---|
| 1XX | TS stream is transmitted |
| X1X | IP stream is transmitted |
| XX1 | GS stream is transmitted |

NUM_FSS: This 2-bit field indicates the number of FSS symbols in the current frame.

SYSTEM_VERSION: This 8-bit field indicates the version of the transmitted signal format. The SYSTEM_VERSION is divided into two 4-bit fields, which are a major version and a minor version.

Major version: The MSB four bits of SYSTEM_VERSION field indicate major version information. A change in the major version field indicates a non-backward-compatible change. The default value is '0000'. For the version described in this standard, the value is set to '0000'.

Minor version: The LSB four bits of SYSTEM_VERSION field indicate minor version information. A change in the minor version field is backward-compatible.

CELL_ID: This is a 16-bit field which uniquely identifies a geographic cell in an ATSC network. An ATSC cell coverage area may consist of one or more frequencies, depending on the number of frequencies used per Futurecast UTB system. If the value of the CELL_ID is not known or unspecified, this field is set to '0'.

NETWORK_ID: This is a 16-bit field which uniquely identifies the current ATSC network.

SYSTEM_ID: This 16-bit field uniquely identifies the Futurecast UTB system within the ATSC network. The Futurecast UTB system is the terrestrial broadcast system whose input is one or more input streams (TS, IP, GS) and whose output is an RF signal. The Futurecast UTB system carries one or more PHY profiles and FEF, if any. The same Futurecast UTB system may carry different input streams and use different RF frequencies in different geographical areas, allowing local service insertion. The frame structure and scheduling is controlled in one place and is identical for all transmissions within a Futurecast UTB system. One or more Futurecast UTB systems may have the same SYSTEM_ID meaning that they all have the same physical layer structure and configuration.

The following loop consists of FRU_PHY_PROFILE, FRU_FRAME_LENGTH, FRU_GI_FRACTION, and RESERVED which are used to indicate the FRU configuration and the length of each frame type. The loop size is fixed so that four PHY profiles (including a FEF) are signaled within the FRU. If NUM_FRAME_FRU is less than 4, the unused fields are filled with zeros.

FRU_PHY_PROFILE: This 3-bit field indicates the PHY profile type of the (i+1)th (i is the loop index) frame of the associated FRU. This field uses the same signaling format as shown in the table 8.

FRU_FRAME_LENGTH: This 2-bit field indicates the length of the (i+1)th frame of the associated FRU. Using FRU_FRAME_LENGTH together with FRU_GI_FRACTION, the exact value of the frame duration can be obtained.

FRU_GI_FRACTION: This 3-bit field indicates the guard interval fraction value of the (i+1)th frame of the associated FRU. FRU_GI_FRACTION is signaled according to the table 7.

RESERVED: This 4-bit field is reserved for future use.

The following fields provide parameters for decoding the PLS2 data.

PLS2_FEC_TYPE: This 2-bit field indicates the FEC type used by the PLS2 protection. The FEC type is signaled according to table 10. The details of the LDPC codes will be described later.

TABLE 10

| Contents | PLS2 FEC type |
| --- | --- |
| 00 | 4K-1/4 and 7K-3/10 LDPC codes |
| 01~11 | Reserved |

PLS2_MOD: This 3-bit field indicates the modulation type used by the PLS2. The modulation type is signaled according to table 11.

TABLE 11

| Value | PLS2_MODE |
| --- | --- |
| 000 | BPSK |
| 001 | QPSK |
| 010 | QAM-16 |
| 011 | NUQ-64 |
| 100~111 | Reserved |

PLS2_SIZE_CELL: This 15-bit field indicates Ctotal_partial_block, the size (specified as the number of QAM cells) of the collection of full coded blocks for PLS2 that is carried in the current frame-group. This value is constant during the entire duration of the current frame-group.

PLS2_STAT_SIZE_BIT: This 14-bit field indicates the size, in bits, of the PLS2-STAT for the current frame-group. This value is constant during the entire duration of the current frame-group.

PLS2_DYN_SIZE_BIT: This 14-bit field indicates the size, in bits, of the PLS2-DYN for the current frame-group. This value is constant during the entire duration of the current frame-group.

PLS2_REP_FLAG: This 1-bit flag indicates whether the PLS2 repetition mode is used in the current frame-group. When this field is set to value '1', the PLS2 repetition mode is activated. When this field is set to value '0', the PLS2 repetition mode is deactivated.

PLS2_REP_SIZE_CELL: This 15-bit field indicates Ctotal_partial_block, the size (specified as the number of QAM cells) of the collection of partial coded blocks for PLS2 carried in every frame of the current frame-group, when PLS2 repetition is used. If repetition is not used, the value of this field is equal to 0. This value is constant during the entire duration of the current frame-group.

PLS2_NEXT_FEC_TYPE: This 2-bit field indicates the FEC type used for PLS2 that is carried in every frame of the next frame-group. The FEC type is signaled according to the table 10.

PLS2_NEXT_MOD: This 3-bit field indicates the modulation type used for PLS2 that is carried in every frame of the next frame-group. The modulation type is signaled according to the table 11.

PLS2_NEXT_REP_FLAG: This 1-bit flag indicates whether the PLS2 repetition mode is used in the next frame-group. When this field is set to value '1', the PLS2 repetition mode is activated. When this field is set to value '0', the PLS2 repetition mode is deactivated.

PLS2_NEXT_REP_SIZE_CELL: This 15-bit field indicates Ctotal_full_block, The size (specified as the number of QAM cells) of the collection of full coded blocks for PLS2 that is carried in every frame of the next frame-group, when PLS2 repetition is used. If repetition is not used in the next frame-group, the value of this field is equal to 0. This value is constant during the entire duration of the current frame-group.

PLS2_NEXT_REP_STAT_SIZE_BIT: This 14-bit field indicates the size, in bits, of the PLS2-STAT for the next frame-group. This value is constant in the current frame-group.

PLS2_NEXT_REP_DYN_SIZE_BIT: This 14-bit field indicates the size, in bits, of the PLS2-DYN for the next frame-group. This value is constant in the current frame-group.

PLS2_AP_MODE: This 2-bit field indicates whether additional parity is provided for PLS2 in the current frame-group. This value is constant during the entire duration of the current frame-group. The below table 12 gives the values of this field. When this field is set to '00', additional parity is not used for the PLS2 in the current frame-group.

TABLE 12

| Value | PLS2-AP mode |
| --- | --- |
| 00 | AP is not provided |
| 01 | AP1 mode |
| 10~11 | Reserved |

PLS2_AP_SIZE_CELL: This 15-bit field indicates the size (specified as the number of QAM cells) of the additional parity bits of the PLS2. This value is constant during the entire duration of the current frame-group.

PLS2_NEXT_AP_MODE: This 2-bit field indicates whether additional parity is provided for PLS2 signaling in every frame of next frame-group. This value is constant during the entire duration of the current frame-group. The table 12 defines the values of this field PLS2_NEXT_AP_SIZE_CELL: This 15-bit field indicates the size (specified as the number of QAM cells) of the additional parity bits of the PLS2 in every frame of the next frame-group. This value is constant during the entire duration of the current frame-group.

RESERVED: This 32-bit field is reserved for future use.

CRC_32: A 32-bit error detection code, which is applied to the entire PLS1 signaling.

FIG. 14 illustrates PLS2 data according to an embodiment of the present invention.

FIG. 14 illustrates PLS2-STAT data of the PLS2 data. The PLS2-STAT data are the same within a frame-group, while the PLS2-DYN data provide information that is specific for the current frame.

The details of fields of the PLS2-STAT data are as follows:

FIC_FLAG: This 1-bit field indicates whether the FIC is used in the current frame-group. If this field is set to '1', the FIC is provided in the current frame. If this field set to '0', the FIC is not carried in the current frame. This value is constant during the entire duration of the current frame-group.

AUX_FLAG: This 1-bit field indicates whether the auxiliary stream(s) is used in the current frame-group. If this field is set to '1', the auxiliary stream is provided in the current frame. If this field set to '0', the auxiliary stream is not carried in the current frame. This value is constant during the entire duration of current frame-group.

NUM_DP: This 6-bit field indicates the number of DPs carried within the current frame. The value of this field ranges from 1 to 64, and the number of DPs is NUM_DP+1.

DP_ID: This 6-bit field identifies uniquely a DP within a PHY profile.

DP_TYPE: This 3-bit field indicates the type of the DP. This is signaled according to the below table 13.

TABLE 13

| Value | DP Type |
| --- | --- |
| 000 | DP Type 1 |
| 001 | DP Type 2 |
| 010~111 | reserved |

DP_GROUP_ID: This 8-bit field identifies the DP group with which the current DP is associated. This can be used by a receiver to access the DPs of the service components associated with a particular service, which will have the same DP_GROUP_ID.

BASE_DP_ID: This 6-bit field indicates the DP carrying service signaling data (such as PSI/SI) used in the Management layer. The DP indicated by BASE_DP_ID may be either a normal DP carrying the service signaling data along with the service data or a dedicated DP carrying only the service signaling data DP_FEC_TYPE: This 2-bit field indicates the FEC type used by the associated DP. The FEC type is signaled according to the below table 14.

TABLE 14

| Value | FEC_TYPE |
| --- | --- |
| 00 | 16K LDPC |
| 01 | 64K LDPC |
| 10~11 | Reserved |

DP_COD: This 4-bit field indicates the code rate used by the associated DP. The code rate is signaled according to the below table 15.

TABLE 15

| Value | Code rate |
| --- | --- |
| 0000 | 5/15 |
| 0001 | 6/15 |
| 0010 | 7/15 |
| 0011 | 8/15 |
| 0100 | 9/15 |
| 0101 | 10/15 |
| 0110 | 11/15 |
| 0111 | 12/15 |
| 1000 | 13/15 |
| 1001~1111 | Reserved |

DP_MOD: This 4-bit field indicates the modulation used by the associated DP. The modulation is signaled according to the below table 16.

TABLE 16

| Value | Modulation |
| --- | --- |
| 0000 | QPSK |
| 0001 | QAM-16 |
| 0010 | NUQ-64 |
| 0011 | NUQ-256 |
| 0100 | NUQ-1024 |
| 0101 | NUC-16 |
| 0110 | NUC-64 |
| 0111 | NUC-256 |
| 1000 | NUC-1024 |
| 1001~1111 | reserved |

DP_SSD_FLAG: This 1-bit field indicates whether the SSD mode is used in the associated DP. If this field is set to value '1', SSD is used. If this field is set to value '0', SSD is not used.

The following field appears only if PHY_PROFILE is equal to '010', which indicates the advanced profile:

DP_MIMO: This 3-bit field indicates which type of MIMO encoding process is applied to the associated DP. The type of MIMO encoding process is signaled according to the table 17.

TABLE 17

| Value | MIMO encoding |
| --- | --- |
| 000 | FR-SM |
| 001 | FRFD-SM |
| 010~111 | reserved |

DP_TI_TYPE: This 1-bit field indicates the type of time-interleaving. A value of '0' indicates that one TI group corresponds to one frame and contains one or more TI-blocks. A value of '1' indicates that one TI group is carried in more than one frame and contains only one TI-block.

DP_TI_LENGTH: The use of this 2-bit field (the allowed values are only 1, 2, 4, 8) is determined by the values set within the DP_TI_TYPE field as follows:

If the DP_TI_TYPE is set to the value '1', this field indicates PI, the number of the frames to which each TI group is mapped, and there is one TI-block per TI group (NTI=1). The allowed PI values with 2-bit field are defined in the below table 18.

If the DP_TI_TYPE is set to the value '0', this field indicates the number of TI-blocks NTI per TI group, and there is one TI group per frame (Pi=1). The allowed PI values with 2-bit field are defined in the below table 18.

TABLE 18

| 2-bit field | PI | NTI |
| --- | --- | --- |
| 00 | 1 | 1 |
| 01 | 2 | 2 |
| 10 | 4 | 3 |
| 11 | 8 | 4 |

DP_FRAME_INTERVAL: This 2-bit field indicates the frame interval (IJUMP) within the frame-group for the associated DP and the allowed values are 1, 2, 4, 8 (the corresponding 2-bit field is '00', '01', '10', or '11', respectively). For DPs that do not appear every frame of the frame-group, the value of this field is equal to the interval between successive frames. For example, if a DP appears on the frames 1, 5, 9, 13, etc., this field is set to '4'. For DPs that appear in every frame, this field is set to '1'.

DP_TI_BYPASS: This 1-bit field determines the availability of time interleaver 5050. If time interleaving is not used for a DP, it is set to '1'. Whereas if time interleaving is used it is set to '0'.

DP_FIRST_FRAME_IDX: This 5-bit field indicates the index of the first frame of the super-frame in which the current DP occurs. The value of DP_FIRST_FRAME_IDX ranges from 0 to 31

DP_NUM_BLOCK_MAX: This 10-bit field indicates the maximum value of DP_NUM_BLOCKS for this DP. The value of this field has the same range as DP_NUM_BLOCKS.

DP_PAYLOAD_TYPE: This 2-bit field indicates the type of the payload data carried by the given DP. DP_PAYLOAD_TYPE is signaled according to the below table 19.

TABLE 19

| Value | Payload Type |
| --- | --- |
| 00 | TS. |
| 01 | IP |
| 10 | GS |
| 11 | reserved |

DP_INBAND_MODE: This 2-bit field indicates whether the current DP carries in-band signaling information. The in-band signaling type is signaled according to the below table 20.

TABLE 20

| Value | In-band mode |
| --- | --- |
| 00 | In-band signaling is not carried. |
| 01 | INBAND-PLS is carried only |
| 10 | INBAND-ISSY is carried only |
| 11 | INBAND-PLS and INBAND-ISSY are carried |

DP_PROTOCOL_TYPE: This 2-bit field indicates the protocol type of the payload carried by the given DP. It is signaled according to the below table 21 when input payload types are selected.

TABLE 21

| Value | If DP_PAYLOAD_TYPE Is TS | If DP_PAYLOAD_TYPE Is IP | If DP_PAYLOAD_TYPE Is GS |
| --- | --- | --- | --- |
| 00 | MPEG2-TS | IPv4 | (Note) |
| 01 | Reserved | IPv6 | Reserved |
| 10 | Reserved | Reserved | Reserved |
| 11 | Reserved | Reserved | Reserved |

DP_CRC_MODE: This 2-bit field indicates whether CRC encoding is used in the Input Formatting block. The CRC mode is signaled according to the below table 22.

TABLE 22

| Value | CRC mode |
| --- | --- |
| 00 | Not used |
| 01 | CRC-8 |
| 10 | CRC-16 |
| 11 | CRC-32 |

DNP_MODE: This 2-bit field indicates the null-packet deletion mode used by the associated DP when DP_PAYLOAD_TYPE is set to TS ('00'). DNP_MODE is signaled according to the below table 23. If DP_PAYLOAD_TYPE is not TS ('00'), DNP_MODE is set to the value '00'.

TABLE 23

| Value | Null-packet deletion mode |
| --- | --- |
| 00 | Not used |
| 01 | DNP-NORMAL |
| 10 | DNP-OFFSET |
| 11 | reserved |

ISSY_MODE: This 2-bit field indicates the ISSY mode used by the associated DP when DP_PAYLOAD_TYPE is set to TS ('00'). The ISSY_MODE is signaled according to the below table 24 If DP_PAYLOAD_TYPE is not TS ('00'), ISSY_MODE is set to the value '00'.

TABLE 24

| Value | ISSY mode |
| --- | --- |
| 00 | Not used |
| 01 | ISSY-UP |
| 10 | ISSY-BBF |
| 11 | reserved |

HC_MODE_TS: This 2-bit field indicates the TS header compression mode used by the associated DP when DP_PAYLOAD_TYPE is set to TS ('00'). The HC_MODE_TS is signaled according to the below table 25.

TABLE 25

| Value | Header compression mode |
| --- | --- |
| 00 | HC_MODE_TS 1 |
| 01 | HC_MODE_TS 2 |
| 10 | HC_MODE_TS 3 |
| 11 | HC_MODE_TS 4 |

HC_MODE_IP: This 2-bit field indicates the IP header compression mode when DP_PAYLOAD_TYPE is set to IP ('01'). The HC_MODE_IP is signaled according to the below table 26.

TABLE 26

| Value | Header compression mode |
| --- | --- |
| 00 | No compression |
| 01 | HC_MODE_IP 1 |
| 10~11 | reserved |

PID: This 13-bit field indicates the PID number for TS header compression when DP_PAYLOAD_TYPE is set to TS ('00') and HC_MODE_TS is set to '01' or '10'.

RESERVED: This 8-bit field is reserved for future use.

The following field appears only if FIC_FLAG is equal to '1':

FIC_VERSION: This 8-bit field indicates the version number of the FIC.

FIC_LENGTH_BYTE: This 13-bit field indicates the length, in bytes, of the FIC.

RESERVED: This 8-bit field is reserved for future use.

The following field appears only if AUX_FLAG is equal to '1':

NUM_AUX: This 4-bit field indicates the number of auxiliary streams. Zero means no auxiliary streams are used.

AUX_CONFIG_RFU: This 8-bit field is reserved for future use.

AUX_STREAM_TYPE: This 4-bit is reserved for future use for indicating the type of the current auxiliary stream.

AUX_PRIVATE_CONFIG: This 28-bit field is reserved for future use for signaling auxiliary streams.

FIG. 15 illustrates PLS2 data according to another embodiment of the present invention.

FIG. 15 illustrates PLS2-DYN data of the PLS2 data. The values of the PLS2-DYN data may change during the duration of one frame-group, while the size of fields remains constant.

The details of fields of the PLS2-DYN data are as follows:

FRAME_INDEX: This 5-bit field indicates the frame index of the current frame within the super-frame. The index of the first frame of the super-frame is set to '0'.

PLS_CHANGE_COUNTER: This 4-bit field indicates the number of super-frames ahead where the configuration will change. The next super-frame with changes in the configuration is indicated by the value signaled within this field. If this field is set to the value '0000', it means that no scheduled change is foreseen: e.g., value '1' indicates that there is a change in the next super-frame.

FIC_CHANGE_COUNTER: This 4-bit field indicates the number of super-frames ahead where the configuration (i.e., the contents of the FIC) will change. The next super-frame with changes in the configuration is indicated by the value signaled within this field. If this field is set to the value '0000', it means that no scheduled change is foreseen: e.g. value '0001' indicates that there is a change in the next super-frame.

RESERVED: This 16-bit field is reserved for future use.

The following fields appear in the loop over NUM_DP, which describe the parameters associated with the DP carried in the current frame.

DP_ID: This 6-bit field indicates uniquely the DP within a PHY profile.

DP_START: This 15-bit (or 13-bit) field indicates the start position of the first of the DPs using the DPU addressing scheme. The DP_START field has differing length according to the PHY profile and FFT size as shown in the below table 27.

TABLE 27

| | DP_START field size | |
| --- | --- | --- |
| PHY profile | 64K | 16K |
| Base | 13 bits | 15 bits |
| Handheld | — | 13 bits |
| Advanced | 13 bits | 15 bits |

DP_NUM_BLOCK: This 10-bit field indicates the number of FEC blocks in the current TI group for the current DP. The value of DP_NUM_BLOCK ranges from 0 to 1023.

RESERVED: This 8-bit field is reserved for future use.

The following fields indicate the FIC parameters associated with the EAC.

EAC_FLAG: This 1-bit field indicates the existence of the EAC in the current frame. This bit is the same value as the EAC_FLAG in the preamble.

EAS_WAKE_UP_VERSION_NUM: This 8-bit field indicates the version number of a wake-up indication.

If the EAC_FLAG field is equal to '1', the following 12 bits are allocated for EAC_LENGTH_BYTE field. If the EAC_FLAG field is equal to '0', the following 12 bits are allocated for EAC_COUNTER.

EAC_LENGTH_BYTE: This 12-bit field indicates the length, in byte, of the EAC.

EAC_COUNTER: This 12-bit field indicates the number of the frames before the frame where the EAC arrives.

The following field appears only if the AUX_FLAG field is equal to '1':

AUX_PRIVATE_DYN: This 48-bit field is reserved for future use for signaling auxiliary streams. The meaning of this field depends on the value of AUX_STREAM_TYPE in the configurable PLS2-STAT.

CRC_32: A 32-bit error detection code, which is applied to the entire PLS2.

FIG. 16 illustrates a logical structure of a frame according to an embodiment of the present invention.

As above mentioned, the PLS, EAC, FIC, DPs, auxiliary streams and dummy cells are mapped into the active carriers of the OFDM symbols in the frame. The PLS1 and PLS2 are first mapped into one or more FSS(s). After that, EAC cells, if any, are mapped immediately following the PLS field, followed next by FIC cells, if any. The DPs are mapped next after the PLS or EAC, FIC, if any. Type 1 DPs follows first, and Type 2 DPs next. The details of a type of the DP will be described later. In some case, DPs may carry some special data for EAS or service signaling data. The auxiliary stream or streams, if any, follow the DPs, which in turn are followed by dummy cells. Mapping them all together in the above mentioned order, i.e. PLS, EAC, FIC, DPs, auxiliary streams and dummy data cells exactly fill the cell capacity in the frame.

FIG. 17 illustrates PLS mapping according to an embodiment of the present invention.

PLS cells are mapped to the active carriers of FSS(s). Depending on the number of cells occupied by PLS, one or more symbols are designated as FSS(s), and the number of FSS(s) N_FSS is signaled by NUM_FSS in PLS1. The FSS is a special symbol for carrying PLS cells. Since robustness and latency are critical issues in the PLS, the FSS(s) has higher density of pilots allowing fast synchronization and frequency-only interpolation within the FSS.

PLS cells are mapped to active carriers of the NFSS FSS(s) in a top-down manner as shown in an example in FIG. 17. The PLS1 cells are mapped first from the first cell of the first FSS in an increasing order of the cell index. The PLS2 cells follow immediately after the last cell of the PLS1 and mapping continues downward until the last cell index of the first FSS. If the total number of required PLS cells exceeds the number of active carriers of one FSS, mapping proceeds to the next FSS and continues in exactly the same manner as the first FSS.

After PLS mapping is completed, DPs are carried next. If EAC, FIC or both are present in the current frame, they are placed between PLS and "normal" DPs.

FIG. 18 illustrates EAC mapping according to an embodiment of the present invention.

EAC is a dedicated channel for carrying EAS messages and links to the DPs for EAS. EAS support is provided but EAC itself may or may not be present in every frame. EAC, if any, is mapped immediately after the PLS2 cells. EAC is not preceded by any of the FIC, DPs, auxiliary streams or dummy cells other than the PLS cells. The procedure of mapping the EAC cells is exactly the same as that of the PLS.

The EAC cells are mapped from the next cell of the PLS2 in increasing order of the cell index as shown in the example in FIG. 18. Depending on the EAS message size, EAC cells may occupy a few symbols, as shown in FIG. 18.

EAC cells follow immediately after the last cell of the PLS2, and mapping continues downward until the last cell index of the last FSS. If the total number of required EAC cells exceeds the number of remaining active carriers of the last FSS mapping proceeds to the next symbol and continues in exactly the same manner as FSS(s). The next symbol for mapping in this case is the normal data symbol, which has more active carriers than a FSS.

After EAC mapping is completed, the FIC is carried next, if any exists. If FIC is not transmitted (as signaled in the PLS2 field), DPs follow immediately after the last cell of the EAC.

FIG. 19 illustrates FIC mapping according to an embodiment of the present invention.

(a) shows an example mapping of FIC cell without EAC and (b) shows an example mapping of FIC cell with EAC.

FIC is a dedicated channel for carrying cross-layer information to enable fast service acquisition and channel scanning. This information primarily includes channel binding information between DPs and the services of each broadcaster. For fast scan, a receiver can decode FIC and obtain information such as broadcaster ID, number of services, and BASE_DP_ID. For fast service acquisition, in addition to FIC, base DP can be decoded using BASE_DP_ID. Other than the content it carries, a base DP is encoded and mapped to a frame in exactly the same way as a normal DP. Therefore, no additional description is required for a base DP. The FIC data is generated and consumed in the Management Layer. The content of FIC data is as described in the Management Layer specification.

The FIC data is optional and the use of FIC is signaled by the FIC_FLAG parameter in the static part of the PLS2. If FIC is used, FIC_FLAG is set to '1' and the signaling field for FIC is defined in the static part of PLS2. Signaled in this field are FIC_VERSION, and FIC_LENGTH_BYTE. FIC uses the same modulation, coding and time interleaving parameters as PLS2. FIC shares the same signaling parameters such as PLS2_MOD and PLS2_FEC. FIC data, if any, is mapped immediately after PLS2 or EAC if any. FIC is not preceded by any normal DPs, auxiliary streams or dummy cells. The method of mapping FIC cells is exactly the same as that of EAC which is again the same as PLS.

Without EAC after PLS, FIC cells are mapped from the next cell of the PLS2 in an increasing order of the cell index as shown in an example in (a). Depending on the FIC data size, FIC cells may be mapped over a few symbols, as shown in (b).

FIC cells follow immediately after the last cell of the PLS2, and mapping continues downward until the last cell index of the last FSS. If the total number of required FIC cells exceeds the number of remaining active carriers of the last FSS, mapping proceeds to the next symbol and continues in exactly the same manner as FSS(s). The next symbol for mapping in this case is the normal data symbol which has more active carriers than a FSS.

If EAS messages are transmitted in the current frame, EAC precedes FIC, and FIC cells are mapped from the next cell of the EAC in an increasing order of the cell index as shown in (b).

After FIC mapping is completed, one or more DPs are mapped, followed by auxiliary streams, if any, and dummy cells.

FIG. 20 illustrates a type of DP according to an embodiment of the present invention.

shows type 1 DP and (b) shows type 2 DP.

After the preceding channels, i.e., PLS, EAC and FIC, are mapped, cells of the DPs are mapped. A DP is categorized into one of two types according to mapping method:

Type 1 DP: DP is mapped by TDM
Type 2 DP: DP is mapped by FDM

The type of DP is indicated by DP_TYPE field in the static part of PLS2. FIG. 20 illustrates the mapping orders of Type 1 DPs and Type 2 DPs. Type 1 DPs are first mapped in the increasing order of cell index, and then after reaching the last cell index, the symbol index is increased by one. Within the next symbol, the DP continues to be mapped in the increasing order of cell index starting from p=0. With a number of DPs mapped together in one frame, each of the Type 1 DPs are grouped in time, similar to TDM multiplexing of DPs.

Type 2 DPs are first mapped in the increasing order of symbol index, and then after reaching the last OFDM symbol of the frame, the cell index increases by one and the symbol index rolls back to the first available symbol and then increases from that symbol index. After mapping a number of DPs together in one frame, each of the Type 2 DPs are grouped in frequency together, similar to FDM multiplexing of DPs.

Type 1 DPs and Type 2 DPs can coexist in a frame if needed with one restriction; Type 1 DPs always precede Type 2 DPs. The total number of OFDM cells carrying Type 1 and Type 2 DPs cannot exceed the total number of OFDM cells available for transmission of DPs:

$$D_{DP1}+D_{DP2} \leq D_{DP}$$ [Equation 2]

where DDP1 is the number of OFDM cells occupied by Type 1 DPs, DDP2 is the number of cells occupied by Type 2 DPs. Since PLS, EAC, FIC are all mapped in the same way as Type 1 DP, they all follow "Type 1 mapping rule". Hence, overall, Type 1 mapping always precedes Type 2 mapping.

FIG. 21 illustrates DP mapping according to an embodiment of the present invention.

shows an addressing of OFDM cells for mapping type 1 DPs and (b) shows an addressing of OFDM cells for mapping for type 2 DPs.

Addressing of OFDM cells for mapping Type 1 DPs (0, . . . , DDP1-1) is defined for the active data cells of Type 1 DPs. The addressing scheme defines the order in which the cells from the TIs for each of the Type 1 DPs are allocated to the active data cells. It is also used to signal the locations of the DPs in the dynamic part of the PLS2.

Without EAC and FIC, address 0 refers to the cell immediately following the last cell carrying PLS in the last FSS. If EAC is transmitted and FIC is not in the corresponding frame, address 0 refers to the cell immediately following the last cell carrying EAC. If FIC is transmitted in the corresponding frame, address 0 refers to the cell immediately following the last cell carrying FIC. Address 0 for Type 1 DPs can be calculated considering two different cases as shown in (a). In the example in (a), PUS, EAC and FIC are assumed to be all transmitted. Extension to the cases where either or both of EAC and FIC are omitted is straightforward. If there are remaining cells in the FSS after mapping all the cells up to FIC as shown on the left side of (a).

Addressing of OFDM cells for mapping Type 2 DPs (0, . . . , DDP2-1) is defined for the active data cells of Type 2 DPs. The addressing scheme defines the order in which the cells from the TIs for each of the Type 2 DPs are allocated to the active data cells. It is also used to signal the locations of the DPs in the dynamic part of the PLS2.

Three slightly different cases are possible as shown in (b). For the first case shown on the left side of (b), cells in the last FSS are available for Type 2 DP mapping. For the second case shown in the middle, FIC occupies cells of a normal symbol, but the number of FIC cells on that symbol is not larger than CFSS. The third case, shown on the right side in (b), is the same as the second case except that the number of FIC cells mapped on that symbol exceeds CFSS.

The extension to the case where Type 1 DP(s) precede Type 2 DP(s) is straightforward since PLS, EAC and FIC follow the same "Type 1 mapping rule" as the Type 1 DP(s).

A data pipe unit (DPU) is a basic unit for allocating data cells to a DP in a frame.

A DPU is defined as a signaling unit for locating DPs in a frame. A Cell Mapper 7010 may map the cells produced by the TIs for each of the DPs. A Time interleaver 5050 outputs a series of TI-blocks and each TI-block comprises a variable number of XFECBLOCKs which is in turn composed of a set of cells. The number of cells in an XFECBLOCK, Ncells, is dependent on the FECBLOCK size, Nldpc, and the number of transmitted bits per constellation symbol. A DPU is defined as the greatest common divisor of all possible values of the number of cells in a XFECBLOCK, Ncells, supported in a given PHY profile. The length of a DPU in cells is defined as LDPU. Since each PHY profile supports different combinations of FECBLOCK size and a different number of bits per constellation symbol, LDPU is defined on a PHY profile basis.

FIG. 22 illustrates an FEC structure according to an embodiment of the present invention.

FIG. 22 illustrates an FEC structure according to an embodiment of the present invention before bit interleaving. As above mentioned, Data FEC encoder may perform the FEC encoding on the input BBF to generate FECBLOCK procedure using outer coding (BCH), and inner coding (LDPC). The illustrated FEC structure corresponds to the FECBLOCK. Also, the FECBLOCK and the FEC structure have same value corresponding to a length of LDPC codeword.

The BCH encoding is applied to each BBF (Kbch bits), and then LDPC encoding is applied to BCH-encoded BBF (Kldpc bits=Nbch bits) as illustrated in FIG. 22.

The value of Nldpc is either 64800 bits (long FEC-BLOCK) or 16200 bits (short FECBLOCK).

The below table 28 and table 29 show FEC encoding parameters for a long FECBLOCK and a short FECBLOCK, respectively.

TABLE 28

| LDPC Rate | Nldpc | Kldpc | Kbch | BCH error correction capability | Nbch − Kbch |
|---|---|---|---|---|---|
| 5/15 | 64800 | 21600 | 21408 | 12 | 192 |
| 6/15 | | 25920 | 25728 | | |
| 7/15 | | 30240 | 30048 | | |
| 8/15 | | 34560 | 34368 | | |
| 9/15 | | 38880 | 38688 | | |
| 10/15 | | 43200 | 43008 | | |
| 11/15 | | 47520 | 47328 | | |
| 12/15 | | 51840 | 51648 | | |
| 13/15 | | 56160 | 55968 | | |

TABLE 29

| LDPC Rate | Nldpc | Kldpc | Kbch | BCH error correction capability | Nbch − Kbch |
|---|---|---|---|---|---|
| 5/15 | 16200 | 5400 | 5232 | 12 | 168 |
| 6/15 | | 6480 | 6312 | | |
| 7/15 | | 7560 | 7392 | | |
| 8/15 | | 8640 | 8472 | | |
| 9/15 | | 9720 | 9552 | | |

TABLE 29-continued

| LDPC Rate | Nldpc | Kldpc | Kbch | BCH error correction capability | Nbch – Kbch |
|---|---|---|---|---|---|
| 10/15 | | 10800 | 10632 | | |
| 11/15 | | 11880 | 11712 | | |
| 12/15 | | 12960 | 12792 | | |
| 13/15 | | 14040 | 13872 | | |

The details of operations of the BCH encoding and LDPC encoding are as follows:

A 12-error correcting BCH code is used for outer encoding of the BBF. The BCH generator polynomial for short FECBLOCK and long FECBLOCK are obtained by multiplying together all polynomials.

LDPC code is used to encode the output of the outer BCH encoding. To generate a completed Bldpc (FECBLOCK), Pldpc (parity bits) is encoded systematically from each Ildpc (BCH-encoded BBF), and appended to Ildpc. The completed Bldpc (FECBLOCK) are expressed as follow Equation.

$$B_{ldpc} = [I_{ldpc} P_{ldpc}] = [i_0, i_1, \ldots, i_{K_{ldpc}-1}, p_0, p_1, \ldots, p_{N_{ldpc}-K_{ldpc}-1}]$$ [Equation 3]

The parameters for long FECBLOCK and short FECBLOCK are given in the above table 28 and 29, respectively.

The detailed procedure to calculate Nldpc–Kldpc parity bits for long FECBLOCK, is as follows:

1) Initialize the parity bits, $$p_0 = p_1 = p_2 = \ldots = p_{N_{ldpc}-K_{ldpc}-1} = 0$$ [Equation 4]

2) Accumulate the first information bit—i0, at parity bit addresses specified in the first row of an addresses of parity check matrix. The details of addresses of parity check matrix will be described later. For example, for rate 13/15:

$$p_{983} = p_{983} \oplus i_0$$ [Equation 5]
$$p_{2815} = p_{2815} \oplus i_0$$
$$p_{4837} = p_{4837} \oplus i_0$$
$$p_{4989} = p_{4989} \oplus i_0$$
$$p_{6138} = p_{6138} \oplus i_0$$
$$p_{6458} = p_{6458} \oplus i_0$$
$$p_{6921} = p_{6921} \oplus i_0$$
$$p_{6974} = p_{6974} \oplus i_0$$
$$p_{7572} = p_{7572} \oplus i_0$$
$$p_{8260} = p_{8260} \oplus i_0$$
$$p_{8496} = p_{8496} \oplus i_0$$

3) For the next 359 information bits, is, s=1, 2, . . . , 359 accumulate is at parity bit addresses using following Equation.

$$\{x + (s \bmod 360) \times Q_{ldpc}\} \bmod (N_{ldpc} - K_{ldpc})$$ [Equation 6]

where x denotes the address of the parity bit accumulator corresponding to the first bit i0, and Qldpc is a code rate dependent constant specified in the addresses of parity check matrix. Continuing with the example, Qldpc=24 for rate 13/15, so for information bit i1, the following operations are performed:

$$p_{1007} = p_{1007} \oplus i_1$$ [Equation 7]
$$p_{2839} = p_{2839} \oplus i_1$$
$$p_{4861} = p_{4861} \oplus i_1$$
$$p_{5013} = p_{5013} \oplus i_1$$
$$p_{6162} = p_{6162} \oplus i_1$$
$$p_{6482} = p_{6482} \oplus i_1$$
$$p_{6945} = p_{6945} \oplus i_1$$
$$p_{6998} = p_{6998} \oplus i_1$$
$$p_{7596} = p_{7596} \oplus i_1$$
$$p_{8284} = p_{8284} \oplus i_1$$
$$p_{8520} = p_{8520} \oplus i_1$$

4) For the 361st information bit i360, the addresses of the parity bit accumulators are given in the second row of the addresses of parity check matrix. In a similar manner the addresses of the parity bit accumulators for the following 359 information bits is, s=361, 362, . . . , 719 are obtained using the Equation 6, where x denotes the address of the parity bit accumulator corresponding to the information bit i360, i.e., the entries in the second row of the addresses of parity check matrix.

5) In a similar manner, for every group of 360 new information bits, a new row from addresses of parity check matrixes used to find the addresses of the parity bit accumulators.

After all of the information bits are exhausted, the final parity bits are obtained as follows:

6) Sequentially perform the following operations starting with i=1

$$p_i = p_i \oplus p_{p-1}, i=1,2, \ldots, N_{ldpc} - K_{ldpc} - 1$$ [Equation 8]

where final content of pi, i=0, 1, . . . Nldpc–Kldpc–1 is equal to the parity bit pi.

TABLE 30

| Code Rate | Qldpc |
|---|---|
| 5/15 | 120 |
| 6/15 | 108 |
| 7/15 | 96 |
| 8/15 | 84 |
| 9/15 | 72 |
| 10/15 | 60 |
| 11/15 | 48 |
| 12/15 | 36 |
| 13/15 | 24 |

This LDPC encoding procedure for a short FECBLOCK is in accordance with t LDPC encoding procedure for the long FECBLOCK, except replacing the table 30 with table 31, and replacing the addresses of parity check matrix for the long FECBLOCK with the addresses of parity check matrix for the short FECBLOCK.

TABLE 31

| Code Rate | Qldpc |
|---|---|
| 5/15 | 30 |
| 6/15 | 27 |
| 7/15 | 24 |
| 8/15 | 21 |

TABLE 31-continued

| Code Rate | Qldpc |
| --- | --- |
| 9/15 | 18 |
| 10/15 | 15 |
| 11/15 | 12 |
| 12/15 | 9 |
| 13/15 | 6 |

FIG. 23 illustrates a bit interleaving according to an embodiment of the present invention.

The outputs of the LDPC encoder are bit-interleaved, which consists of parity interleaving followed by Quasi-Cyclic Block (QCB) interleaving and inner-group interleaving.

shows Quasi-Cyclic Block (QCB) interleaving and (b) shows inner-group interleaving.

The FECBLOCK may be parity interleaved. At the output of the parity interleaving, the LDPC codeword consists of 180 adjacent QC blocks in a long FECBLOCK and 45 adjacent QC blocks in a short FECBLOCK. Each QC block in either a long or short FECBLOCK consists of 360 bits. The parity interleaved LDPC codeword is interleaved by QCB interleaving. The unit of QCB interleaving is a QC block. The QC blocks at the output of parity interleaving are permutated by QCB interleaving as illustrated in FIG. 23, where Ncells=64800/η mod or 16200/η mod according to the FECBLOCK length. The QCB interleaving pattern is unique to each combination of modulation type and LDPC code rate.

After QCB interleaving, inner-group interleaving is performed according to modulation type and order (η mod) which is defined in the below table 32. The number of QC blocks for one inner-group, NQCB_IG, is also defined.

TABLE 32

| Modulation type | ηmod | NQCB_IG |
| --- | --- | --- |
| QAM-16 | 4 | 2 |
| NUC-16 | 4 | 4 |
| NUQ-64 | 6 | 3 |
| NUC-64 | 6 | 6 |
| NUQ-256 | 8 | 4 |
| NUC-256 | 8 | 8 |
| NUQ-1024 | 10 | 5 |
| NUC-1024 | 10 | 10 |

The inner-group interleaving process is performed with NQCB_IG QC blocks of the QCB interleaving output. Inner-group interleaving has a process of writing and reading the bits of the inner-group using 360 columns and NQCB_IG rows. In the write operation, the bits from the QCB interleaving output are written row-wise. The read operation is performed column-wise to read out m bits from each row, where m is equal to 1 for NUC and 2 for NUQ.

FIG. 24 illustrates a cell-word demultiplexing according to an embodiment of the present invention.

shows a cell-word demultiplexing for 8 and 12 bpcu MIMO and (b) shows a cell-word demultiplexing for 10 bpcu MIMO.

Each cell word (c0,l, c1,l, . . . , cη mod−1,l) of the bit interleaving output is demultiplexed into (d1,0,m, d1,1,m . . . , d1,η mod−1,m) and (d2,0,m, d2,1,m . . . , d2,η mod−1,m) as shown in (a), which describes the cell-word demultiplexing process for one XFECBLOCK.

For the 10 bpcu MIMO case using different types of NUQ for MIMO encoding, the Bit Interleaver for NUQ-1024 is re-used. Each cell word (c0,l, c1,l, . . . , c9,l) of the Bit Interleaver output is demultiplexed into (d1,0,m, d1,1,m . . . , d1,3,m) and (d2,0,m, d2,1,m . . . , d2,5,m), as shown in (b).

FIG. 25 illustrates a time interleaving according to an embodiment of the present invention.

(a) to (c) show examples of TI mode.

The time interleaver operates at the DP level. The parameters of time interleaving (TI) may be set differently for each DP.

The following parameters, which appear in part of the PLS2-STAT data, configure the TI:

DP_TI_TYPE (allowed values: 0 or 1): Represents the TI mode; '0' indicates the mode with multiple TI blocks (more than one TI block) per TI group. In this case, one TI group is directly mapped to one frame (no inter-frame interleaving). '1' indicates the mode with only one TI block per TI group. In this case, the TI block may be spread over more than one frame (inter-frame interleaving).

DP_TI_LENGTH: If DP_TI_TYPE='0', this parameter is the number of TI blocks NTI per TI group. For DP_TI_TYPE='1', this parameter is the number of frames PI spread from one TI group.

DP_NUM_BLOCK_MAX (allowed values: 0 to 1023): Represents the maximum number of XFECBLOCKs per TI group.

DP_FRAME_INTERVAL (allowed values: 1, 2, 4, 8): Represents the number of the frames IJUMP between two successive frames carrying the same DP of a given PHY profile.

DP_TI_BYPASS (allowed values: 0 or 1): If time interleaving is not used for a DP, this parameter is set to '1'. It is set to '0' if time interleaving is used.

Additionally, the parameter DP_NUM_BLOCK from the PLS2-DYN data is used to represent the number of XFECBLOCKs carried by one TI group of the DP.

When time interleaving is not used for a DP, the following TI group, time interleaving operation, and TI mode are not considered. However, the Delay Compensation block for the dynamic configuration information from the scheduler will still be required. In each DP, the XFECBLOCKs received from the SSD/MIMO encoding are grouped into TI groups. That is, each TI group is a set of an integer number of XFECBLOCKs and will contain a dynamically variable number of XFECBLOCKs. The number of XFECBLOCKs in the TI group of index n is denoted by NxBLOCK_Group (n) and is signaled as DP_NUM_BLOCK in the PLS2-DYN data. Note that NxBLOCK_Group(n) may vary from the minimum value of 0 to the maximum value NxBLOCK_Group_MAX (corresponding to DP_NUM_BLOCK_MAX) of which the largest value is 1023.

Each TI group is either mapped directly onto one frame or spread over PI frames. Each TI group is also divided into more than one TI blocks (NTI), where each TI block corresponds to one usage of time interleaver memory. The TI blocks within the TI group may contain slightly different numbers of XFECBLOCKs. If the TI group is divided into multiple TI blocks, it is directly mapped to only one frame. There are three options for time interleaving (except the extra option of skipping the time interleaving) as shown in the below table 33.

TABLE 33

| Mode | Description |
| --- | --- |
| Option-1 | Each TI group contains one TI block and is mapped directly to one frame as shown in (a). This option is signaled in the PLS2-STAT by DP_TI_TYPE = '0' and DP_TI_LENGTH = '1'($N_{TI}$ = 1). |
| Option-2 | Each TI group contains one TI block and is mapped to more than one frame. (b) shows an example, where one TI group is mapped to two frames, i.e., DP_TI_LENGTH = '2' ($P_I$ = 2) and DP_FRAME_INTERVAL ($I_{JUMP}$ = 2). This provides greater time diversity for low data-rate services. This option is signaled in the PLS2-STAT by DP_TI_TYPE = '1'. |
| Option-3 | Each TI group is divided into multiple TI blocks and is mapped directly to one frame as shown in (c). Each TI block may use full TI memory, so as to provide the maximum bit-rate for a DP. This option is signaled in the PLS2-STAT signaling by DP_TI_TYPE = '0' and DP_TI_LENGTH = NTI, while $P_I$ = 1. |

In each DP, the TI memory stores the input XFEC-BLOCKs (output XFECBLOCKs from the SSD/MIMO encoding block). Assume that input XFECBLOCKs are defined as $$(d_{n,s,0,0}, d_{n,s,0,1}, \ldots, d_{n,s,0,N_{cells}-1}, d_{n,s,1,0}, \ldots, d_{n,s,1,N_{cells}-1},$$
$$\ldots, d_{n,s,N_{xBLOCK\_TI}(n,s)-1,0}, \ldots, d_{n,s,N_{xBLOCK\_TI}(n,s)-1,N_{cells}-1}),$$

where $d_{n,s,r,q}$ is the qth cell of the rth XFECBLOCK in the sth TI block of the nth TI group and represents the outputs of SSD and MIMO encodings as follows $$d_{n,s,r,q} = \begin{cases} f_{n,s,r,q}, & \text{the output of SSD encoding} \\ g_{n,s,r,q}, & \text{the output of MIMO encoding} \end{cases}.$$

In addition, assume that output XFECBLOCKs from the time interleaver 5050 are defined as $$(h_{n,s,0}, h_{n,s,1}, \ldots, h_{n,s,i}, \ldots, h_{n,s,N_{xBLOCK\_TI}(n,s) \times N_{cells}-1}),$$

where $h_{n,s,i}$ is the ith output cell (for i=0, ..., $N_{xBLOCK\_TI}$(n,s)×$N_{cells}$−1) in the sth TI block of the nth TI group.

Typically, the time interleaver will also act as a buffer for DP data prior to the process of frame building. This is achieved by means of two memory banks for each DP. The first TI-block is written to the first bank. The second TI-block is written to the second bank while the first bank is being read from and so on.

The TI is a twisted row-column block interleaver. For the sth TI block of the nth TI group, the number of rows $N_r$ of a TI memory is equal to the number of cells $N_{cells}$, i.e., $N_r=N_{cells}$ while the number of columns $N_c$ is equal to the number $N_{xBLOCK\_TI}$(n,s).

FIG. 26 illustrates a basic operation of a twisted row-column block interleaver according to an exemplary embodiment of the present invention.

FIG. 26A illustrates a writing operation in a time interleaver and FIG. 26B illustrates a reading operation in the time interleaver. As illustrated in FIG. 26A, a first XFECBLOCK is written in a first column of a time interleaving memory in a column direction and a second XFECBLOCK is written in a next column, and such an operation is continued. In addition, in an interleaving array, a cell is read in a diagonal direction. As illustrated in FIG. 26B, while the diagonal reading is in progress from a first row (to a right side along the row starting from a leftmost column) to a last row, $N_r$ cells are read. In detail, when it is assumed that $z_{n,r,i}$ (i=0, ..., $N_rN_c$) is a time interleaving memory cell position to be sequentially read, the reading operation in the interleaving array is executed by calculating a row index $R_{n,s,i}$, a column index $C_{n,s,i}$, and associated twist parameter $T_{n,s,i}$ as shown in an equation given below.

$$\text{GENERATE}(R_{n,s,i}, C_{n,s,i}) = \qquad \text{[Equation 9]}$$
$$\{$$
$$R_{n,s,i} = \mod(i, N_r),$$
$$T_{n,s,i} = \mod(S_{shift} \times R_{n,s,i}, N_c),$$
$$C_{n,s,i} = \mod\left(T_{n,s,i} + \left\lfloor \frac{i}{N_r} \right\rfloor, N_c\right)$$
$$\}$$

Where, $S_{shift}$ is a common shift value for a diagonal reading process regardless of $N_{xBLOCK\_TI}$(n,s) and the shift value is decided by $N_{xBLOCK\_TI\_MAX}$ given in PLS2-STAT as shown in an equation given below.

$$\text{for } \begin{cases} N'_{xBLOCK\_TI\_MAX} = N_{xBLOCK\_TI\_MAX} + 1, & \text{if } N_{xBLOCK\_TI\_MAX} \mod 2 = 0 \\ N'_{xBLOCK\_TI\_MAX} = N_{xBLOCK\_TI\_MAX}, & \text{if } N_{xBLOCK\_TI\_MAX} \mod 2 = 1 \end{cases}, \quad \text{[Equation 10]}$$
$$S_{shift} = \frac{N'_{xBLOCK\_TI\_MAX} - 1}{2}$$

Consequently, the cell position to be read is calculated by a coordinate $z_{n,s,i} = N_r C_{n,s,i} + R_{n,s,i}$.

FIG. 27 illustrates an operation of a twisted row-column block interleaver according to another exemplary embodiment of the present invention.

In more detail, FIG. 27 illustrates an interleaving array in the time interleaving memory for respective time interleaving groups including a virtual XFECBLOCK when $N_{xBLOCK\_TI}$(0,0)=3, $N_{xBLOCK\_TI}$(1,0)=6, and $N_{xBLOCK\_TI}$(2,0)=5.

A variable $N_{xBLOCK\_TI}$(n,s)=$N_r$ will be equal to or smaller than $N'_{xBLOCK\_TI\_MAX}$. Accordingly, in order for a receiver to achieve single memory interleaving regardless of $N_{xBLOCK\_TI}$(n,s), the size of the interleaving array for the twisted row-column block interleaver is set to a size of $N_r \times N_c = N'_{cells} \times N_{xBLOCK\_TI\_MAX}$ by inserting the virtual XFECBLOCK into the time interleaving memory and a reading process is achieved as shown in an equation given below.

[Equation 11]
$$\begin{aligned}&p = 0;\\&\text{for } i = 0; i < N_{cells}N'_{xBLOCK\_TI\_MAX}; i = i + 1\\&\{\text{GENERATE } (R_{n,s,i}, C_{n,s,i});\\&\quad V_i = N_r C_{n,s,j} + R_{n,s,j}\\&\quad\quad \text{if } V_i < N_{cells}N_{xBlock\_TI}(n,s)\\&\quad\quad \{\\&\quad\quad\quad Z_{n,s,p} = V_i; p = p + 1;\\&\quad\quad \}\\&\}\end{aligned}$$

The number of the time interleaving groups is set to 3. An option of the time interleaver is signaled in the PLS2-STAT by DP_TI_TYPE='0', DP_FRAME_INTERVAL='1', and DP_TI_LENGTH='1', that is, NTI=1, IJUMP=1, and PI=1. The number of respective XFECBLOCKs per time interleaving group, of which Ncells=30 is signaled in PLS2-DYN data by NxBLOCK_TI(0,0)=3, NxBLOCK_TI(1,0)=6, and NxBLOCK_TI(2,0)=5 of the respective XFECBLOCKs. The maximum number of XFECBLOCKs is signaled in the PLS2-STAT data by NxBLOCK_Group_MAX and this is continued to $\lfloor N_{xBLOCK\_Group\_MAX}/N_{TI}\rfloor = N_{xBLOCK\_TI\_MAX} = 6$.

FIG. 28 illustrates a diagonal reading pattern of the twisted row-column block interleaver according to the exemplary embodiment of the present invention.

In more detail, FIG. 28 illustrates a diagonal reading pattern from respective interleaving arrays having parameters $N'_{xBLOCK\_TI\_MAX}=7$ and Sshift=(7−1)/2=3. In this case, during a reading process expressed by a pseudo code given above, when $V_i \geq N_{cells}N_{xBLOCK\_TI}(n,s)$, a value of Vi is omitted and a next calculation value of Vi is used.

Figure 29:
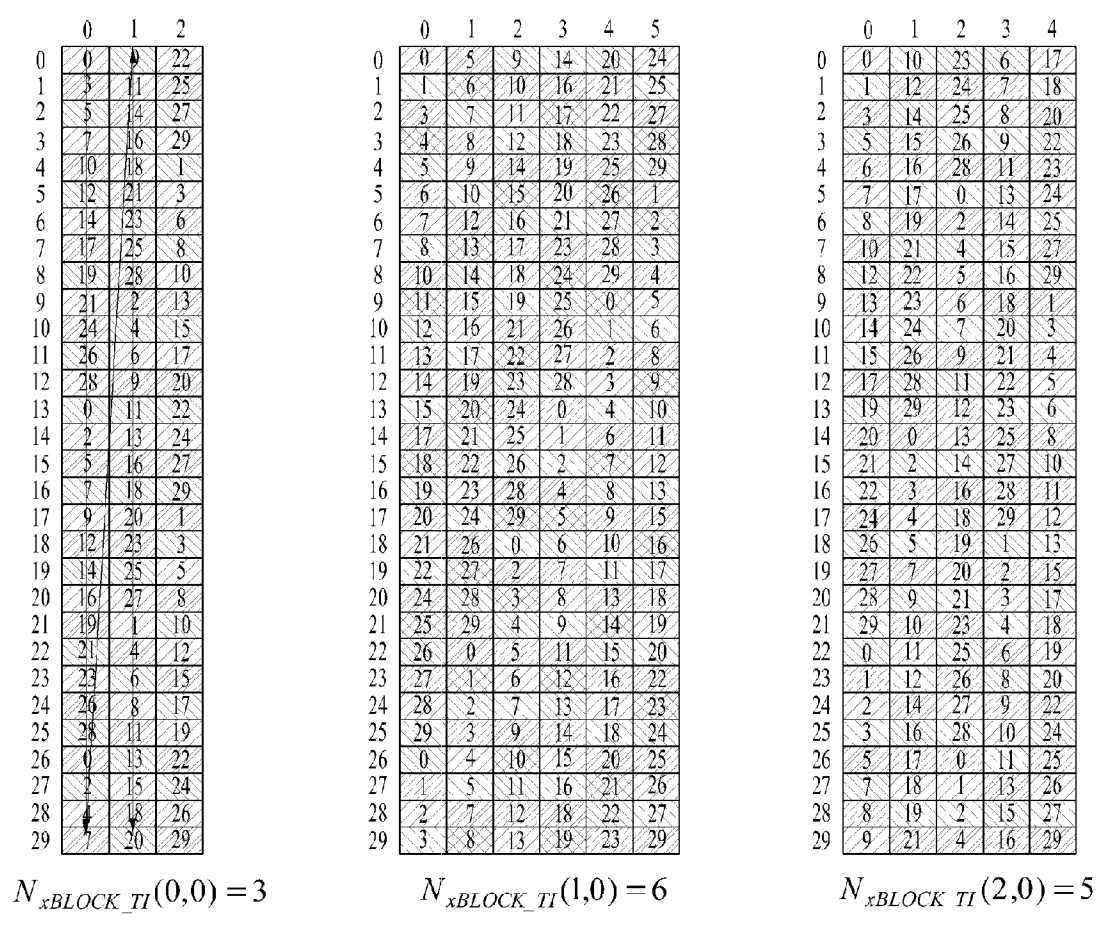

FIG. 29 illustrates XFECBLOCK interleaved from each interleaving array according to an exemplary embodiment of the present invention.

FIG. 29 illustrates XFECBLOCK interleaved from each interleaving array having parameters $N'_{xBLOCK\_TI\_MAX}=7$ and Sshift=3 according to an exemplary embodiment of the present invention.

In this specification, the aforementioned DP may be denoted as a physical layer pipe (PLP), and the aforementioned PLS information may be denoted as layer 1 (L1) information or L1 signaling information. The aforementioned PLS1 information may be denoted as layer 1 (L1) static information or L1 basic information, and the aforementioned PLS2 information may be denoted as L1 dynamic information or L1 detail information.

FIG. 30 is a detailed block diagram of a BICM block in accordance with another embodiment of the present invention.

A redundant description of the detailed blocks of FIG. 30 which is the same as the aforementioned description is omitted.

A constellation mapper 30010 may assign/map a received bit word to a constellation. In this case, rotation & Q delay may be additionally applied. That is, the constellation mapper 30010 may rotate received constellations at a rotation angle, may divide the constellations into an in-phase component and a quadrature-phase component, and may delay only the quadrature-phase component by a specific value. Thereafter, the constellation mapper 30010 may remap a newly paired in-phase component and quadrature-phase component to a new constellation.

A cell interleaver 30020 randomly mixes cells corresponding to a single FEC block, outputs the mixed cells, and outputs cells corresponding to each FEC block in different order for each FEC block.

A time interleaver 30030 may mix cells corresponding to a plurality of FEC blocks and output the mixed cells. Accordingly, an additional diversity gain can be obtained because the cells of each FEC block are spread in a period corresponding to a time interleaving depth and transmitted.

FIG. 31 shows a time interleaver in accordance with an embodiment of the present invention.

As described above, the broadcast system may process a single PLP (S-PLP) or a multiple PLP (M-PLP). In FIG. 31, a cell interleaver 32010 corresponds to a block, such as the cell interleaver of FIG. 30.

In the case of multiple PLP mode (M-PLP mode), a broadcast signal transmitter may perform time interleaving using a twisted block interleaver (BI) 31040 and a convolutional interleaver (CI) 31050. In the case of single PLP mode (S-PLP mode), a BI 31040 may become OFF, and a broadcast signal transmitter may perform time interleaving using a CI 31030. Time interleaving units used in multiple PLP mode may be together called a hybrid (time) interleaver or time interleaver. In this case, the CI 31030 in multiple PLP mode may be an interleaver using a convolutional delay-line, and the CI 31050 of single PLP mode may be a specific CI. The CI in single PLP mode may be called a sheer CI. Furthermore, an interleaver using a convolutional delay-line may also be called a CI or a convolutional delay-line (unit/module). The cell interleaver 31010 may be applied to both single PLP mode and multiple PLP mode or may be applied to only multiple PLP mode.

As shown in FIG. 31, the time interleaver includes a cell grouping block 31020. A broadcast signal transmitter can use memory more efficiently and increase an interleaving depth when performing time interleaving using the cell grouping block 31020. Cell grouping may be performed according to a single wise grouping or pairwise grouping method. In the single wise grouping method, a single data cell is mapped to a single memory unit (MU). In the pairwise grouping method, two cells that are included in the same PLP and that are consecutive are mapped to a single memory unit. The cell grouping block 31020 performing such an operation may be called a cell coupling block or a cell-memory unit mapper.

The time interleaver may time-interleave a baseline layer signal or an LDM signal. The LDM signal may be interleaved in S-PLP mode or M-PLP mode.

A broadcast signal transmitter and a broadcast signal receiver using a layer division multiplexing (LDM) scheme are described below.

LDM is a constellation superposition technology that combines multiple data streams at different power levels, possibly with different modulation and channel coding schemes before transmission in one RF channel. An LDM scheme using two layers according to an embodiment is described below, but the number of layers may be more than 2.

FIG. 32 illustrates the configuration of a broadcast signal transmitter in accordance with an embodiment of the present invention.

The broadcast signal transmitter of FIG. 32 may include an input formatting block 32010, a BICM block 32020, an LDM injection block 32030 block, a framing and interleaving block 32040, and a waveform generation block 32050. The framing and interleaving block 32040 of FIG. 32 may correspond to the frame building block of FIG. 1, and the waveform generation block 32050 may correspond to the OFDM generation block of FIG. 1.

The embodiment of FIG. 32 corresponds to a case where the frame building block 1020 includes a time interleaving block unlike in the aforementioned embodiments. Accordingly, the frame building block 1020 may be denoted as the framing and interleaving block 32040. In other words, the framing and interleaving block 32040 may include a time interleaving block, a framing block, and a frequency interleaving block. The framing and interleaving block 32040 may time-interleave data, may generate a signal frame by mapping the data, and may perform frequency interleaving by using such sub-blocks.

The LDM injection block 32030 performs LDM on data processed by the input formatting block 32010-1 and BICM block 32020-1 of an upper layer and data processed by the input formatting block 32010-2 and BICM block 32020-2 of a lower layer and outputs a single stream. In an embodiment of this specification, the two layers may be denoted as a core layer and an enhanced layer, an upper layer and a lower layer, or an upper layer and a baseline layer.

The data of the core layer needs to use a ModCod combination which is equally robust or more robust than the data of the enhanced layer. The two layers may use the same FEC coding/constellation mapping or may use different FEC coding/constellation mapping.

A description other than that the time interleaving block moves from the BICM block 32020 to the framing and interleaving block 32030 is the same as the aforementioned description. The waveform generation block 32050 is the same as the OFDM generation block 1030 of FIG. 1, and only the name of the waveform generation block 32050 is different from the OFDM generation block 1030 of FIG. 1.

From a viewpoint of a receiver, as described above, the time deinterleaving block may be included in the frame parsing block 9010 from the demapping and decoding block 9020 of FIG. 9, and the frame parsing block 9010 may also be denoted as a frame parsing/deinterleaving block.

FIG. 33 illustrates the configuration of a broadcast signal transmitter in accordance with an embodiment of the present invention.

FIG. 33 is a more detailed diagram of part of FIG. 32. In FIG. 32, the LDM injection block shown as a single block includes three blocks in FIG. 33. In other words, the LDM injection block of FIG. 32 includes an injection level controller 33020, a layer combiner 33030, and a power normalizer 33040 in FIG. 33.

FIG. 33 shows a broadcast signal transmitter for processing PLP data through three paths: a future extension layer, an upper layer (core layer), and a baseline layer (enhanced layer). The broadcast signal transmitter includes BICM blocks 33010-0~2 for processing the PLP data of the future extension layer, upper layer (core layer), and baseline layer (enhanced layer), respectively. An FE layer is used to add a service in the future, and may correspond to the extension layer of the core layer.

The coding and modulation structure of the core layer is similar to that of the enhanced layer, and the LDPC code rate of the core layer may be set to be relatively lower than that of the enhanced layer.

The injection level controller 33020 may control a power ratio of the core layer and the enhanced layer. The injection level controller 33020 may relatively reduce power of the enhanced layer compared to the core layer and may output transmission energy for each layer.

The layer combiner 33030 may add the data of the upper layer and the data of the enhanced layer and determine an FEC block ratio of the upper layer and the enhanced layer. Such an operation is for performing time interleaving/deinterleaving more efficiently. As shown in FIG. 33, layer combining is performed prior to cell interleaving.

The power normalizer 33040 normalizes transmission power of the core layer and transmission power of the enhanced layer so that the sum of transmission power of the core layer and transmission power of the enhanced layer becomes 1. In other words, the power normalizer 33040 normalizes total power of combined signals into a unity.

An LDM signal in which a core layer signal and an enhanced layer signal have been combined as described above may be transmitted through the framing and interleaving block and the waveform generation block. An operation of the layer combiner is described in more detail below.

The data stream of the core layer and the data stream of the enhanced layer may have different FEC block sizes. However, a combined LDM signal is time-interleaved in a single time interleaver, and the time interleaver performs interleaving in an FEC block unit. Accordingly, when the time interleaver performs interleaving, there may be a problem in that the data stream of the core layer or the data stream of the enhanced layer is not time-interleaved in an FEC unit.

Accordingly, a process of processing the data stream of the core layer and the data stream of the enhanced layer so that time interleaving may be performed without breaking an FEC block unit is described below.

First, a first option for configuring a time interleaving block in positive number times the FEC block of the core layer and the enhanced layer is described below as an LDM processing method in which time interleaving is taken into consideration.

FIG. 34 illustrates an LDM processing method in accordance with an embodiment of the present invention.

As described above, LDM processing may be performed in a positive number times to the FEC block of the upper layer and the lower layer so that the time interleaver may perform interleaving in an FEC block unit.

In FIG. 34, $N\_(UL,cells)$ denotes the cell length of one FEC block of an upper layer UL, and $N\_(LL,cells)$ denotes the cell length of one FEC block of a lower layer LL. Furthermore, in the following description, x denotes a minimum number of FEC blocks of an upper layer and may be represented by $N\_(UL,FEC\_TI\_MIN)$. Furthermore, y denotes a minimum number of FEC blocks of a lower layer and may be represented by $N\_(LL,FEC\_TI\_MIN)$. Each of x and y denotes minimum number of FEC blocks satisfy a condition in which a positive number times the FEC blocks enter a TI block.

In FIG. 34, Mode-1 shows an example in which $N\_(UL,FEC\_TI\_MIN):N\_(LL,FEC\_TI\_MIN)=1:1$. That is, since the cell length $N\_(UL,cells)$ of an FEC block of an upper layer is the same as the cell length $N\_(LL,cells)$ of an FEC block of a lower layer, the FEC blocks of both the layers may be processed in an integer number although time interleaving is performed based on any one of the upper layer and the lower layer.

In FIG. 34, Mode-2 shows an example in which $N\_(UL,FEC\_TI\_MIN):N\_(LL,FEC\_TI\_MIN)=x:1$ (or 1:y). In the case of 1:y, all the FEC blocks of both the layers may be interleaved in an integer number because y FEC blocks are processed even in the lower layer if time interleaving is performed based on the upper layer. In the case of x:1, all the FEC blocks of both the layers may be interleaved in an integer number because x FEC blocks are processed even in the upper layer if time interleaving is performed based on the lower layer.

In FIG. 34, Mode-3 shows an example in which $N\_(UL,FEC\_TI\_MIN):N\_(LL,FEC\_TI\_MIN)=x:y$. In this case, all the FEC blocks of both the layers may be interleaved in an integer number only when the length of x FEC blocks of the upper layer included in a sub-TI block is the same as that of y FEC blocks of the lower layer included in the sub-TI block. Accordingly, a method of setting LDM-processed data so that it is interleaved in an integer number of FEC block units with respect to both the layers is described below.

The broadcast signal transmitter may set a minimum number of FEC blocks and a maximum number of FEC blocks per TI block of each layer and perform LDM processing. In the upper layer and the lower layer, a minimum number of FEC block per TI block N_(UL,FEC_TI,MIN) and N_(LL,FEC,TI,MIN)) needs to satisfy Equation 12.

$$\min_{(x,y)} A,$$ [Equation 12]

where $A = \{(x, y) \mid x \cdot N_{UL,cells} = y \cdot N_{LL,cells}$ and $xN_{UL,cells},$ $yN_{LL,cells} \leq M\}$ In Equation 12, M denotes a maximum TI memory size, N_(UL,cells) denotes the cell length of one FEC block of the upper layer, N_(LL_cells) denotes the cell length of one FEC block of the lower layer, x denotes a minimum number of FEC blocks of the upper layer which satisfy the condition of Equation 12, and y denotes a minimum number of FEC blocks of the upper layer which satisfy the condition of Equation 12.

As described above, x may be equal to N_(UL,FEC_TI, MIN), and y may be equal to N_(LL,FEC,TI,MIN). In other words, as shown in Equation 12, x and y denote the number of FEC blocks of the upper layer and the number of FEC blocks of the lower layer, respectively, which satisfy the least common multiple A of the FEC block size of the upper layer and the FEC block size of the lower layer in a maximum memory size or less of the time interleaver.

Furthermore, a maximum number of FEC blocks per IT block N_(UL,FEC_TI_MAX) or N_(LL,FEC_TI_MAX) in the upper layer or the lower layer needs to satisfy Equation 13.

$$N_{UL,FEC\_TI\_MAX} = x \left\lfloor \frac{N_{UL\_FEC\_MAX}}{x} \right\rfloor,$$ [Equation 13]

$$\text{where } N_{UL\_FEC\_MAX} = \left\lfloor \frac{2M}{N_{UL,cells}(N_{IU}+1)} \right\rfloor$$

$$N_{LL,FEC\_TI\_MAX} = x \left\lfloor \frac{N_{LL\_FEC\_MAX}}{x} \right\rfloor,$$

$$\text{where } N_{LL\_FEC\_MAX} = \left\lfloor \frac{2M}{N_{LL,cells}(N_{IU}+1)} \right\rfloor$$

In Equation 13, each of N_(UL,FEC_TI_MAX) and N_(LL,FEC_TI_MAX) denotes a maximum number of FEC blocks which may be included in a TI block in each of the upper layer and the lower layer. N_IU denotes the number of interleaving units. N_IU denotes the number of frames in which a single TI block is spread when a convolutional interleaver (convolutional delay line) operates. In Equation 13, in each layer, a maximum number of FEC blocks transmitted in a TI block may be obtained using x or y which satisfies the condition of Equation 12. Furthermore, a maximum number of FEC blocks which may be inputted to memory while not exceeding N_(UL_FEC_MAX) and N_(LL_FEC_MAX) may be obtained through Equation 13 with respect to each of the upper layer and the lower layer.

In accordance with an embodiment of the present invention, the broadcast signal transmitter may calculate the number of FEC blocks x or y corresponding to a positive number times the FEC blocks in both the upper layer and the lower layer depending on the length of a specific FEC block of each of the two layers. Furthermore, the broadcast signal transmitter may calculate a maximum number of FEC blocks N_(UL_FEC_MAX) or N_(LL_FEC_MAX) which may be written in memory in a block (or sub-TI block) unit having a length corresponding to an integer number of FEC blocks. Furthermore, the broadcast signal transmitter may perform time interleaving by writing an LDM signal into memory in the unit of a maximum number of FEC blocks when sending a broadcast signal.

An embodiment satisfying the aforementioned conditions is described in more detail below using a test case.

<Test Case>

In the following test case, it is assumed that the time interleaver is M=2^19, N_IU=2. Furthermore, it is assumed that the size of an FEC block of the upper layer is 16200 and a QPSK (2 bits) modulation method is used. It is assumed that the size of an FEC block of the lower layer is 64800 and a 1024QAM (10 bits) modulation method is used. Accordingly, as in Table 34 below, the number of cells of the upper layer N_(UL,cells) is 8100, and the number of cells of the lower layer (N_(LL,cells) is 6480.

TABLE 34

| Modulation mode | $h_{MOD}$ | Number of output data cells for $N_{inner}$ = 64800 | Number of output data cells for $N_{inner}$ = 16200 |
|---|---|---|---|
| QPSK | 2 | 32400 | 8100 |
| 16-QAM | 4 | 16200 | 4050 |
| 64-QAM | 6 | 10800 | 2700 |
| 256-QAM | 8 | 8100 | 2025 |
| 1024-QAM | 10 | 6480 | 1620 |
| 4096-QAM | 12 | 5400 | 1350 |

If such a condition is substituted, in Equation 12, the least common multiple A becomes 32400, resulting in x=4 and y=5 (32400=8100*4=6480*5). Furthermore, a result of the substitution of such values into Equation 13 is the same as Equation 14 below.

$$N_{UL,FEC\_TI\_MAX} = x \left\lfloor \frac{N_{UL\_FEC\_MAX}}{x} \right\rfloor = 4 \left\lfloor \frac{43}{4} \right\rfloor = 40,$$ [Equation 14]

$$\text{where } N_{UL\_FEC\_MAX} = \left\lfloor \frac{2M}{8100(2+1)} \right\rfloor$$

$$N_{LL,FEC\_TI\_MAX} = x \left\lfloor \frac{N_{LL\_FEC\_MAX}}{x} \right\rfloor = 5 \left\lfloor \frac{53}{5} \right\rfloor = 50,$$

$$\text{where } N_{LL\_FEC\_MAX} = \left\lfloor \frac{2M}{6480(2+1)} \right\rfloor$$

Accordingly, a maximum number of FEC blocks inputted to a TI block of the upper layer is 40 (N_(UL, FEC_TI_MAX)=40), and a maximum number of FEC blocks inputted to a TI block of the lower layer is 50 (N_(LL,FEC_TI_MAX)=50). As a result, the broadcast signal transmitter may perform time interleaving in the cell unit of 324000 (=40*8100=50*6480). In this case, both the upper layer and the lower layer are interleaved in an FEC block unit that is a positive number times.

FIG. 35 illustrates the relationship between an FEC block and a time interleaving block according to LDM processing in accordance with an embodiment of the present invention.

FIG. 35 is a diagram separately showing data streams inputted to the time interleaver in an upper layer and a lower layer, according to the aforementioned first option. In particular, FIG. 35 shows LDM-processed data streams according to a result of the test case.

In the test case, in the case of the upper layer, a minimum number of FEC blocks for the time interleaving block are 4, and a maximum number of FEC blocks for the time interleaving block are 40. In the case of the lower layer, a maximum number of FEC blocks for the time interleaving block are 5, and a minimum number of FEC blocks for the time interleaving block are 50.

As in FIG. 35, in the case of the FEC block size and modulation method of the test case, an LDM combiner may perform LDM processing in a sub-TI block unit including 4 FEC blocks in the case of the upper layer or in a sub-TI block unit including 5 FEC blocks in the case of the lower layer and may output a data stream. The sub-TI block may include a minimum number of FEC blocks. Since the time interleaver may include 10 sub-TI blocks, the LDM combiner may perform LDM processing so that a total number of 40 FEC block are included in a single time interleaving block in the case of the upper layer and a total number of FEC blocks are included in a single time interleaving block in the case of the lower layer. If LDM processing is performed using such a method, the time interleaver may perform time interleaving on an output data stream in an FEC block unit.

A group of FEC blocks may be arranged in the form of TI blocks. A TI block may correspond to a single self-contained time interleaver operation and may be the basis of the operation of a cell interleaver, TBI, or CI. A single TI block may correspond to a single interleaving frame or a plurality of TI blocks may be mapped to a single interleaving frame.

As described with reference to FIGS. 34 and 35, the first option which makes TI blocks a positive number times the FEC blocks in both the upper layer and the lower layer may support both a constant bit rate (CBR) and a variable bit rate (VBR). In this case, a sub-TI block needs to be able to be configured, and the VBR may be supported by changing the number of TI sub-blocks. The operation of an LDM transmitter/receiver may be implemented relatively simply, but there is a constraint to the configuration of the TI block and the support of a VBR.

A second option which makes the number of FEC blocks of one of the two layers a positive number times the FEC blocks and in which the other of the two layers complies with the size of a predetermined TI block is described below.

In the case of the second option, a total number of cells included in the TI block of the lower layer are calculated and set so that it become a positive number times the size of an FEC block. In the case of the upper layer, a total number of cells included in the TI block are set to be identical with a total number of cells of the lower layer which is first determined. That is, a total number of cells of the upper layer per TI block is determined based on information, such as a total number of cells of the lower layer per TI block, and a total number of cells within the TI block are identically set. In the case of such a method, unlike in the first option, a total number of cells of the upper layer may not satisfy a condition satisfying a positive number times the size of an FEC block.

FIG. 36 illustrates the relationship between an FEC block and a time interleaving block according to LDM processing in accordance with an embodiment of the present invention.

FIG. 36 is a diagram separately showing data streams inputted to the time interleaver in an upper layer and a lower layer, according to the second option. As shown in FIG. 36, in the lower layer, a TI block is configured to include an integer number of FEC blocks. Furthermore, in the upper layer, the last of FEC blocks may not be identical with the last of the TI block because the size of the TI block is configured to be the same as that configured in the lower layer.

An FEC block placed at the start and last of the TI block of the upper layer may not be one complete FEC block. Accordingly, the cells at the start and last of the TI block may not be the start or last of one complete FEC block. Accordingly, if specific TI block synchronization is assumed in a reception unit, signaling indicative of such a situation may be necessary for the FEC block synchronization of the upper layer. In an embodiment, signaling information may be defined as follows.

PLP_UL_FECBLOCK_START information: it is indicative of the start point of a first complete FEC block in the TI block of the upper layer.

A dedicated bit value in a PLP_UL_FECFBLOCK_START field may be indicative of the availability of PLP_UL_FECFBLOCK_START. For example, if a dedicated bit value is "1111111111111111", it may indicate that the start point of a first complete FEC block is now present in a TI-block. If another value is used, it may indicate that the start point of a first complete FEC block is present in a subsequent incoming TI-block. In this case, the dedicated bit value may be set as a specific value. Furthermore, a reception unit may be notified of valid information about the start point of a first complete FEC block in another form.

In FIG. 36, the field value of PLP_UL_FECFBLOCK_START information is 200. In this case, the start point of a first complete FEC block is present in a subsequent incoming TI block, and the location of the start point may be indicated by the distance from the start point of a next TI block.

As described with reference to FIG. 36, the second option may support both a constant bit rate (CBR) and a variable bit rate (VBR). In this case, related information needs to be signaled, and such signaling information may be included in a dynamic field. The dynamic field is indicative of a PLS2 dynamic part.

The second option enables a very flexible signal configuration and operation. In this case, after system information is obtained, the second option may affect the initial FEC decoding of the lower layer. First, several FEC blocks may be used in specific in-band signaling. In this case, system complexity may be relatively increased.

A third option which makes the number of FEC blocks of one of the two layers a positive number times and in which the other of the two layers complies with the size of a predetermined TI block is described below.

In the case of the third option, a total number of cells included in the TI block of one of the two layers are calculated and set so that it becomes a positive number times the size of an FEC block. Furthermore, in the case of the other layer of the two layers, a total number of cells included in the TI block are set to be the same as that of a first determined layer. In such a method, as in the case of the second option, the condition in which a total number of cells of the upper layer become a positive number times the size of an FEC block may not be satisfied. In the case of the third option, if a positive number times the size of an FEC block is not satisfied, there is proposed a method of excluding the last FEC block and padding the remaining part of the TI block with zero/dummy cells.

FIG. 37 illustrates the relationship between an FEC block and a time interleaving block according to LDM processing in accordance with an embodiment of the present invention.

FIG. 37 is a diagram separately showing data streams inputted to the time interleaver according to the third option in an upper layer and a lower layer. As shown in FIG. 37, in the upper layer, a TI block is configured to include an integer number of FEC blocks. Furthermore, in the lower layer, the last of the FEC blocks may not be identical with the last of the TI block because the size of the TI block is configured to be the same as that configured in the upper layer.

In the embodiment of FIG. 37, the TI block of the upper layer may include 9 FEC block. The number of FEC blocks which may be transmitted in the lower layer through the size of the TI block of the upper layer determined as described above is 11, and the twelfth FEC block exceeds the size of the TI block by excess cells. Accordingly, the broadcast signal transmitter may insert the 11 FEC blocks into the TI block of the lower layer and insert zero cells or dummy cells into the remaining last part. The length of the zero/dummy cells may be calculated as in Equation 15.

$$N_{zero/dummy\_padding} = (N_{UL\_FEC\_NUM} N_{UL,cells}) - (N_{LL\_FEC\_NUM} N_{LL,cells})$$ [Equation 15]

Equation 15 is equal to the length of zero/dummy cells=the number of FEC blocks of the upper layer*the cell length of an FEC block of the upper layer−the number of FEC blocks of the lower layer*the cell length of an FEC block of the lower layer. Dummy cells may be previously defined in transmission/reception units or may be generated using a predetermined generator. A method of inserting such zero/dummy cells may be generally applied to a specific LDM combination.

FIG. 38 illustrates the relationship between an FEC block and a time interleaving block according to LDM processing in accordance with an embodiment of the present invention.

FIG. 38 is a diagram separately showing data streams inputted to the time interleaver according to the third option in an upper layer and a lower layer. In FIG. 38, a signal frame includes 5 PLP: S-PLP, UPLP0, UPLP1, LPLP0, and LPLP1. The UPLP0 and UPLP1 of the 5 PLPs are the PLPs of a core layer, and the LPLP0 and LPLP1 thereof are the PLPs of an enhanced layer. In the embodiment of FIG. 38, the broadcast signal transmitter may define a TI group for each of the three PLPs of the core layer and perform time interleaving in a defined TI group unit.

As shown in FIG. 38, in the upper layer, a TI block is configured to include an integer number of FEC blocks. Furthermore, in the lower layer, the last of FEC blocks may not be identical with the last of a TI block because the size of the TI block is set to be the same as that of a TI block set in the upper layer. In the embodiment of FIG. 38, zero/dummy cells are inserted only at a point at which the PLP of the lower layer is ended instead of inserting padding into each TI block as in the embodiment of FIG. 37.

In FIG. 38, a TI group is matched with a PLP unit. Furthermore, in an embodiment of the present invention, TI blocks are set to be a positive number times the FEC blocks of the upper layer, and such TI blocks form a TI group in a PLP unit. In the embodiment of FIG. 38, the padding of zero/dummy cells in the lower layer is not performed on each TI block, but is performed based on a point at which a matched FEC block of the upper layer is ended only at a point at which the PLP of the lower layer is ended. In such a method, an FEC block that is complete in a signal frame (ATSC 3.0 frame) level, but is incomplete in a TI block level may occur.

FIG. 39 illustrates the relationship between an FEC block and a time interleaving block according to LDM processing in accordance with an embodiment of the present invention.

FIG. 39 is a diagram separately showing data streams inputted to the time interleaver according to the third option in an upper layer and a lower layer. As shown in FIG. 39, in the lower layer, a TI block is configured to include an integer number of FEC blocks. Furthermore, in the upper layer, the last of FEC blocks may not be identical with the last of a TI block because the size of the TI block is configured to the same as that set in the lower layer.

In the embodiment of FIG. 39, the TI block of the lower layer may include 11 FEC blocks. The number of FEC blocks which may be transmitted in the upper layer through the size of the TI block of the upper layer which has been determined as described above is 8, and the ninth FEC block exceeds the size of the TI block by excess cells. Accordingly, the broadcast signal transmitter may insert 8 FEC blocks into the TI block of the upper layer and insert zero cells or dummy cells into the remaining last part. The length of the zero/dummy cells may be calculated as in Equation 16.

$$N_{zero/dummy\_padding} = (N_{LL\_FEC\_NUM} N_{LL,cells}) - (N_{UL\_FEC\_NUM} N_{UL,cells})$$ [Equation 16]

Equation 16 is equal to the length of zero/dummy cells=the number of FEC blocks of the lower layer*the cell length of an FEC block of the lower layer−the number of FEC blocks of the upper layer*the cell length of an FEC block of the upper layer. Dummy cells may have been previously defined in transmission/reception units or may be generated using a specific generator. A method of inserting such zero/dummy cells may be commonly applied to a specific LDM combination.

FIG. 40 illustrates the relationship between an FEC block and a time interleaving block according to LDM processing in accordance with another embodiment of the present invention.

FIG. 40 is a diagram additionally describing the embodiment of FIG. 39 in which the FEC blocks of the upper layer are disposed based on the size of a TI block of the lower layer. As shown in FIG. 40, the size of a TI block of a lower layer may be configured to be smaller than the size of FEC blocks of an upper layer. In this case, the TI block part of the upper layer may be fully padded with zero/dummy cells.

As described with reference to FIGS. 37 to 40, the third option may support both a constant bit rate (CBR) and a variable bit rate (VBR). Furthermore, the operation of the time interleaver of the lower layer may also be preserved. However, a cell rate within a frame may be reduced because zero/dummy cells are inserted. Furthermore, in the case of another layer, there is a constraint to the building of a TI block because the size of a TI block of a first set layer is kept. Furthermore, as shown in FIG. 40, an FEC block may not be present in a TI block. In this case, the cell rate of a frame may be severely deteriorated.

FIG. 41 is a detailed block diagram of a demapping/decoding block in accordance with an embodiment of the present invention.

The demapping/decoding module of FIG. 41 corresponds to an embodiment of the demapping and decoding module 9020 described with reference to FIG. 9.

As described above, the coding & modulation module of the transmission apparatus in accordance with an embodiment of the present invention may independently process received PLPs by applying SISO, MISO, and MIMO methods to the received PLPs for each path. Accordingly, the demapping/decoding module of FIG. 41 may include blocks for processing data output by a frame parser according to the SISO, MISO, and MIMO methods in accordance with the transmission apparatus.

As shown in FIG. 41, the demapping and decoding module in accordance with an embodiment of the present invention may include a first block for the SISO method, a second block for the MISO method, a third block for the MIMO method, and a fourth block for processing PLS pre/post information.

The first block for processing a received PLP according to the SISO method may include a time deinterleaver block 41010, a cell deinterleaver block 41020, a constellation demapper block 41030, a cell-bit demultiplexer block 41040, a bit deinterleaver block 41050, and an FEC decoder block 41060.

The time deinterleaver block 41010 may perform a process inverse to the process of a time interleaver block. That is, the time deinterleaver block 41010 may deinterleave the location of an input symbol, interleaved in a time domain, into the original location.

The cell deinterleaver block 41020 may perform a process inverse to the process of a cell interleaver block. That is, the cell deinterleaver block 41020 may deinterleave the locations of cells, spread in a single FEC block, into the original locations.

The constellation demapper block 41030 may perform a process inverse to the process of a constellation mapper block. That is, the constellation demapper block 41030 may demap an input signal of a symbol domain to data of a bit domain. Furthermore, the constellation demapper block 41030 may output bit data determined by performing a hard decision and may output the log-likelihood ratio (LLR) of each bit corresponding to a support decision value or a probability value. If a rotated constellation is used in a transmission stage in order to obtain an additional diversity gain, the constellation demapping block 32030 may perform corresponding 2-dimensional LLR demapping. When calculating an LLR, the constellation demapper block 41030 may calculate the LLR so that the transmission apparatus may compensate for the delay value of an I or Q component.

The cell-bit multiplexer block 41040 may perform a process inverse to the process of a bit-cell demultiplexer block. That is, the cell-bit multiplexer block 41040 may restore bit data, mapped in the bit-cell demultiplexer block, into the original bit stream form.

The bit deinterleaver block 41050 may perform a process inverse to the process of a bit interleaver block. That is, the bit deinterleaver block 41050 may deinterleave bit streams, output by the cell-bit multiplexer block 41040, into original sequence.

The FEC decoder block 41060 may perform a process inverse to the process of an FEC encoder block. That is, the FEC decoder block 41060 may correct an error, occurred in a signal received through a transport channel, by performing LDPC decoding and BCH decoding.

Additional blocks not described in signal processing of SISO mode are described below.

An MISO decoder block 41070 may perform a process inverse to the process of an MISO processing block. If a broadcast transmission and reception system in accordance with an embodiment of the present invention is a system using STBC, the MISO decoder block 41070 may perform Alamouti decoding.

An MIMO decoding block 41080 may receive data, output by a cell deinterleaver, with respect to m reception antenna input signals and may perform MIMO decoding, that is, a process inverse to the process of an MIMO processing block. The MIMO decoding block 41080 may perform maximum likelihood decoding or sphere decoding having reduced complexity in order to obtain the highest decoding performance. In some embodiments, the MIMO decoding block 41080 may secure improved decoding performance by performing MMSE detection or combining and performing iterative decoding.

FEC decoder blocks 41090-1 and 41090-2 (a shortened/punctured FEC decoder) configured to process signaling information may perform a process inverse to the process of a shortened/punctured FEC encoder block. That is, the shortened/punctured FEC decoder 41090 may additionally perform de-shortening and de-puncturing on data which has been shortened/punctured based on the length of PLS data and received and then may perform FEC decoding. In this case, the FEC decoder used in a data pipe may be identically used in a PLS. Accordingly, there is an advantage in that a system design is easy and efficient coding is possible because separate FEC decoder hardware for only a PLS is not required.

The aforementioned blocks may be omitted depending on a designer's intention or may be replaced with other blocks having the same or similar functions.

In this case, the location of the time deinterleaver block may be changed from the location of the demapping/decoding block to the location of the frame parsing block as in FIG. 41 as in the case where the location of the time interleaver block is changed from the location of the BICM block to the location of the frame building block or interleaving/the framing block in the broadcast signal transmitter as described above. In this case, in FIG. 9, the frame parser may denote a frame parser/the deinterleaver.

The time deinterleaver of the reception unit includes a convolutional deinterleaver (performing a process inverse to the process of a convolutional delay line), a twisted deinterleaver, and a cell deinterleaver and may perform a process inverse to the process of the time deinterleaver of the transmission unit.

FIG. 42 illustrates the configuration of part of a broadcast signal receiver in accordance with an embodiment of the present invention.

FIG. 42 shows the configuration of the broadcast signal receiver configured to perform layered division demultiplixing (LDD) on an LDM signal. The broadcast signal receiver may restore the signal of a core layer and restore an enhanced layer signal by subtracting the restored core layer signal from an LDM signal. First, when a broadcast signal is received, the broadcast signal receiver may be aware whether the broadcast signal is an LDM signal based on signaling information. FIG. 42 shows the configuration of the broadcast signal receiver configured to process a reception signal if the receptions signal is an LDM signal.

In FIG. 42, a received LDM signal is processed by an MISO decoder 42010, a time deinterleaver 42020, and a cell deinterleaver 42030. The MISO decoder 42010, time deinterleaver 42020, and the cell deinterleaver 42030 are illustrative. The received LDM signal is processed by the synchronization/demodulation unit 9000 and the frame parsing/deinterleaving unit 9010 as in FIG. 9 and is LDD-processed. LDD is described below.

First, a core layer signal is decoded/restored through a first demapping/decoding unit 42040-1. The first demapping/decoding unit 42040-1 may also be denoted as a core layer demapping/decoding unit 42040-1. From a viewpoint of the first demapping decoding unit 42040-1, the signal of an enhanced layer is similar to a noise. The first demapping decoding unit 42040-1 may restore a robustly encoded/modulation core layer signal from an LDM signal. Furthermore, the receiver may restore an enhanced layer signal through interference removal processing and restoration processing.

In FIG. 42, a buffer 42060, a signal divider 42070, and an LDD modulation unit 42050 may be collectively called an interference removal unit. First, the interference removal unit may modulate the restored core layer signal, using the LDD modulation unit 42050, as in a transmission unit. The LDD modulation unit 42050 includes a bit interleaver 42080, a bit-cell demultiplexer 42090, a constellation mapper 42100, and an injection level controller 42110. The operations of the bit interleaver 42080, the bit-cell demultiplexer 42090, the constellation mapper 42010, and the injection level controller 42110 are the same as those described with reference to FIGS. 30 to 33. The broadcast signal receiver may obtain injection level information from signaling information and drive the injection level controller 42110 based on the injection level information.

The interference removal unit may buffer an LDM signal in the buffer 42060 and separate an enhanced layer signal from the LDM signal using the signal divider 42070. The signal divider 42070 may separate the enhanced layer signal from the LDM signal using a method of subtracting a modulated upper layer signal from the buffered LDM signal. In other words, the signal divider 42070 performs a process inverse to the process of a transmission-side layer combiner.

The broadcast signal receiver may decode/restore the separated enhanced layer signal using a second demapping/decoding unit 42040-2. The second demapping/decoding unit 42040-2 may also be called an enhanced layer demapping/decoding unit 42040-1.

FIG. 43 illustrates a method of receiving a broadcast signal in accordance with an embodiment of the present invention.

The broadcast signal transmitter may FEC-encode the data of a first layer using a first BICM unit at step S43010. Furthermore, the broadcast signal transmitter may FEC-encode the data of a second layer using a second BICM unit at step S43020. The data of the first layer and the data of the second layer may respectively correspond to the data of the core layer and the data of the enhanced layer.

The broadcast signal transmitter may combine the data of the first layer and the data of the second layer using the LDM injection unit and output LDM data at step S43030. The broadcast signal transmitter may interleave the LDM data using the framing/interleaving unit and generate a signal frame at step S43040. Furthermore, the broadcast signal transmitter may perform OFDM modulation on the LDM data and generate a broadcast signal at step S43050.

As described above, the broadcast signal transmitter may control a power ratio of the data of the first layer and the data of the second layer using the injection level controller, may add the data of the first layer and the data of the second layer using the layer combiner, and may normalize power of the LDM data using the power normalizer. The LDM processing of the broadcast signal transmitter has been described above with reference to FIGS. 32 and 33.

As described above, the broadcast signal transmitter may interleave the LDM data in a TI block unit. The TI block includes FEC blocks. The TI block may be configured using the methods described in the first option to third option or a combination of the methods. In other words, the methods described with reference to FIGS. 34 to 40 may be used as a method of configuring a TI block.

The time interleaver may perform interleaving in a TI block unit. The size of a TI block may be configured to correspond to the size of FEC blocks of an integer number with respect to the first layer and to correspond to the size of FEC blocks of an integer number with respect to the second layer as in the first option. Furthermore, the size of a TI block may be configured to correspond to the size of FEC blocks of an integer number with respect to the first layer and to not correspond to the size of FEC blocks of an integer number with respect to the second layer as in the second option and third option. In this case, the start point of the first FEC block of the TI block may be transmitted as signaling information. Furthermore, a TI block may be configured in such a manner that the last FEC block exceeding the size of the TI block is deleted and the TI block is filled by inserting dummy cells.

As in FIG. 38, at least one TI block may be included in a single TI group. In this case, the single TI group may correspond to one PLP of the first layer.

FIG. 44 illustrates a method of receiving a broadcast signal in accordance with an embodiment of the present invention.

The broadcast signal receiver may perform signal detection and OFDM demodulation on a reception signal using the synchronization and demodulation unit at step S44010. The reception signal may include an LDM signal. The presence and location of the LDM signal included in the reception signal may be obtained as signaling information. The broadcast signal receiver may parse the signal frame of the reception signal and deinterleave the LDM signal using the frame parsing/deinterleaving unit at step S44020.

The broadcast signal receiver may obtain the data of a first layer by demapping and FEC-decoding the LDM data using the first demapping/decoding unit at step S44030. Furthermore, the broadcast signal receiver may remove the data of the first layer from the LDM data and output the data of a second layer by using the interference removal unit at step S44040. The broadcast signal receiver may demap and FEC-decode the data of the second layer using the second demapping/decoding unit at step S44050.

As described above, the broadcast signal receiver may buffer the LDM data using the buffer, may control a power ratio of the data of the first layer and the data of the second layer using the injection level controller, and may separate the data of the second layer from the buffered LDM data using the signal divider. The processing of the LDM signal of the broadcast signal receiver has been described above with reference to FIGS. 41 and 42.

As described above, the broadcast signal receiver may deinterleave the LDM data in a TI block unit. A TI block includes FEC blocks. The TI block may be configured using the methods described in the first option to third option or a combination of the methods. In other words, the methods described with reference to FIGS. 34 to 40 may be used as a method of configuring a TI block.

The time deinterleaver may deinterleave the LDM data in a TI block unit. The size of the TI block may be configured to correspond to the size of FEC blocks of an integer number with respect to the first layer and to correspond to the size of FEC blocks of an integer number with respect to the second layer as in the first option. Furthermore, the size of a TI block may be configured to correspond to the size of FEC blocks of an integer number with respect to the first layer and to not correspond to the size of FEC blocks of an integer number with respect to the second layer as in the second option and third option. In this case, the start point of the first FEC block of the TI block may be transmitted as signaling information. Furthermore, a TI block may be configured in such a manner that the last FEC block exceeding the size of the TI block is deleted and the TI block is filled by inserting dummy cells.

As in FIG. 38, at least one TI block may be included in a single TI group. In this case, the single TI group may correspond to one PLP of the first layer.

In accordance with an embodiment of the present invention, although the LDM method is used, a TI block includes an integer number of FEC blocks. Accordingly, signal restoration performance of the broadcast signal receiver can be improved without deteriorating interleaving performance. Furthermore, the broadcast signal receiver can rapidly restore the data of a core layer because the size of a TI block of the core layer corresponds to a positive number times the FEC blocks. Accordingly, the data of an enhanced layer can also be rapidly restored. In particular, interleaving performance of the core layer can be optimized in view of a characteristic of the LDM method capable of restoring the data of the enhanced layer only when the data of the core layer is first restored.

In the case of the enhanced layer, in accordance with the first option, the broadcast signal receiver may also FEC-decode the data of, the enhanced layer in an FEC block unit through the deinterleaving of the data of the core layer. In the case of the second option, the broadcast signal receiver may FEC decode the data of the enhanced layer in an FEC block unit based on signaling information. In the case of the third option, the data of the enhanced layer can be FEC-decoded in an FEC block unit because the start point of the data of the enhanced layer is identical with the start point of the data of the core layer. Accordingly, in accordance with an embodiment of the present invention, the data of the core layer can be rapidly obtained, and the data of the enhanced layer can be FEC-decoded in an FEC block unit.

In this specification, both the apparatus and method inventions have been described, and descriptions of both the apparatus and method inventions may be mutually supplemented and applied.

What is claimed is:

1. A broadcast signal receiver, comprising:
   a demodulator configured to perform orthogonal frequency division multiplexing (OFDM) demodulation on a reception signal comprising a signal frame;
   a frame parser configured to parse the signal frame comprising layer division multiplexing (LDM) data;
   a time deinterleaver configured to time-deinterleave the LDM data;
   a first demapper/decoder configured to obtain data of a first layer by demapping and forward error correction (FEC)-decoding the LDM data;
   an interference remover configured to remove the data of the first layer from the LDM data and to output data of a second layer; and
   a second demapper/decoder configured to demap and FEC-decode the data of the second layer,
   wherein each physical layer pipe (PLP) of the first layer corresponds to a time interleaver (TI) group respectively, the TI group being a unit for the time-deinterleaving,
   wherein the time-deinterleaving of the LDM data is performed based on the PLP of the first layer, and
   wherein, when a number of data cells of the second layer is less than a number of data cells of the first layer for the LDM data, the LDM data comprises dummy cells after the data cells of a PLP of the second layer.

2. The broadcast signal receiver of claim 1, wherein the interference remover comprises:
   a buffer configured to buffer the LDM data;
   an injection level controller configured to control a power ratio of the data of the first layer and the data of the second layer; and
   a signal divider configured to separate the data of the second layer from the buffered LDM data.

3. The broadcast signal receiver of claim 1, wherein the time deinterleaver time-deinterleaves the LDM data by a unit of a TI block.

4. The broadcast signal receiver of claim 3, wherein a size of the TI block corresponds to a size of an integer number of FEC blocks in the first layer.

5. The broadcast signal receiver of claim 3, wherein: the at least one TI block is included in the TI group.

6. A method of receiving a broadcast signal, the method comprising:
   performing signal detection and orthogonal frequency division multiplexing (OFDM) demodulation on a reception signal comprising a signal frame;
   parsing the signal frame comprising layer division multiplexing (LDM) data;
   time-deinterleaving the LDM data;
   obtaining data of a first layer by demapping and forward error correction (FEC)-decoding the LDM data;
   removing the data of the first layer from the LDM data and outputting data of a second layer; and
   demapping and FEC-decoding the data of the second layer,
   wherein each physical layer pipe (PLP) of the first layer corresponds to a time interleaver (TI) group respectively, the TI group being a unit for the time-deinterleaving,
   wherein the time-deinterleaving of the LDM data is performed based on the PLP of the first layer, and
   wherein, when a number of data cells of the second layer is less than a number of data cells of the first layer for the LDM data, the LDM data comprises dummy cells after the data cells of a PLP of the second layer.

7. The method of claim 6, wherein the removing the data of the first layer from the LDM data and the outputting the data of the second layer comprises:
   buffering the LDM data;
   controlling a power ratio of the data of the first layer and the data of the second layer; and
   separating the data of the second layer from the buffered LDM data.

8. The method of claim 6, wherein the LDM data are time-deinterleaved by a unit of a TI group.

9. The method of claim 8, wherein a size of the TI block corresponds to a size of an integer number of FEC blocks in the first layer.

10. The method of claim 8, wherein the at least one TI block is included in the TI group.

* * * * *